United States Patent
Liu et al.

(10) Patent No.: US 6,800,169 B2
(45) Date of Patent: Oct. 5, 2004

(54) METHOD FOR JOINING CONDUCTIVE STRUCTURES AND AN ELECTRICAL CONDUCTIVE ARTICLE

(75) Inventors: Kuo-Chuan Liu, Fremont, CA (US); Michael G. Lee, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 156 days.

(21) Appl. No.: 10/066,485

(22) Filed: Feb. 1, 2002

(65) Prior Publication Data

US 2003/0019568 A1 Jan. 30, 2003

Related U.S. Application Data

(63) Continuation-in-part of application No. 09/757,364, filed on Jan. 8, 2001, and a continuation-in-part of application No. 09/962,783, filed on Sep. 24, 2001.

(51) Int. Cl.[7] .............................................. B23K 31/00
(52) U.S. Cl. ................... 156/292; 156/295; 156/309.6; 29/830; 438/618; 228/180.22; 228/193; 228/195
(58) Field of Search ................................ 156/292, 295, 156/309.6; 29/830; 228/135, 175, 180.22, 193, 195; 438/618

(56) References Cited

U.S. PATENT DOCUMENTS

| | | | |
|---|---|---|---|
| 5,128,746 A | 7/1992 | Pennisi et al. | |
| 5,157,828 A | 10/1992 | Coques et al. | |
| 5,187,123 A | 2/1993 | Yoshida et al. | |
| 5,232,532 A | 8/1993 | Hori | |
| 5,334,260 A | * 8/1994 | Stefanowski | 228/223 |
| 5,334,804 A | 8/1994 | Love et al. | |
| 5,374,344 A | 12/1994 | Gall et al. | |
| 5,374,469 A | 12/1994 | Hino et al. | |
| 5,376,403 A | 12/1994 | Capote et al. | |
| 5,384,690 A | 1/1995 | Davis et al. | |
| 5,421,507 A | 6/1995 | Davis et al. | |
| 5,432,998 A | 7/1995 | Galasco et al. | |
| 5,509,196 A | 4/1996 | Davis et al. | |
| 5,620,782 A | 4/1997 | Davis et al. | |
| 5,736,679 A | 4/1998 | Kresge et al. | |
| 5,839,188 A | 11/1998 | Pommer | |
| 5,842,273 A | 12/1998 | Schar | |
| 5,948,533 A | * 9/1999 | Gallagher et al. | 428/418 |
| 6,133,066 A | * 10/2000 | Murakami | 438/108 |
| 6,207,259 B1 | * 3/2001 | Iino et al. | 428/209 |
| 6,467,676 B1 | * 10/2002 | Wang | 228/180.22 |
| 6,578,754 B1 | * 6/2003 | Tung | 228/180.22 |

* cited by examiner

*Primary Examiner*—Jeff H. Aftergut
*Assistant Examiner*—John T. Haran
(74) *Attorney, Agent, or Firm*—Sheppard Mullin Richter & Hampton LLP

(57) ABSTRACT

Embodiments of the invention include a method comprising disposing a thin metallic layer having a low melting temperature between one end of a conductive post on a substrate and a conducting structure on an opposing substrate. Heated platens in contact with the substrates can apply pressure and heat to the thin metallic layer and cause it to be entirely consumed and subsequently transformed into a bonding layer having a melting temperature higher than the melting temperature of the original thin metallic layer. Prior to, during, or after the conductive post is bonded to the conducting structure, the region around the conductive post and between the substrates may be filled with a dielectric material, such as polyimide.

18 Claims, 48 Drawing Sheets

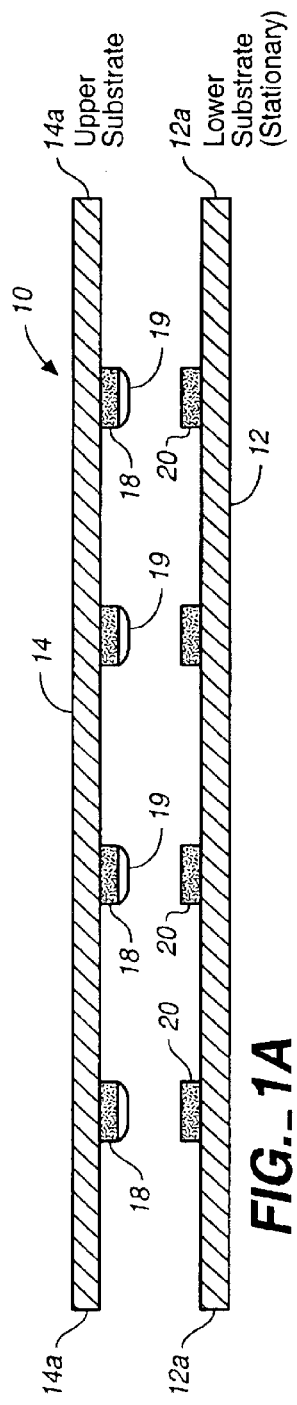
FIG._1A
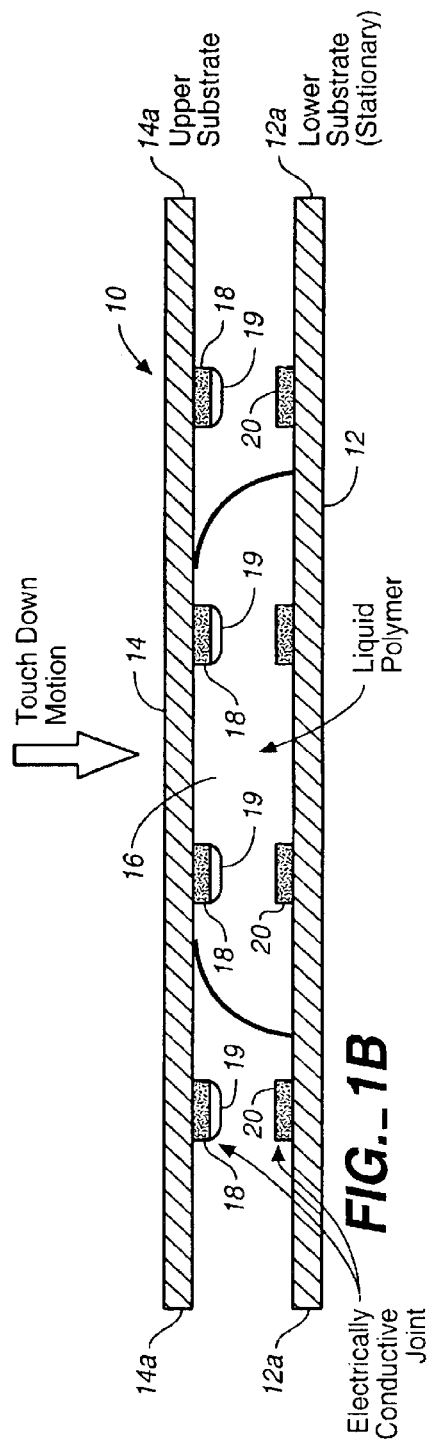
FIG._1B
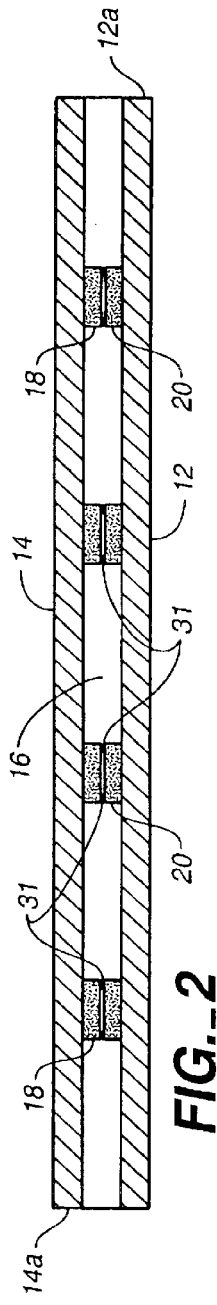
FIG._2

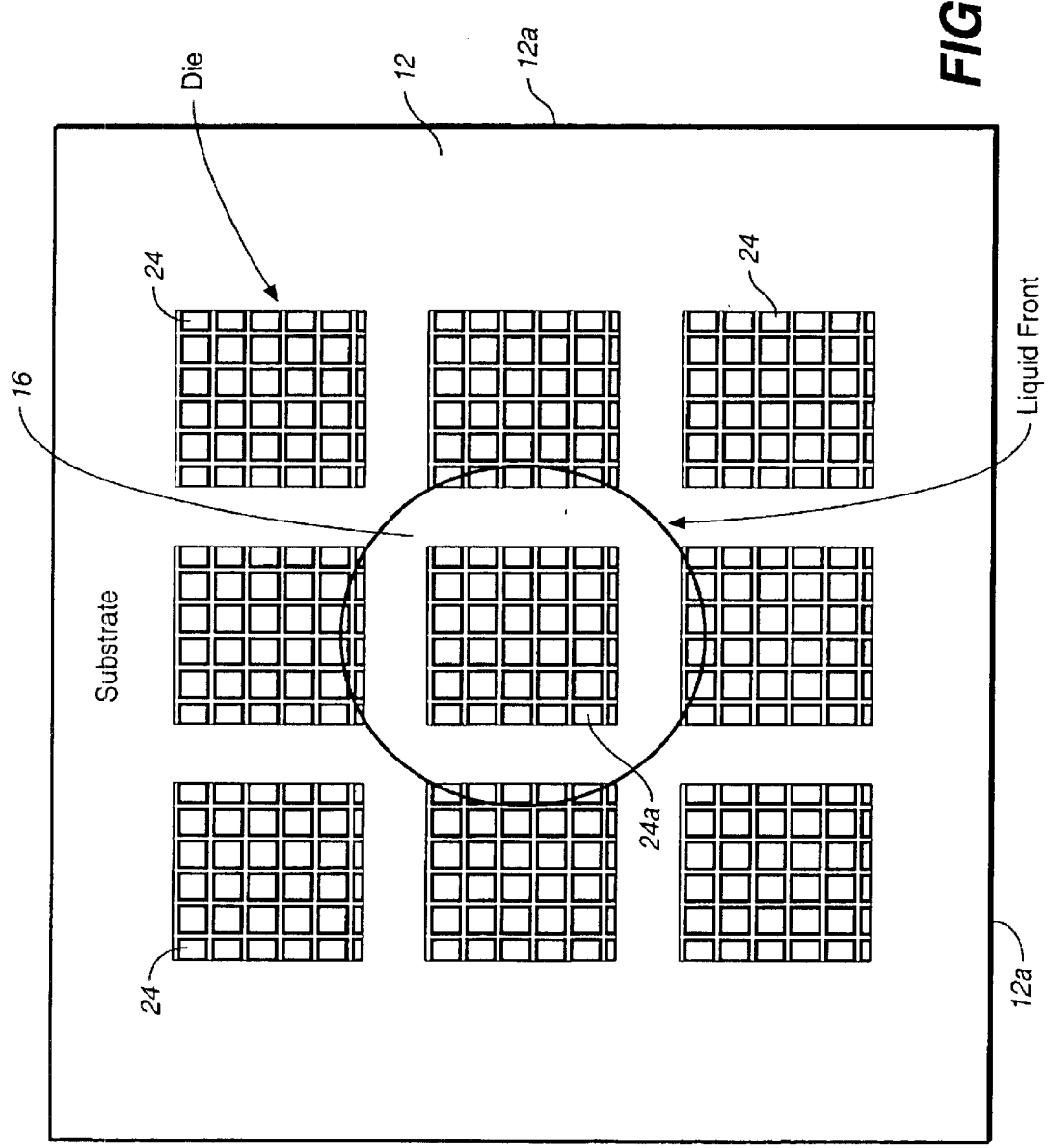
FIG._3

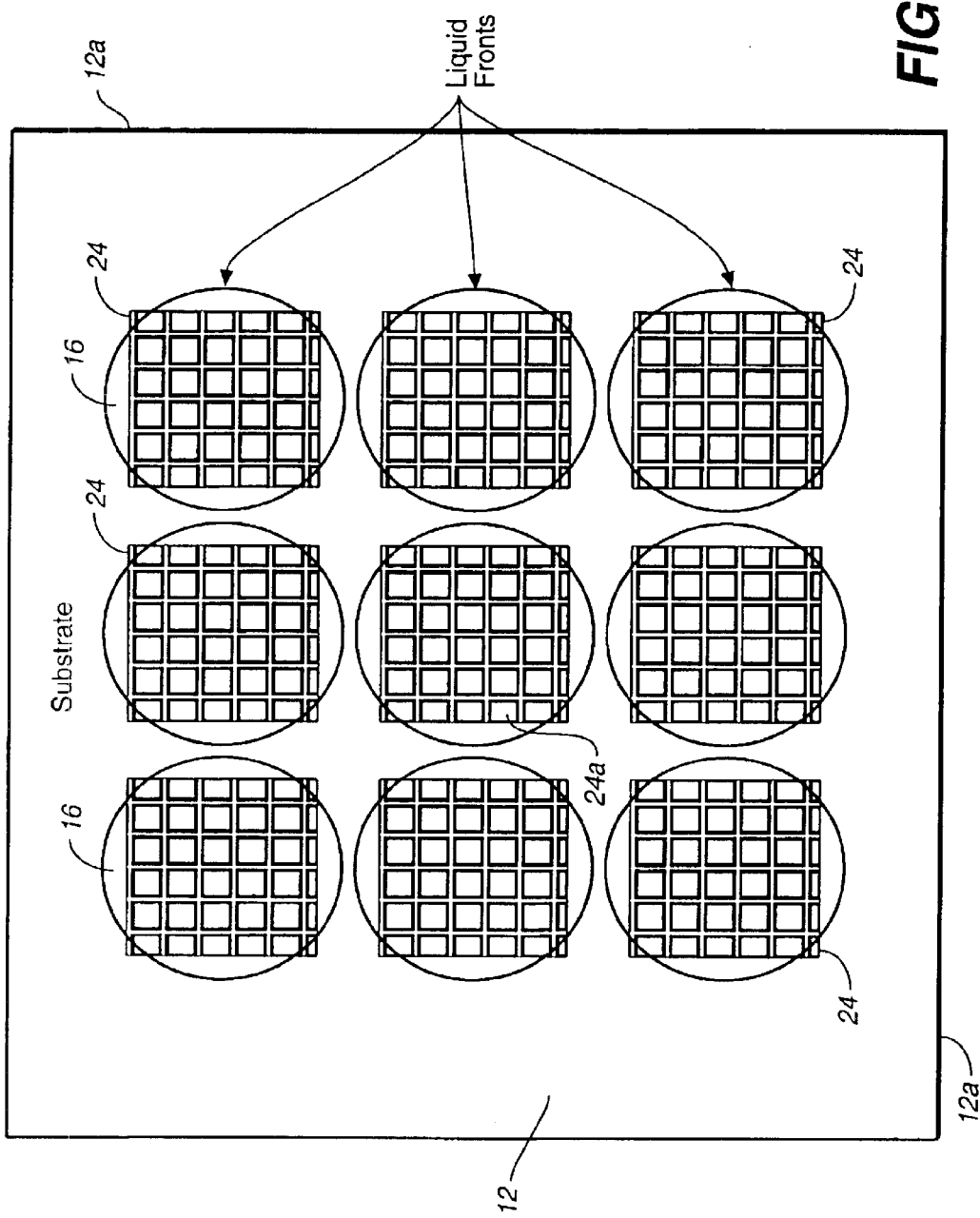
FIG._4

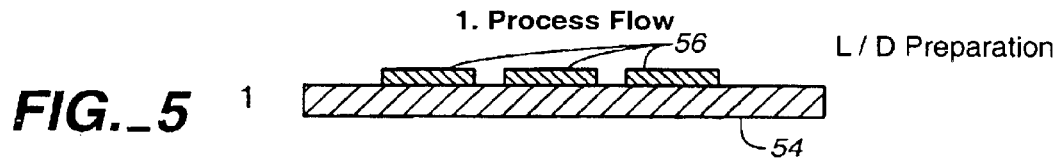
FIG._5
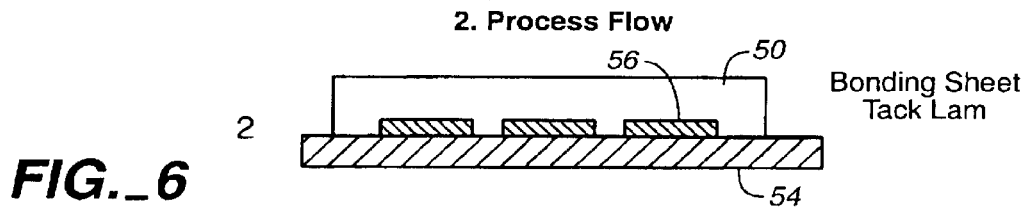
FIG._6
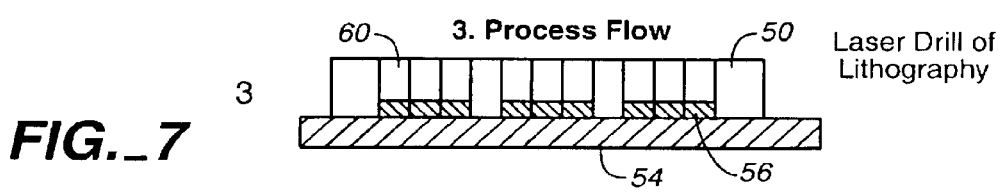
FIG._7
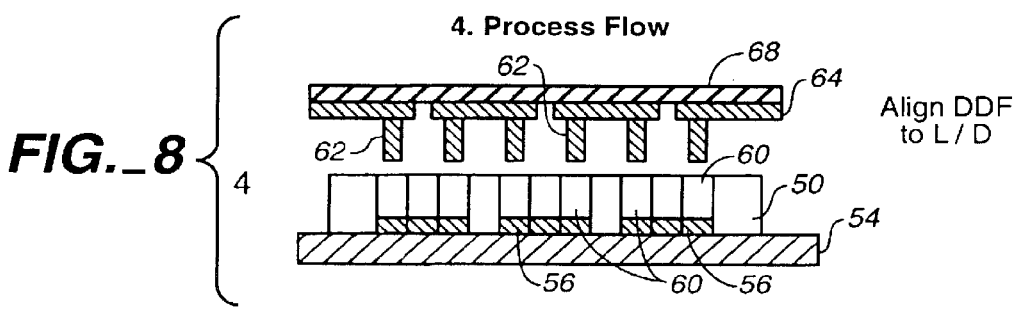
FIG._8
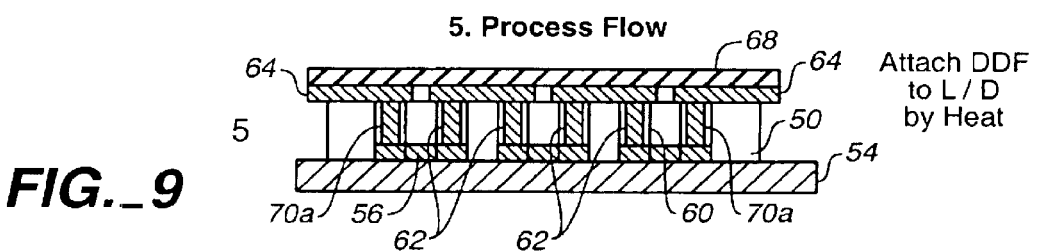
FIG._9
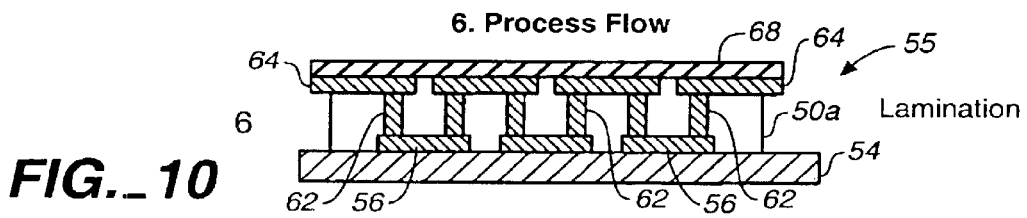
FIG._10

The Concept
A. Before Lamination
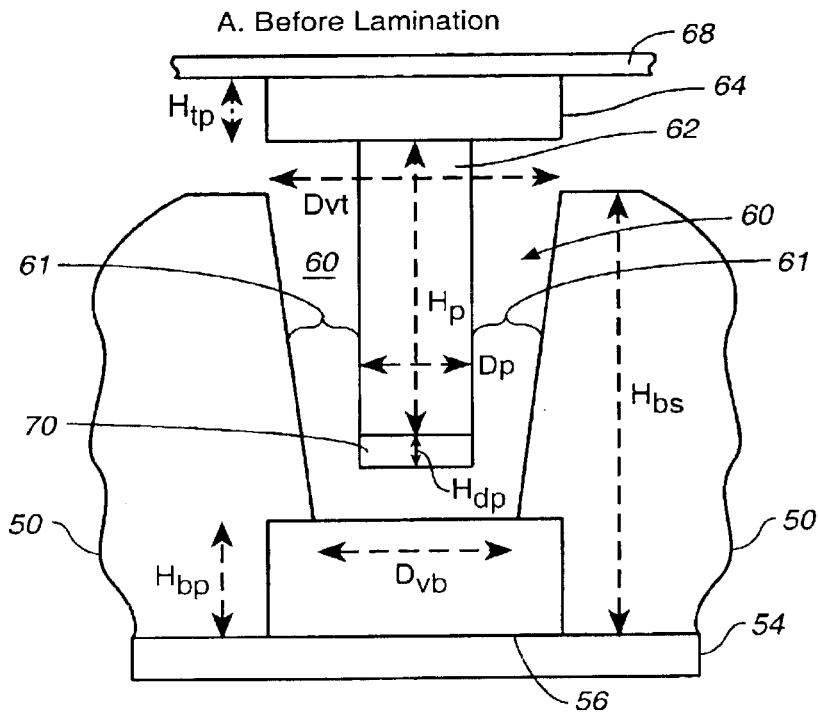
FIG._11
B. After Lamination
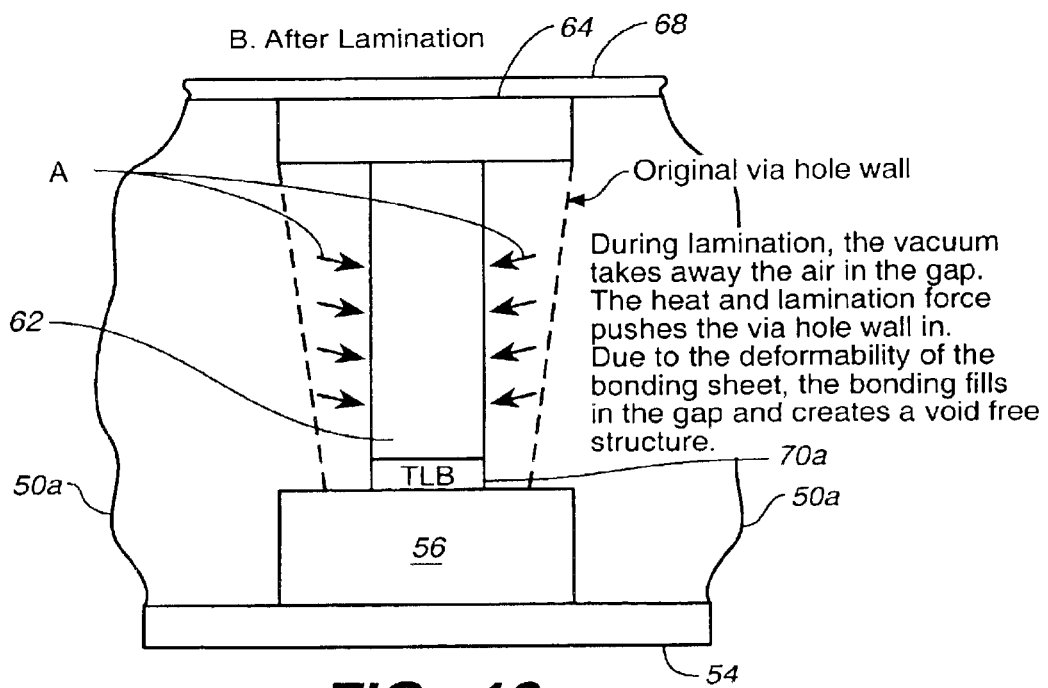
Original via hole wall
During lamination, the vacuum takes away the air in the gap. The heat and lamination force pushes the via hole wall in. Due to the deformability of the bonding sheet, the bonding fills in the gap and creates a void free structure.
FIG._12

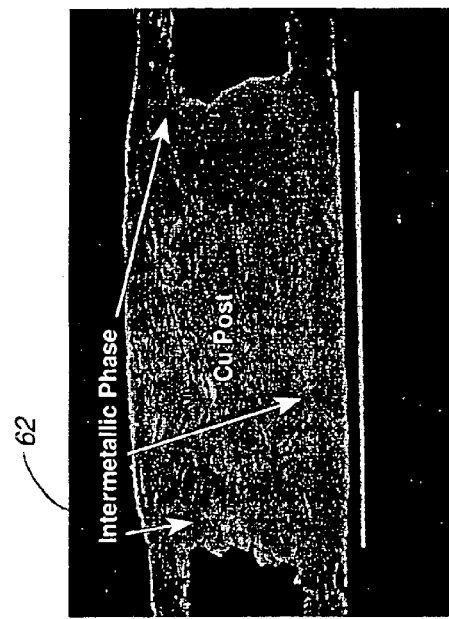
FIG._14
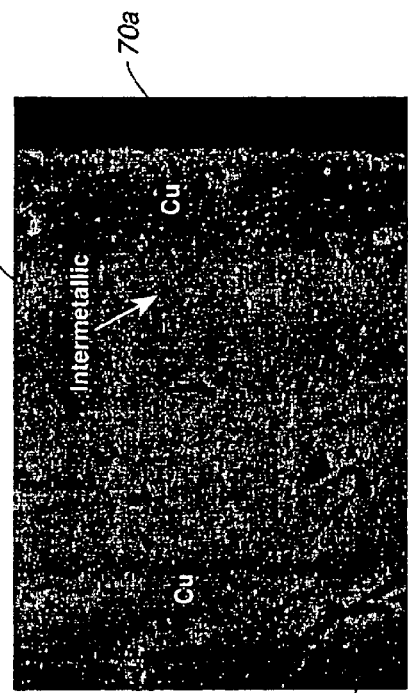
FIG._16
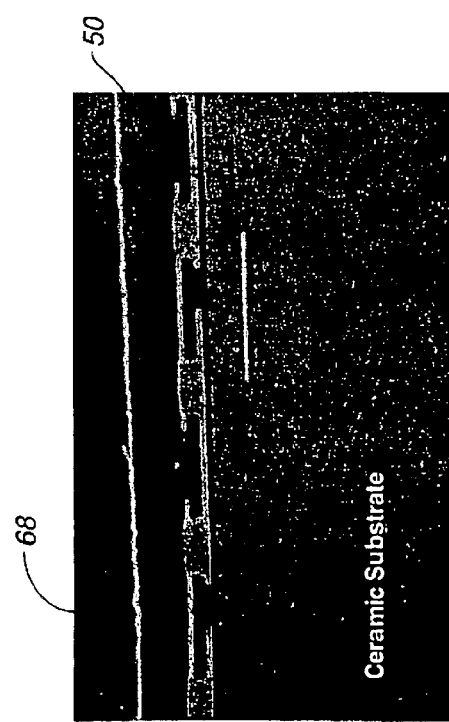
FIG._13
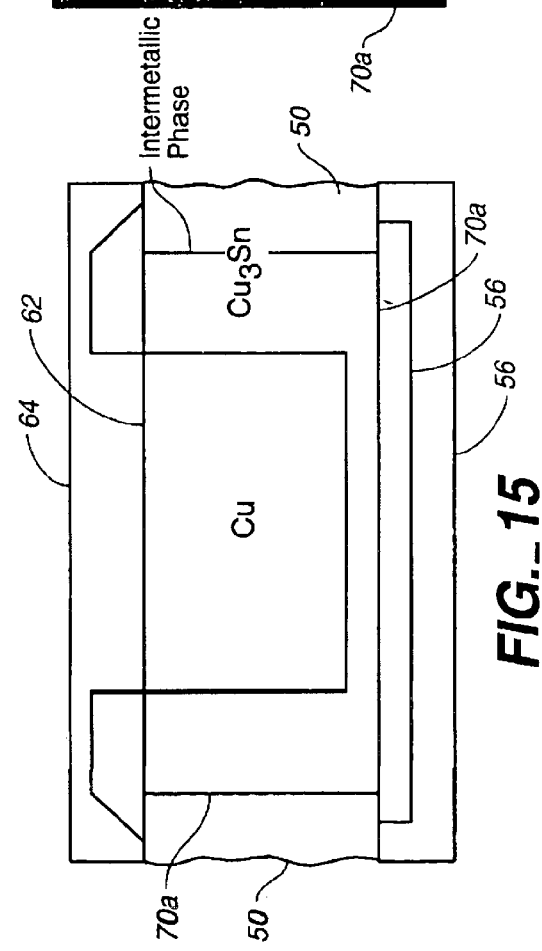
FIG._15

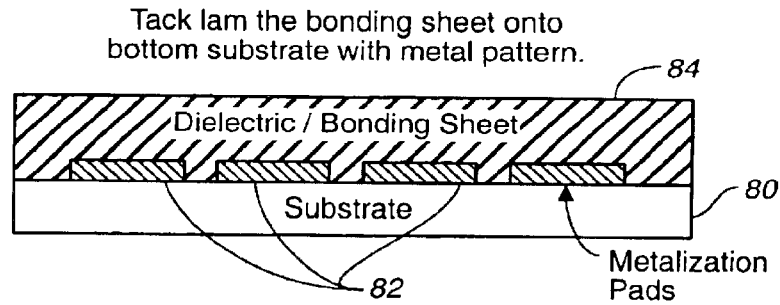
FIG._17
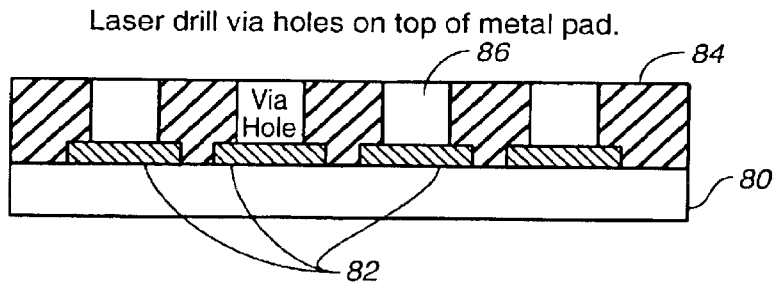
FIG._18
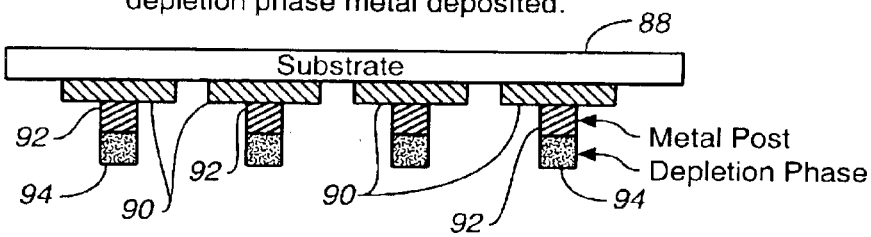
FIG._19
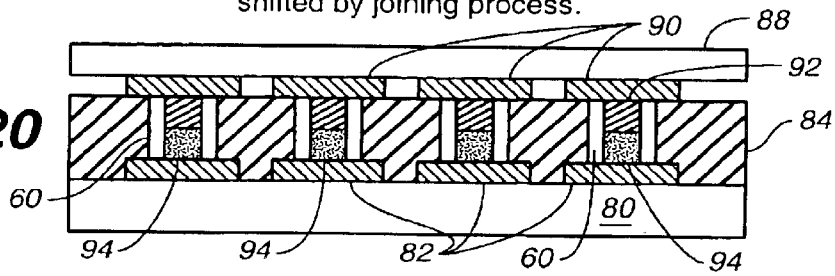
FIG._20

After lamination at suitable temperature for both bonding sheet and Transient Liquid Alloy Joints, the final structure has a filled via with metal post embedded inside intermetallic wall.
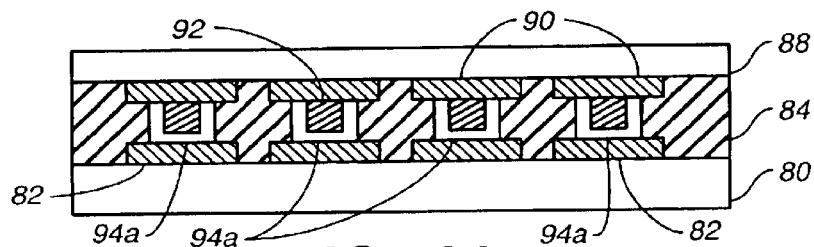
FIG._21
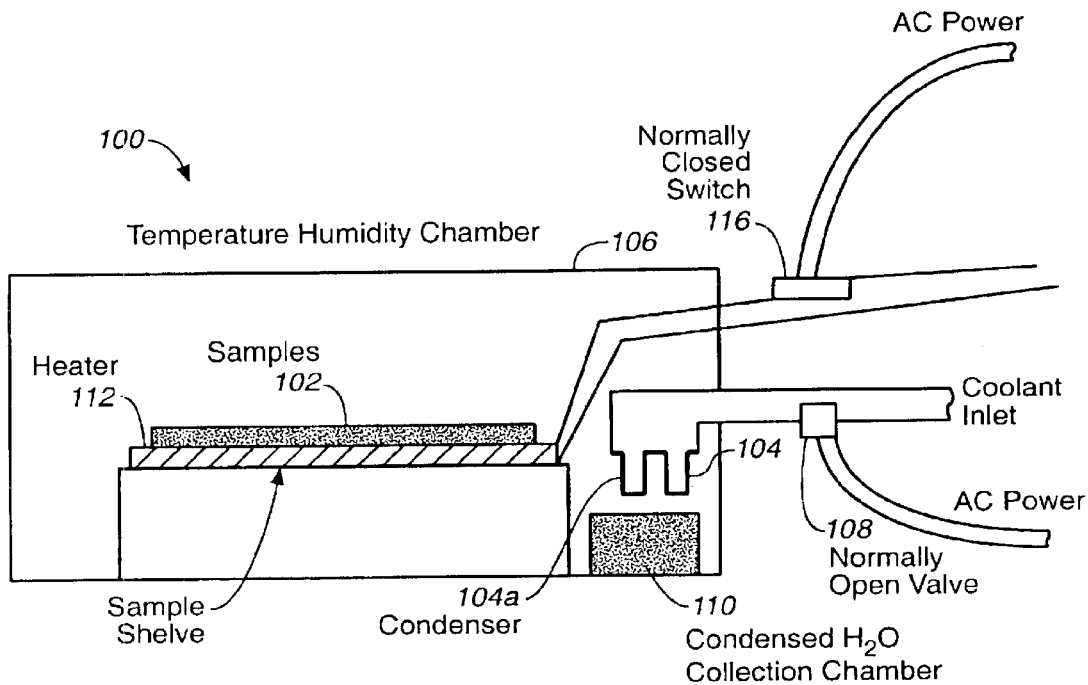
FIG._22

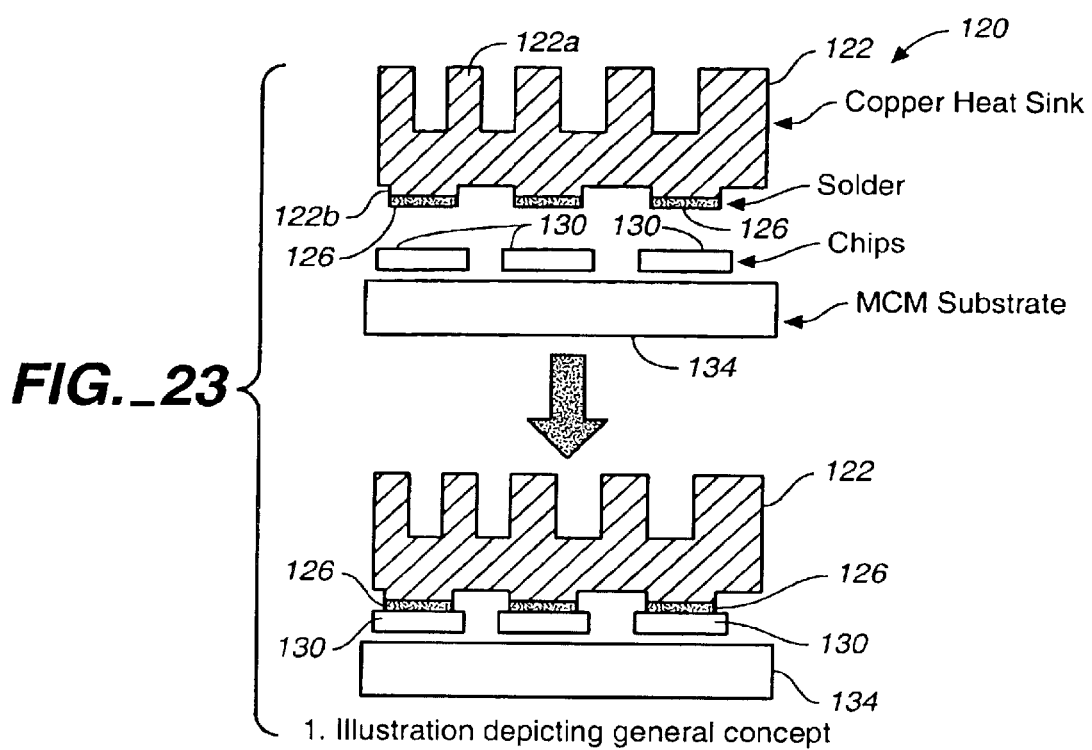
FIG._23
1. Illustration depicting general concept
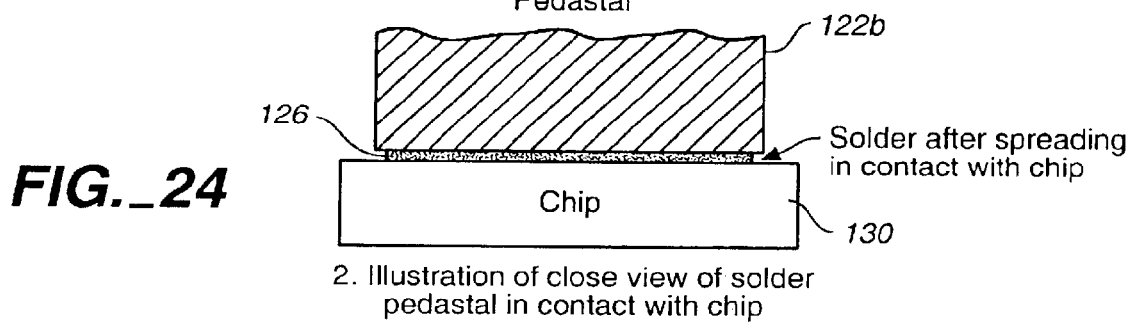
FIG._24
2. Illustration of close view of solder pedastal in contact with chip
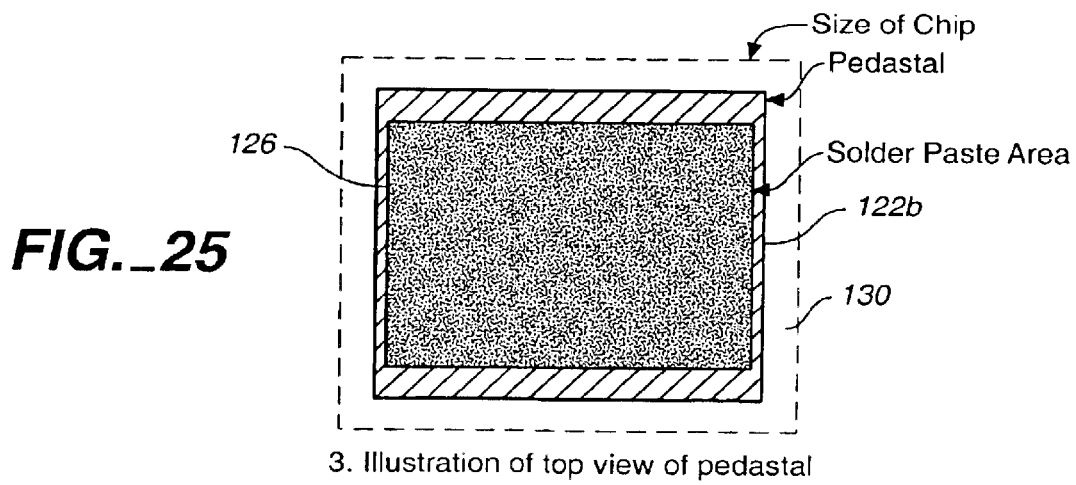
FIG._25
3. Illustration of top view of pedastal

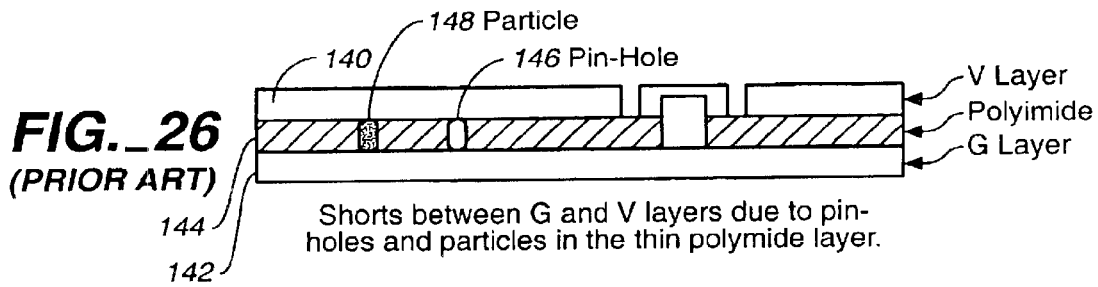

FIG._26 (PRIOR ART)

Shorts between G and V layers due to pin-holes and particles in the thin polymide layer.

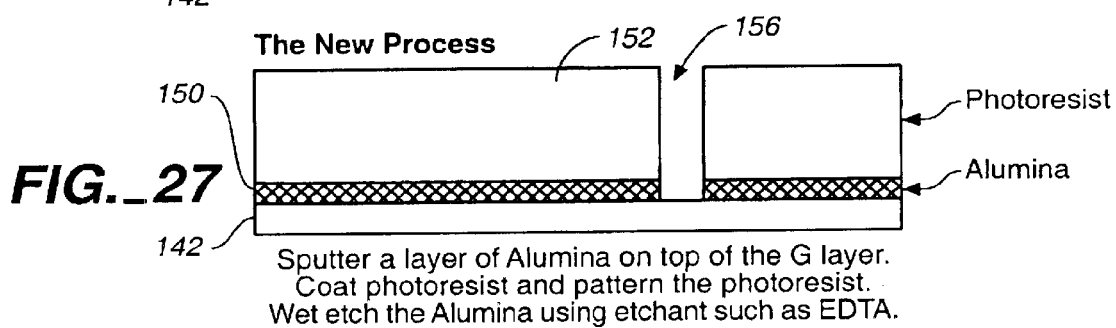

FIG._27

Sputter a layer of Alumina on top of the G layer.
Coat photoresist and pattern the photoresist.
Wet etch the Alumina using etchant such as EDTA.

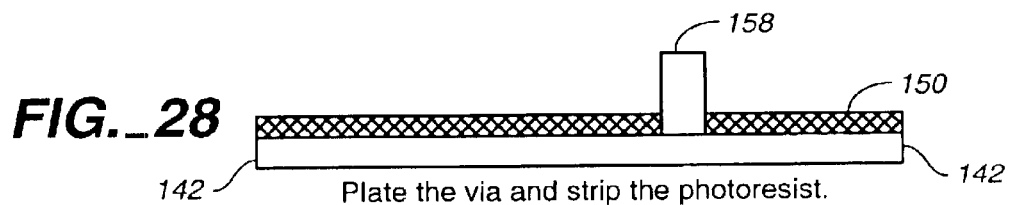

FIG._28

Plate the via and strip the photoresist.

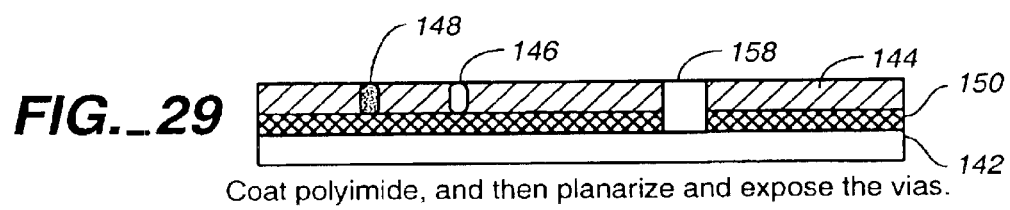

FIG._29

Coat polyimide, and then planarize and expose the vias.

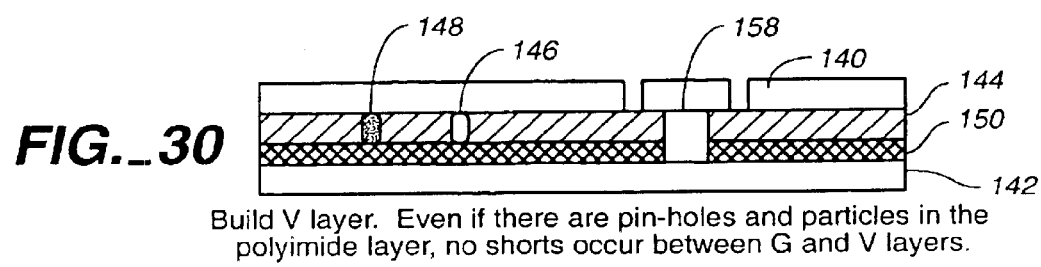

FIG._30

Build V layer. Even if there are pin-holes and particles in the polyimide layer, no shorts occur between G and V layers.

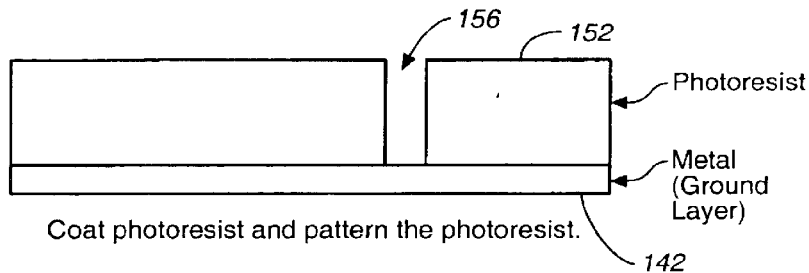

FIG._31 Coat photoresist and pattern the photoresist.

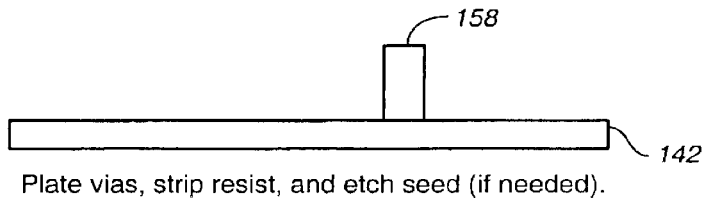

FIG._32 Plate vias, strip resist, and etch seed (if needed).

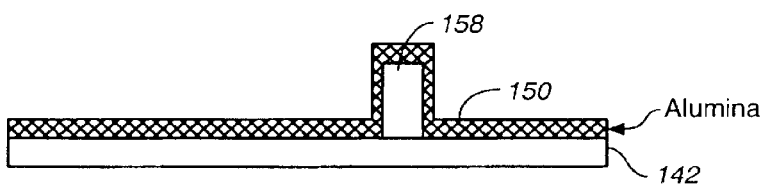

FIG._33 Deposit alumina (or other type of dielectric materials). Deposition processes include CVD, PVD, or sol-gel process.

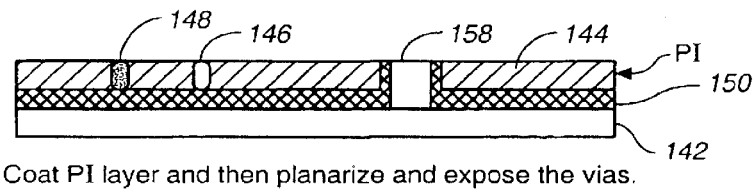

FIG._34 Coat PI layer and then planarize and expose the vias.

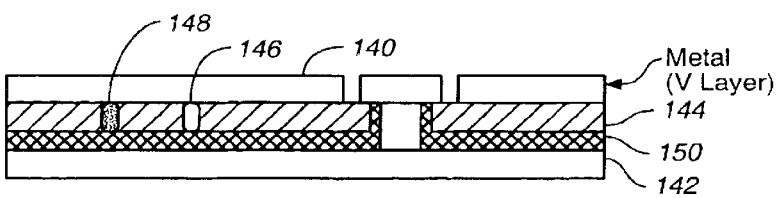

FIG._35 Build V layer. Even if there are pin-holes and particles in the polyimide layer, no shorts occur between G and V layers.

Coat a polyimide layer on top of a substrate. The substrate may be pre-treated for later film / substrate separation. Sputter Cr-Cu seed, and build up multi-layer circuits. The Cr-Cu seed layer is not removed until the film / substrate separation.

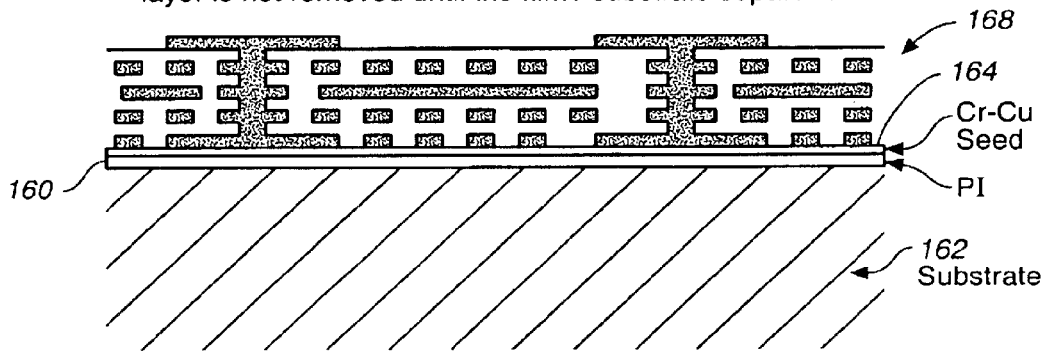

FIG._36

After film / substrate separation.

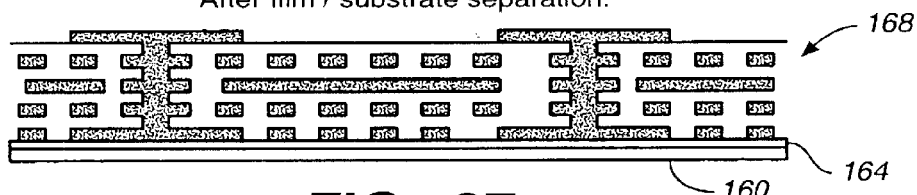

FIG._37

The polyimide layer is etched away using oxygen plasma. The Cr-Cu seed layer serves as the stop-layer for the plasma etching.

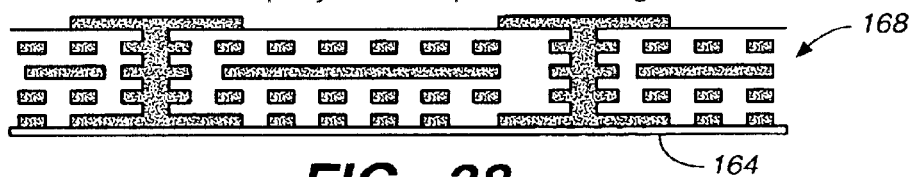

FIG._38

After wet etch of Cr-Cu seed.

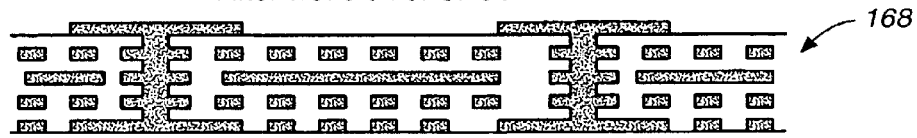

FIG._39

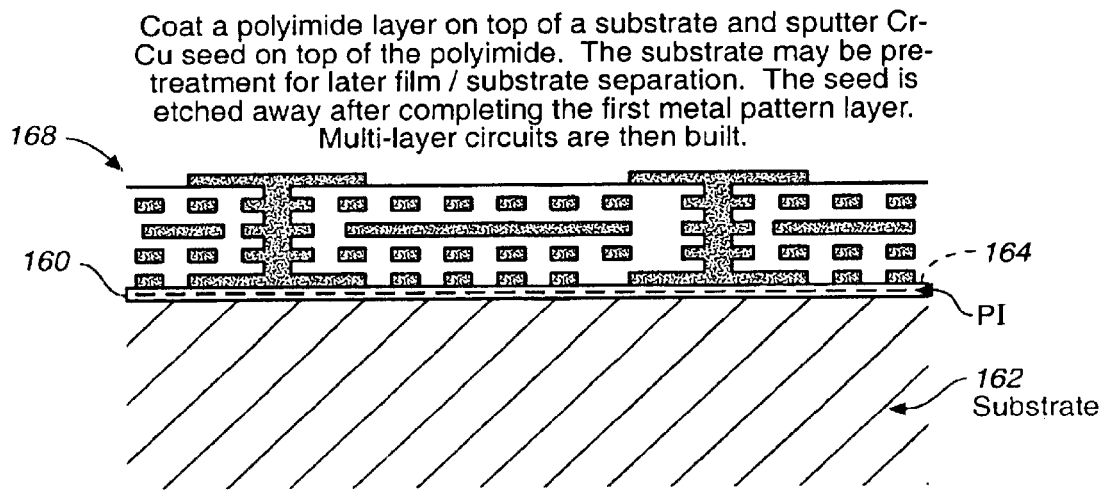
FIG._40 — Coat a polyimide layer on top of a substrate and sputter Cr-Cu seed on top of the polyimide. The substrate may be pre-treatment for later film / substrate separation. The seed is etched away after completing the first metal pattern layer. Multi-layer circuits are then built.
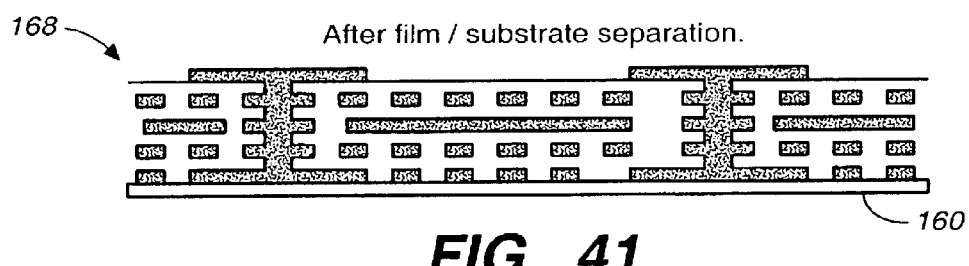
FIG._41 — After film / substrate separation.
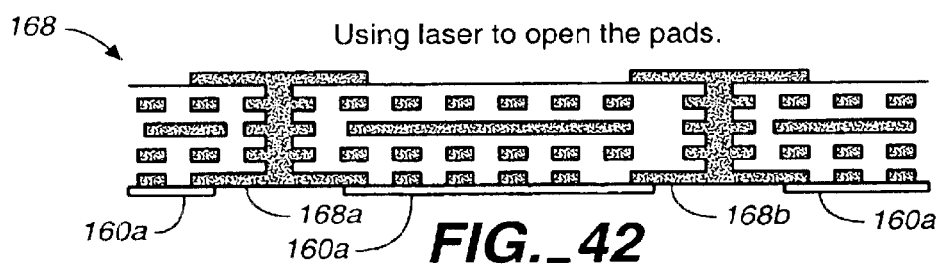
FIG._42 — Using laser to open the pads.

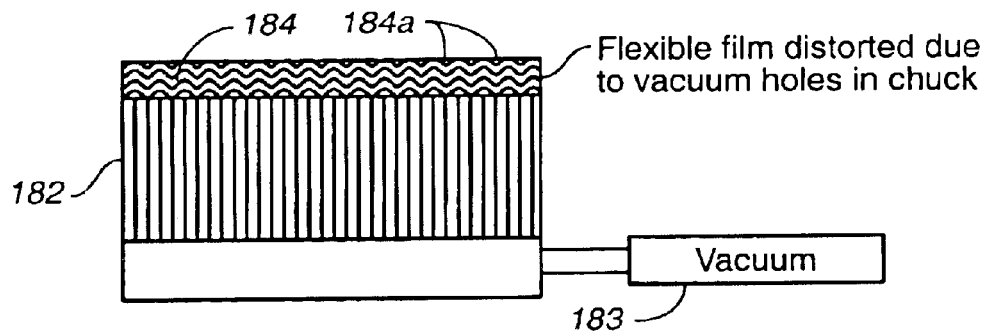
FIG._43
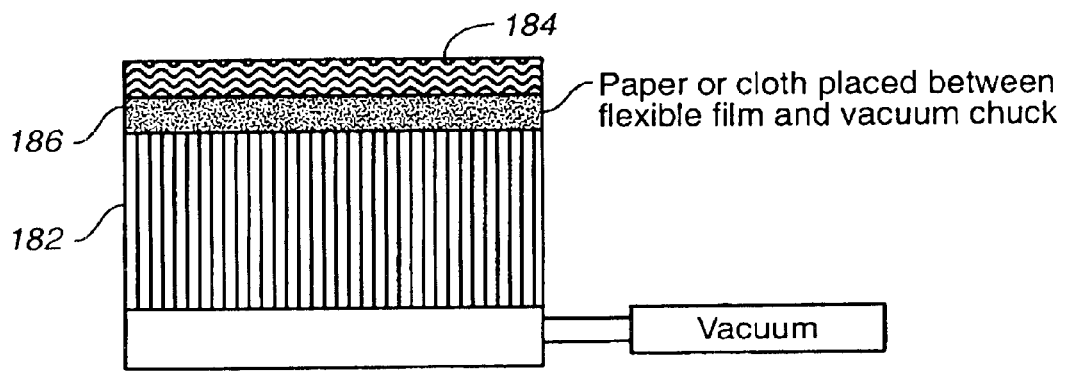
FIG._44
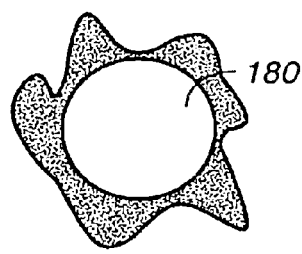
Bottom burn from laser ablation
FIG._45
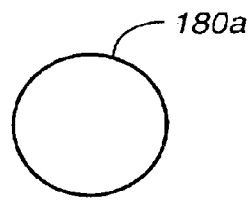
Burn reduced when paper or cloth is used
FIG._46

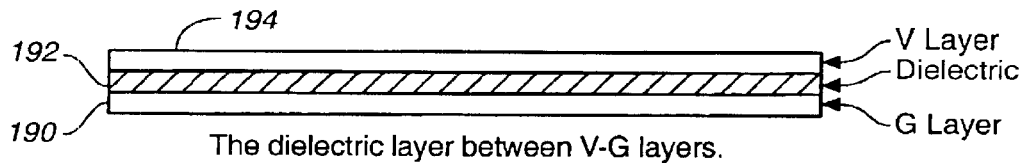
FIG._47 The dielectric layer between V-G layers.
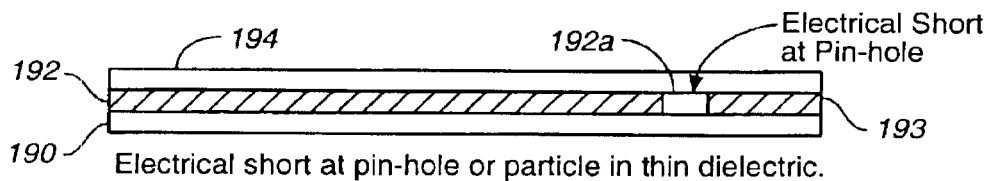
FIG._48 Electrical short at pin-hole or particle in thin dielectric.
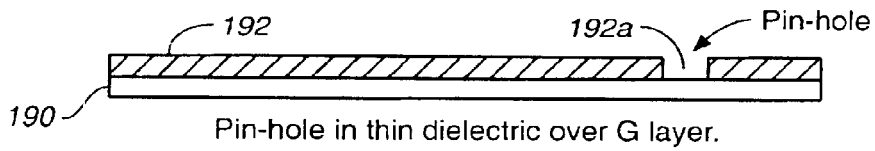
FIG._49 Pin-hole in thin dielectric over G layer.
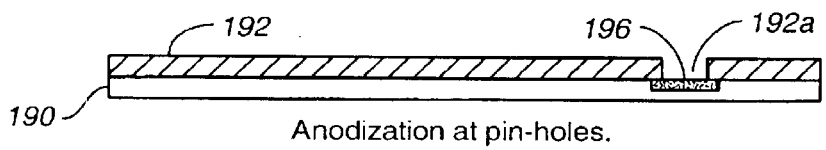
FIG._50 Anodization at pin-holes.
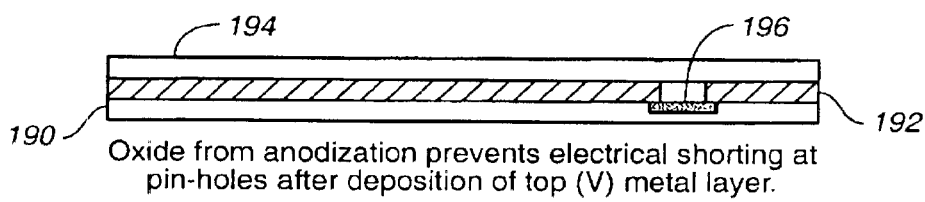
FIG._51 Oxide from anodization prevents electrical shorting at pin-holes after deposition of top (V) metal layer.

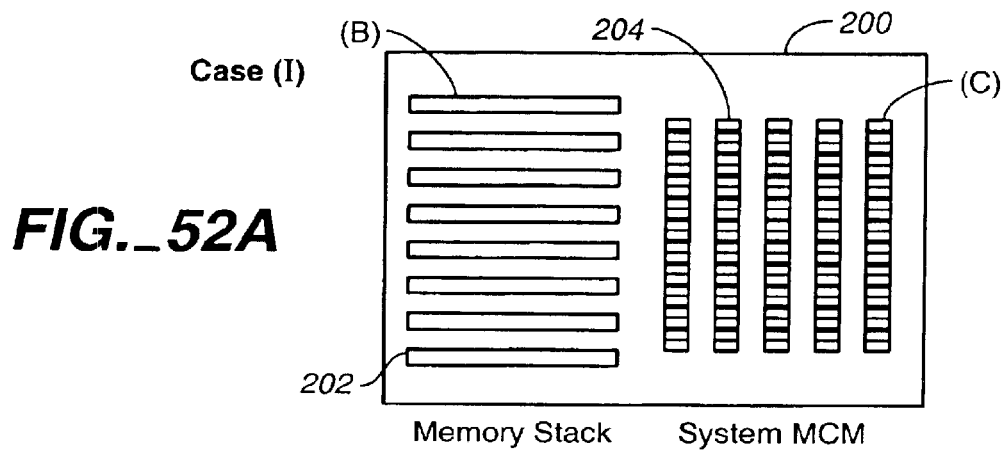
FIG._52A Case (I)
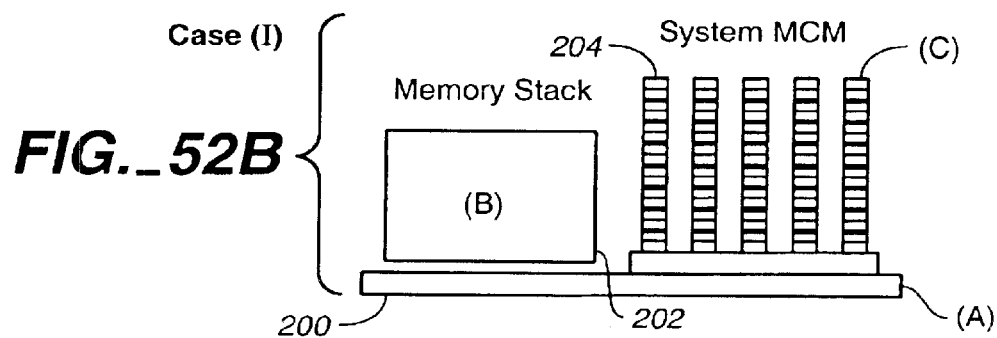
FIG._52B Case (I)
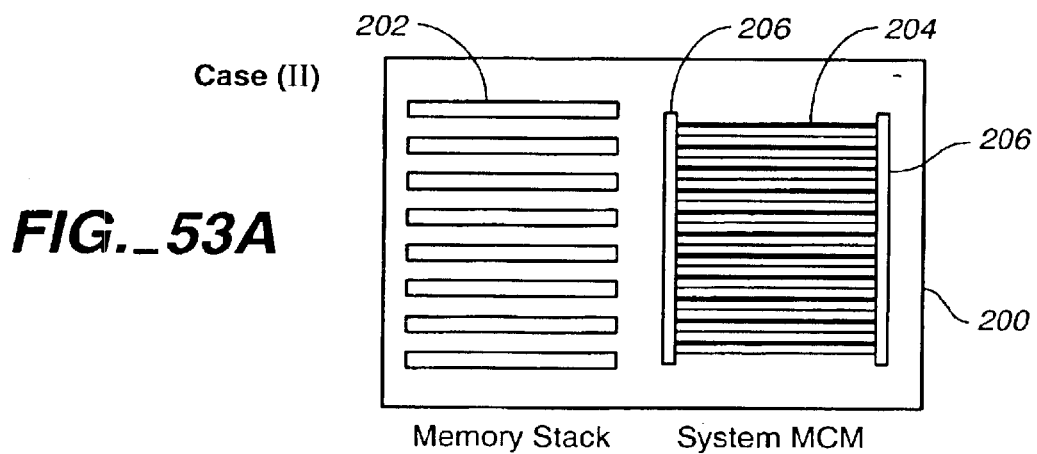
FIG._53A Case (II)
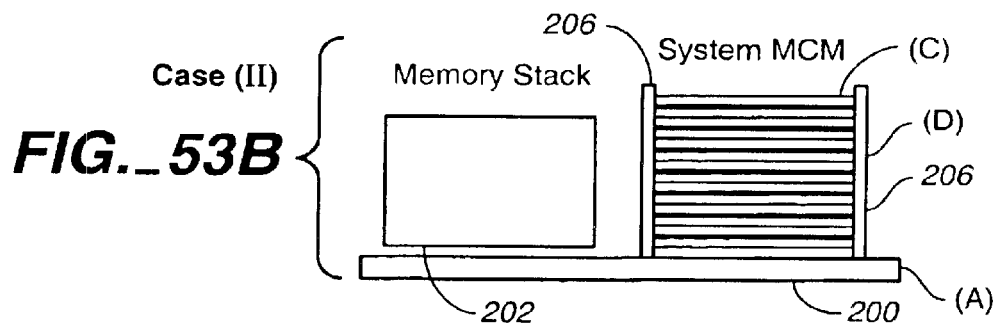
FIG._53B Case (II)

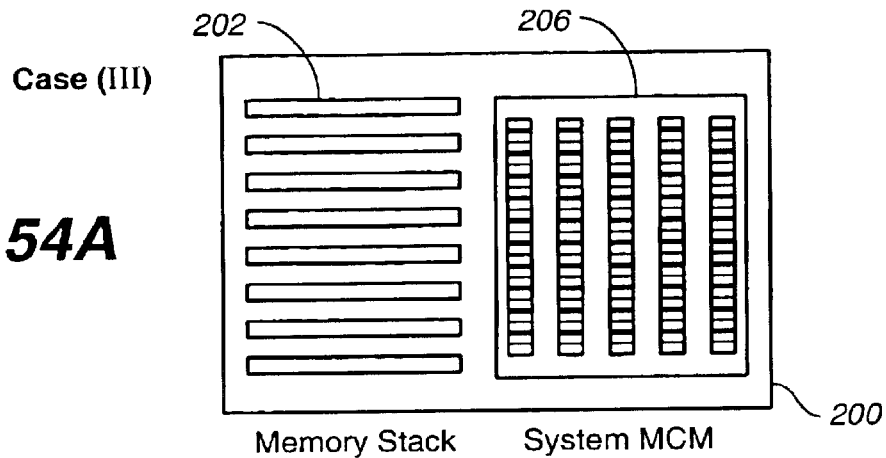
FIG._54A
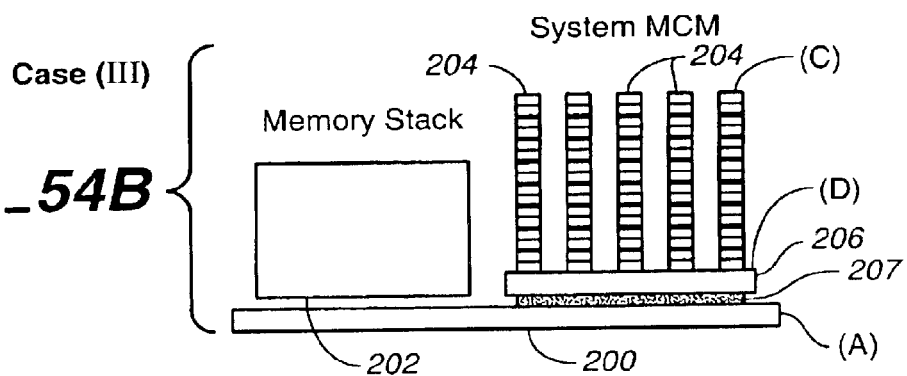
FIG._54B
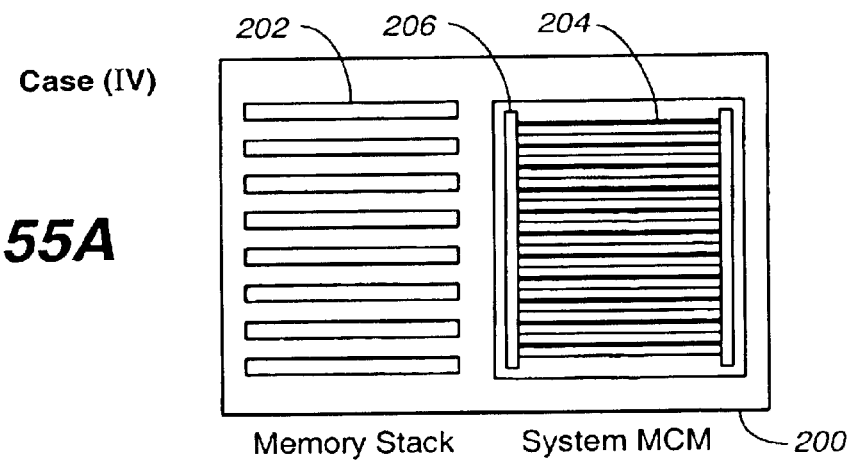
FIG._55A
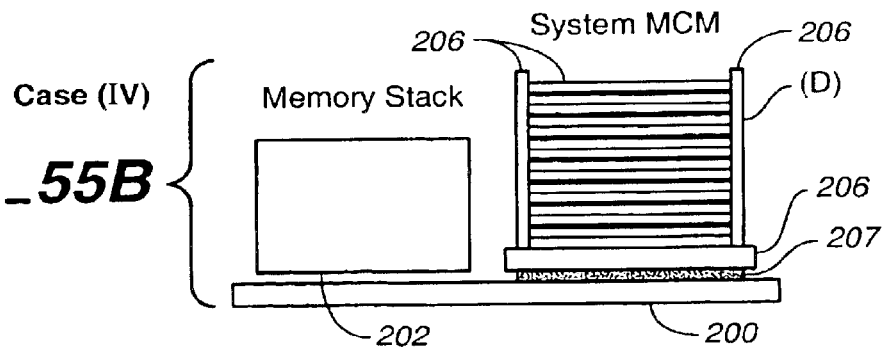
FIG._55B

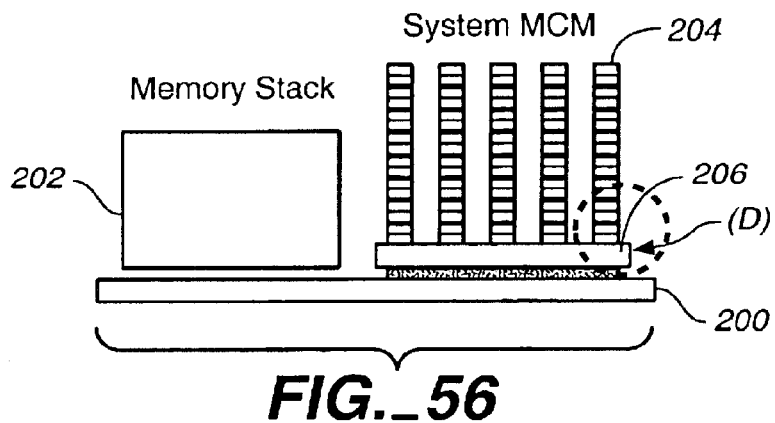
FIG._56
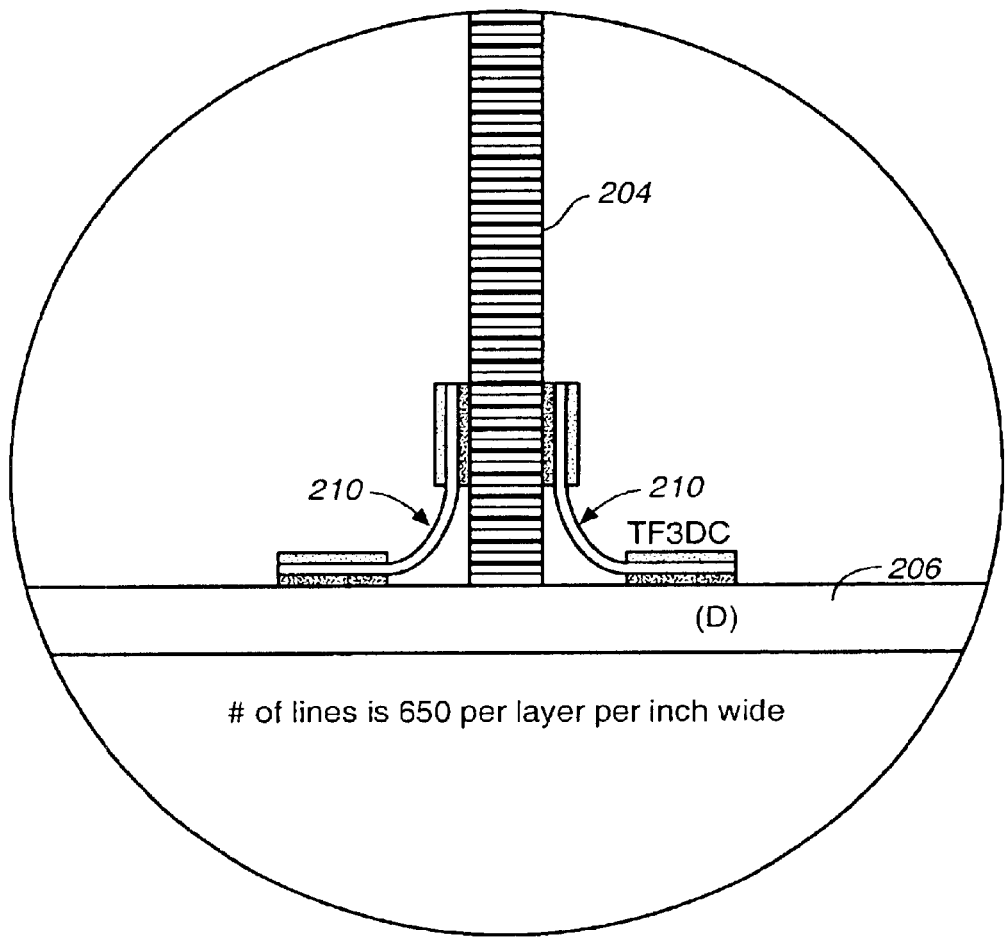
FIG._57

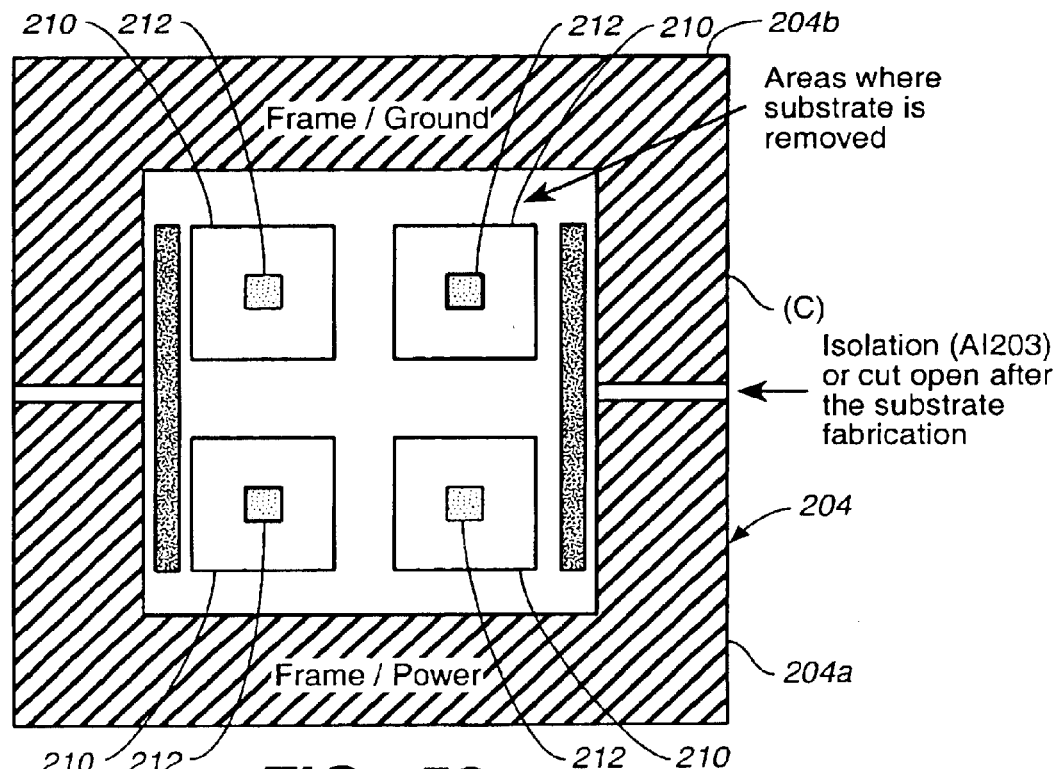
FIG._58
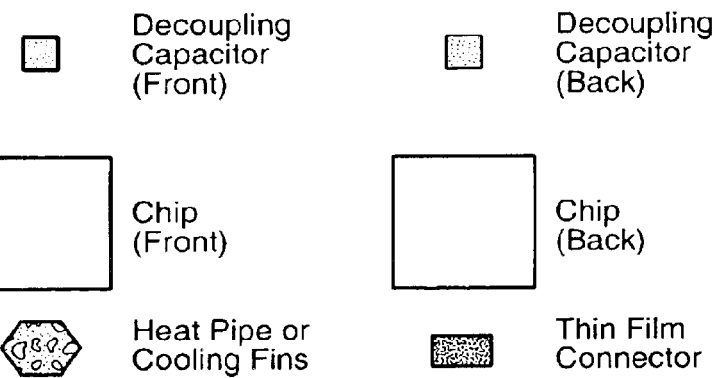
FIG._59
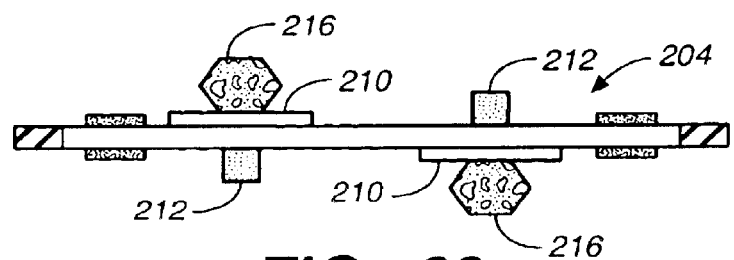
FIG._60

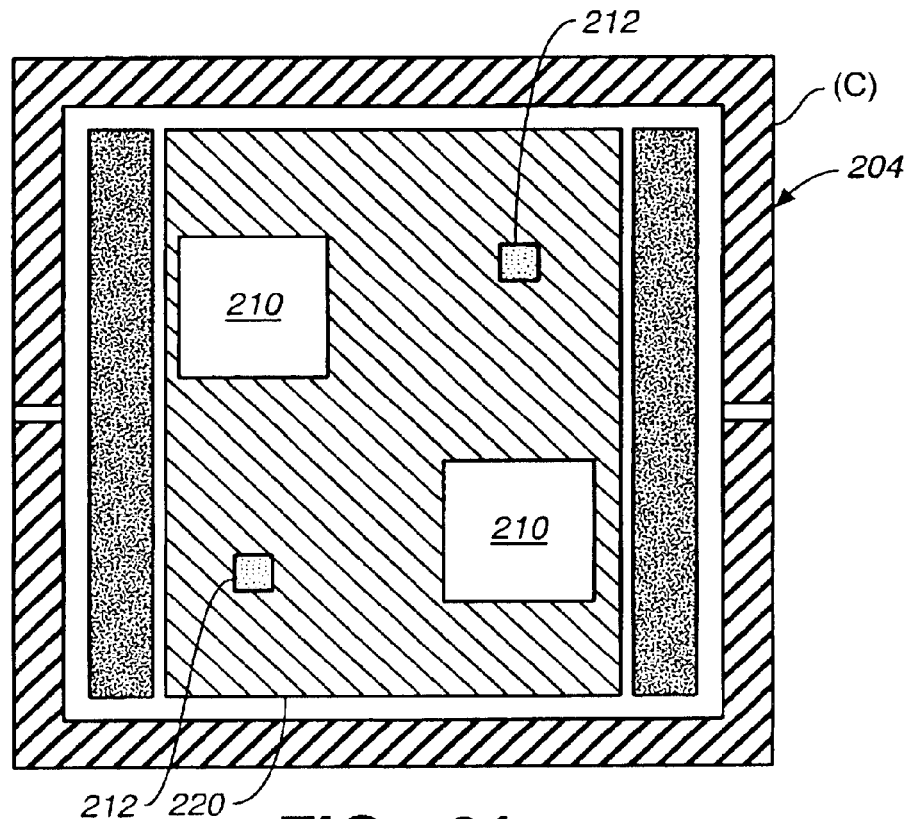
FIG._61
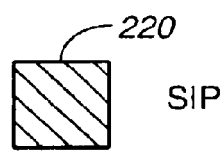
FIG._62
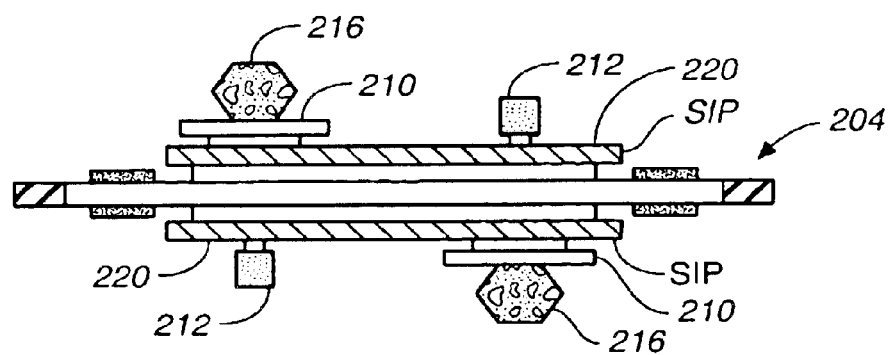
FIG._63

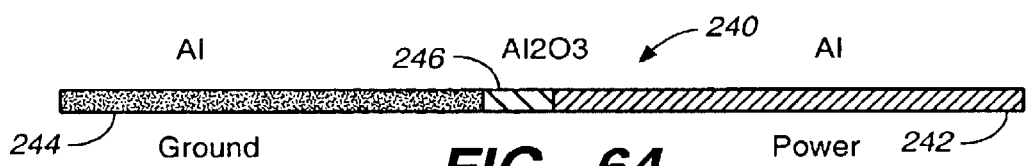
FIG._64
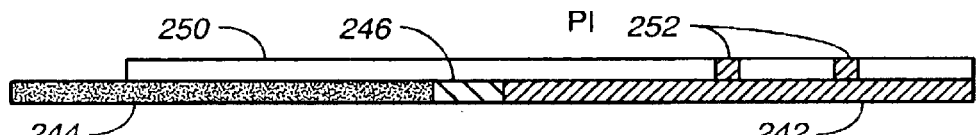
FIG._65
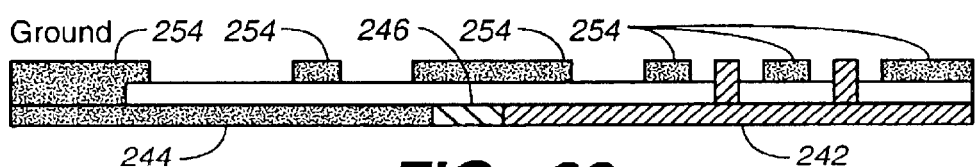
FIG._66
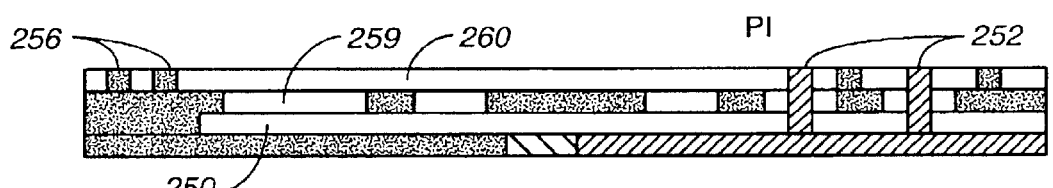
FIG._67
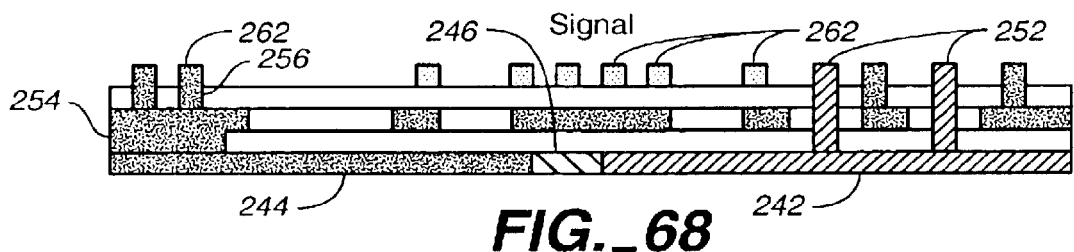
FIG._68
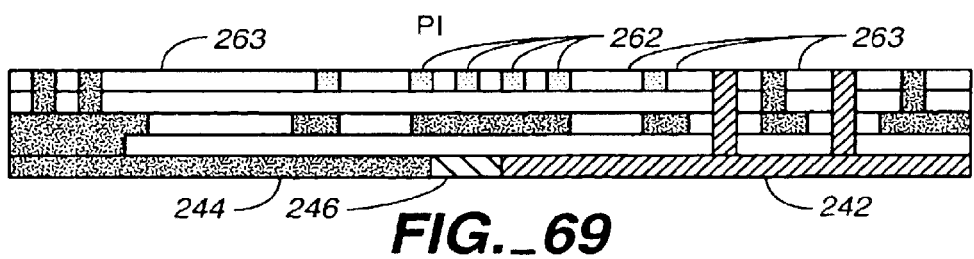
FIG._69

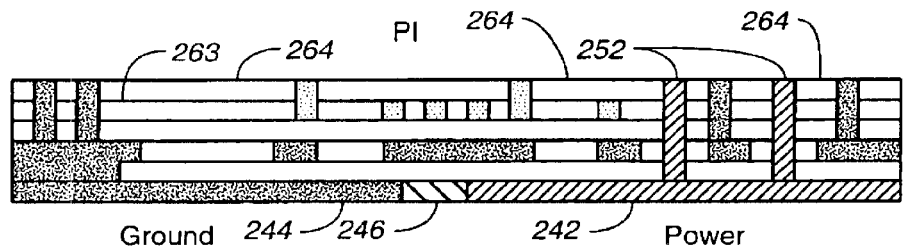
FIG._70
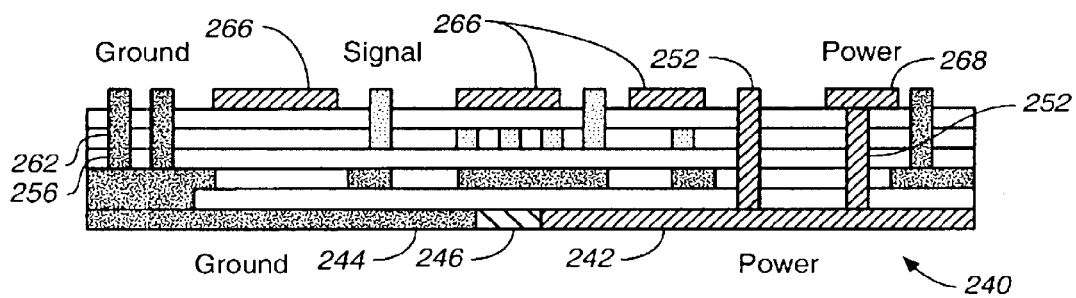
FIG._71
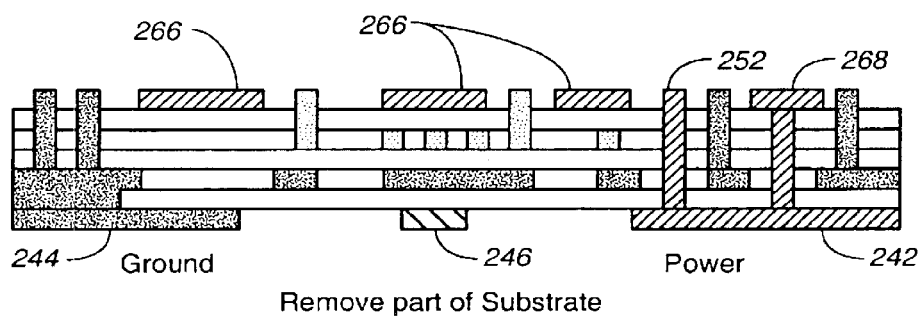
Remove part of Substrate
FIG._72

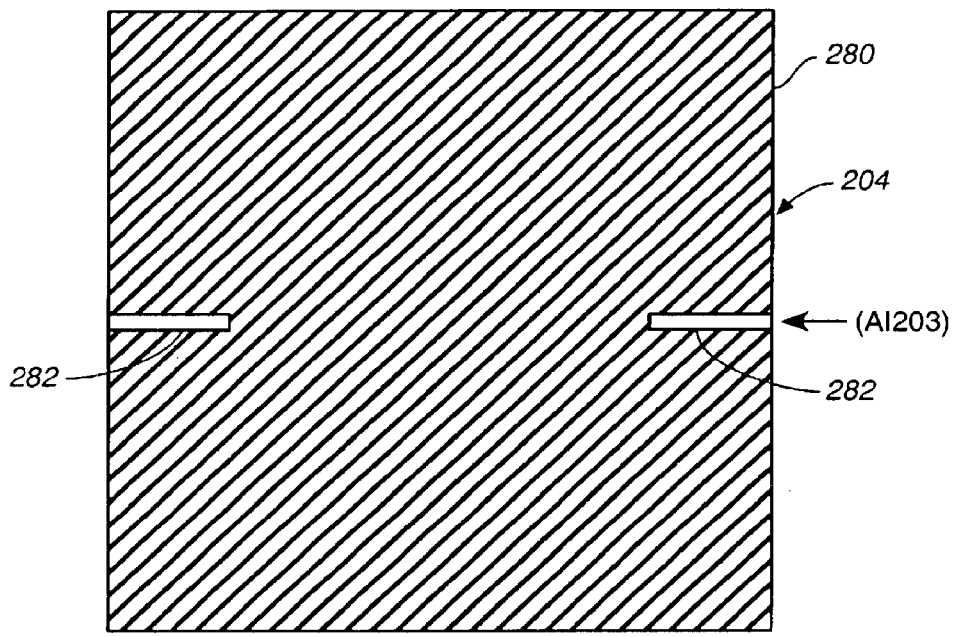
FIG._73
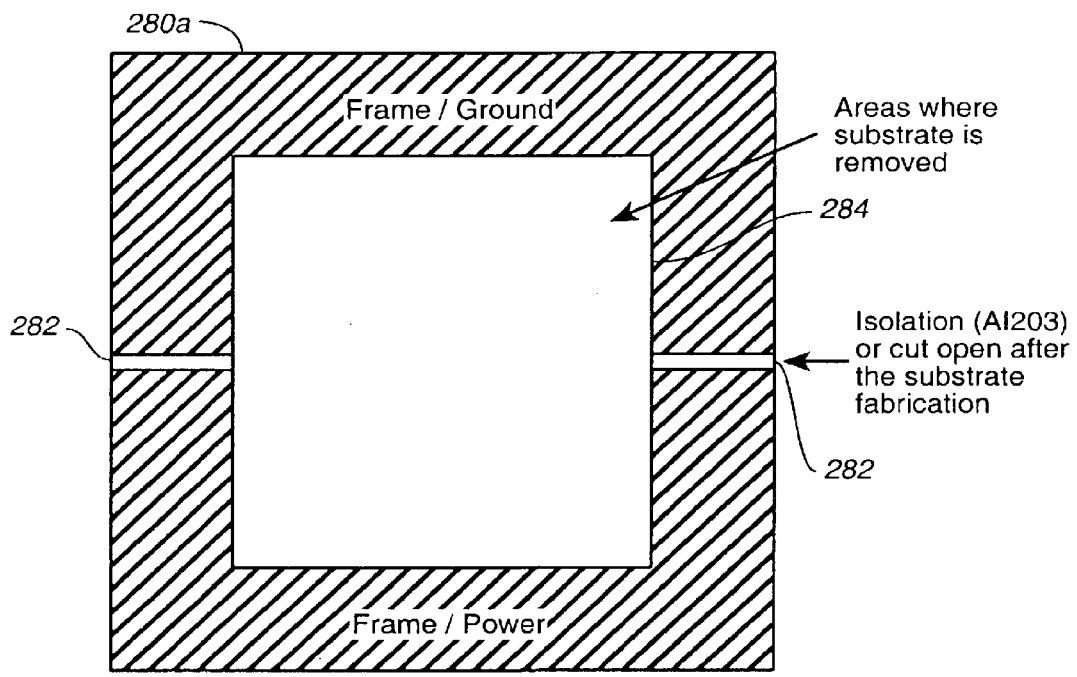
FIG._74
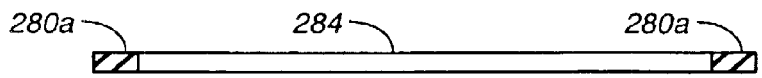
FIG._75

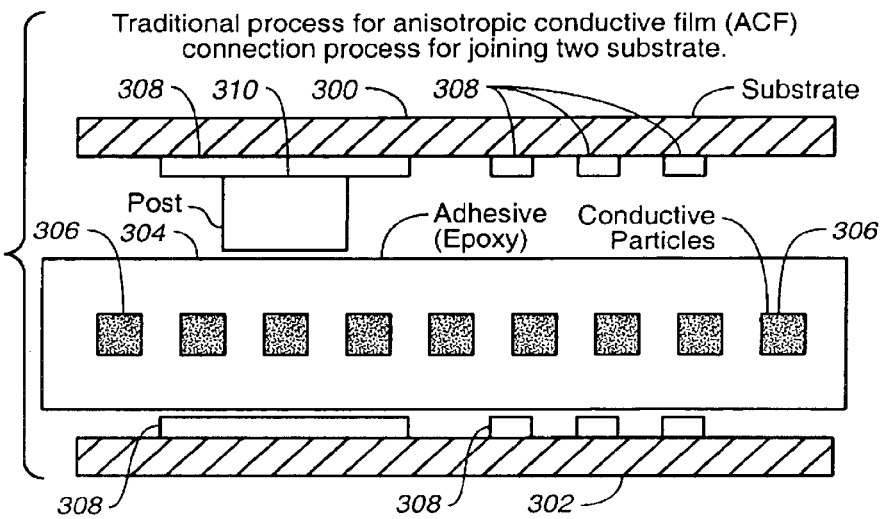
FIG._76 Traditional process for anisotropic conductive film (ACF) connection process for joining two substrate.
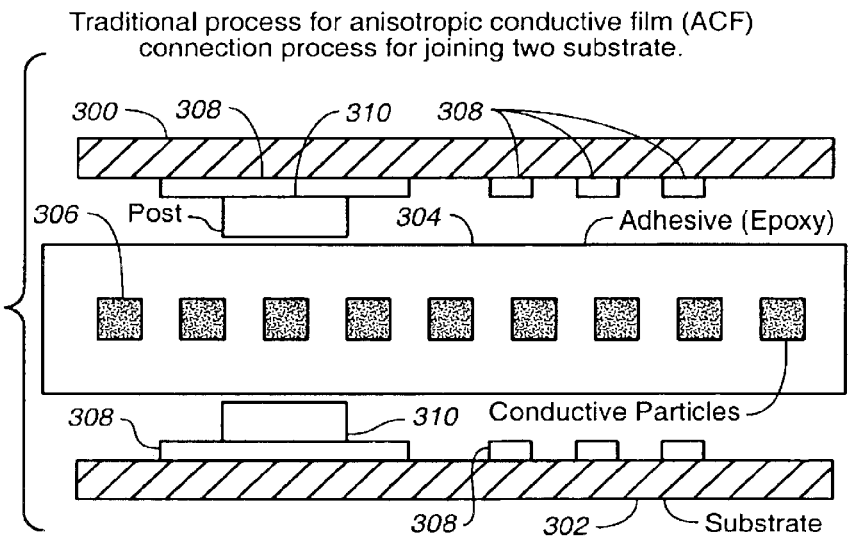
FIG._77 Traditional process for anisotropic conductive film (ACF) connection process for joining two substrate.
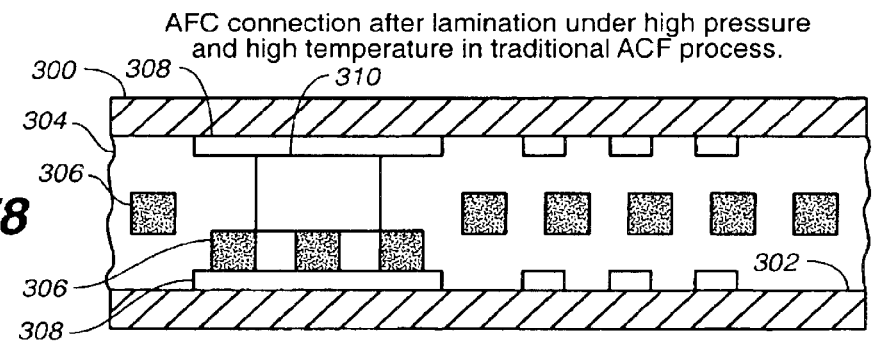
FIG._78 AFC connection after lamination under high pressure and high temperature in traditional ACF process.

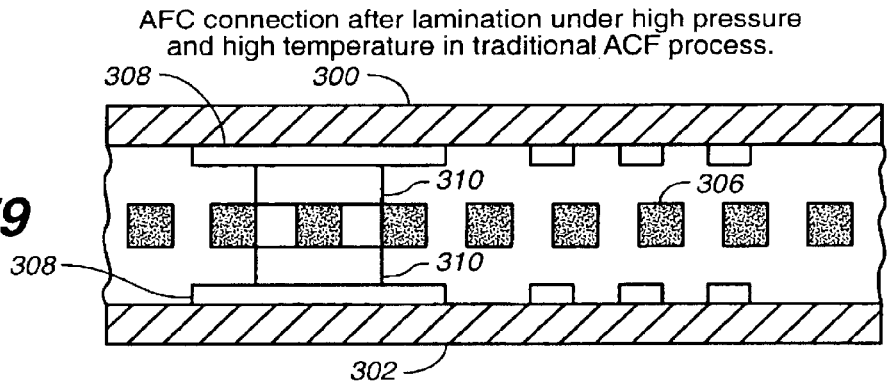
FIG._79
AFC connection after lamination under high pressure and high temperature in traditional ACF process.
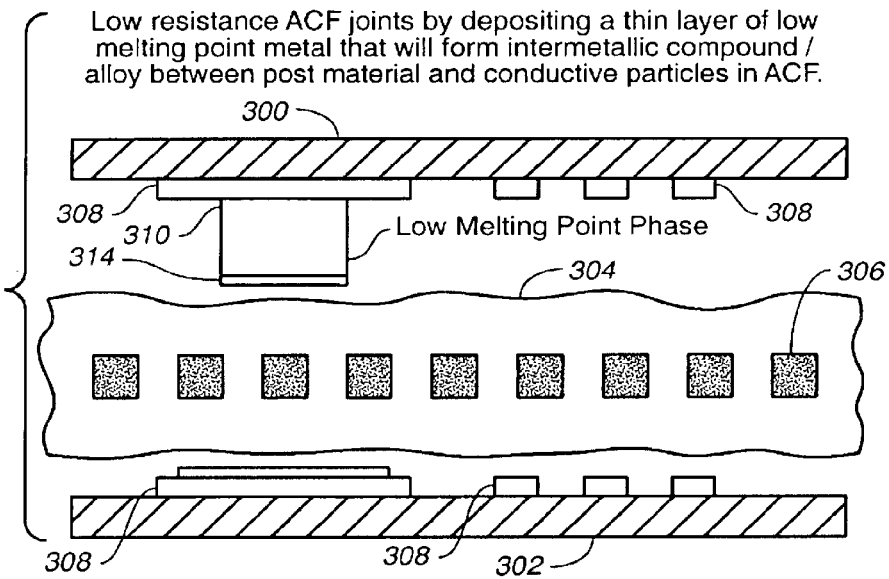
FIG._80
Low resistance ACF joints by depositing a thin layer of low melting point metal that will form intermetallic compound / alloy between post material and conductive particles in ACF.
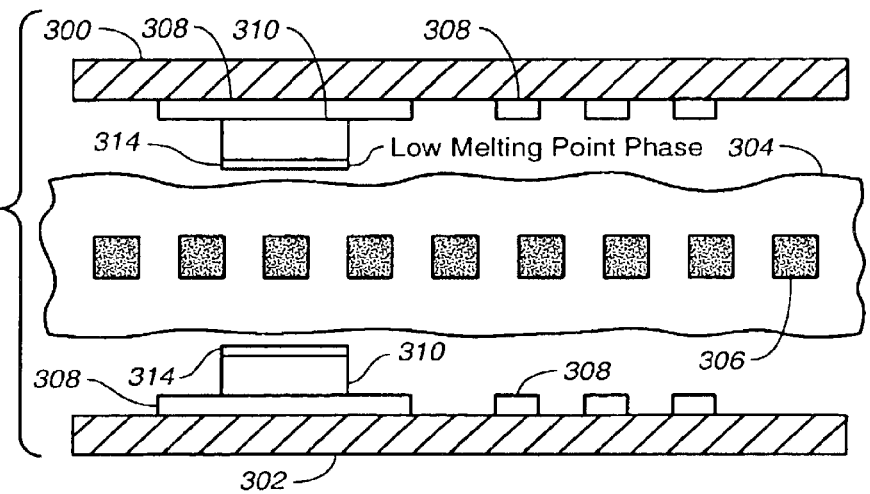
FIG._81

After joining process (high pressure and high temperature), intermetallic / alloy formed at the interface of post and conductive particles. The intermetallic / alloy will decrease the contact resistance from traditional ACF process and provide a stronger mechanical bond.
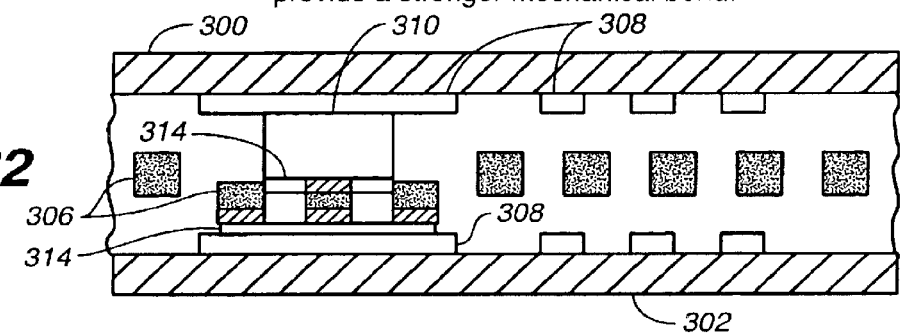
FIG._82
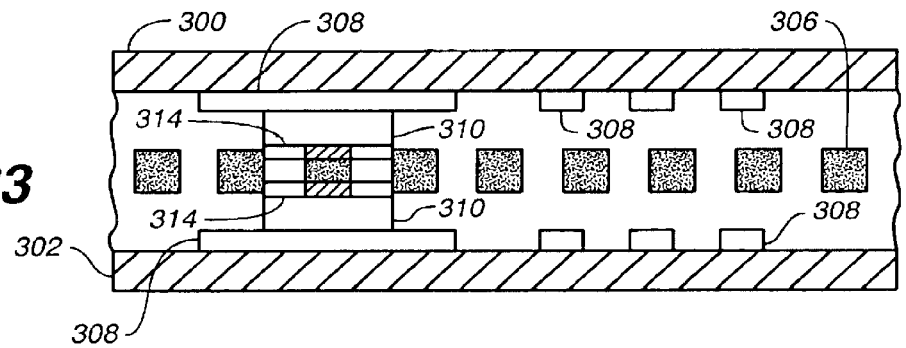
FIG._83

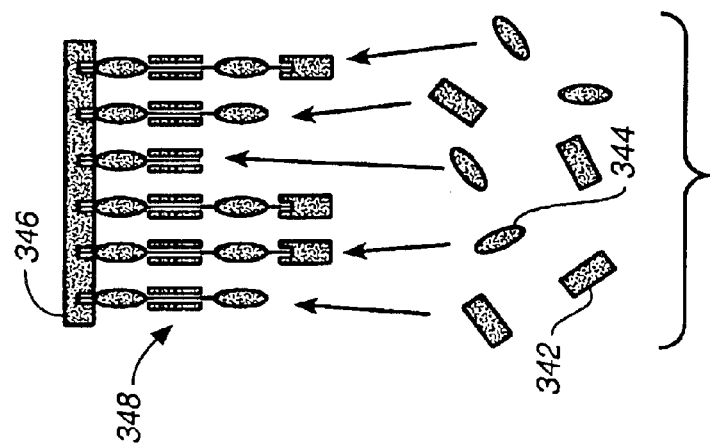
FIG._84B
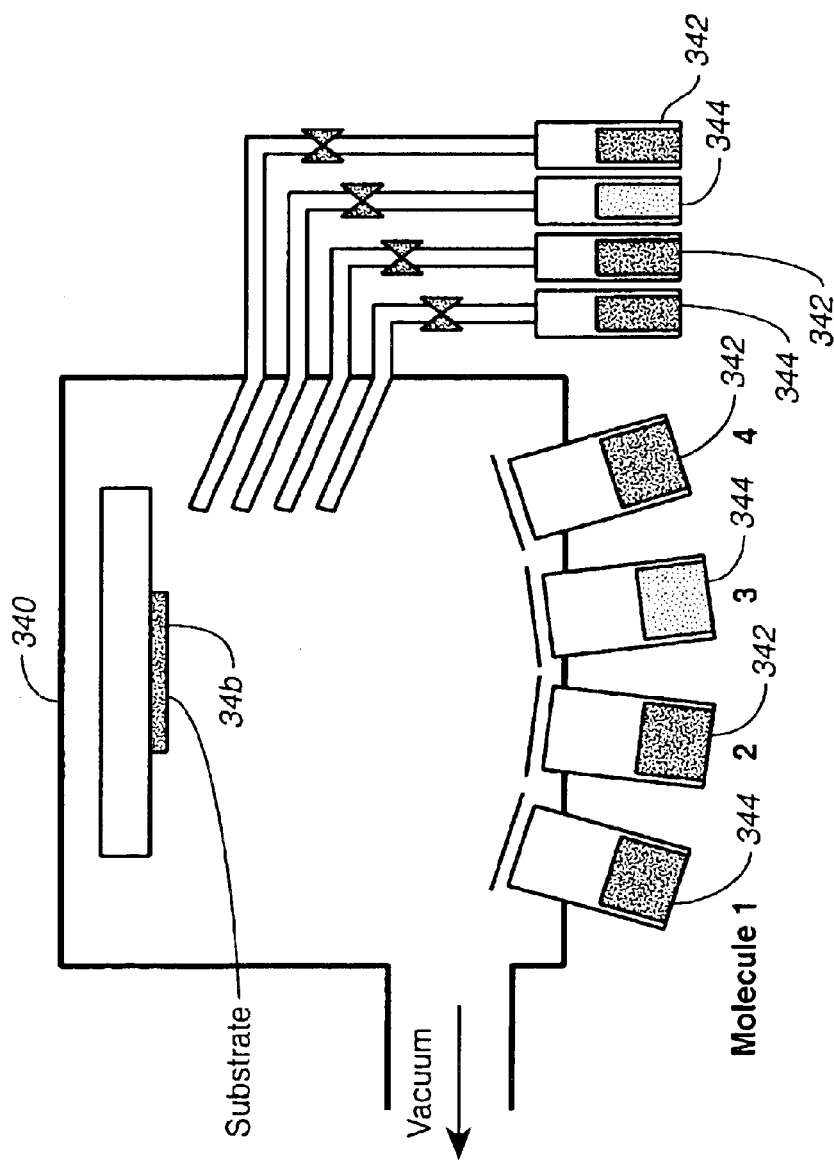
FIG._84A

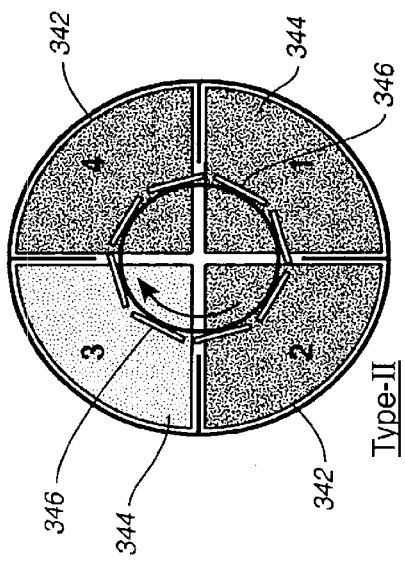
FIG._85A
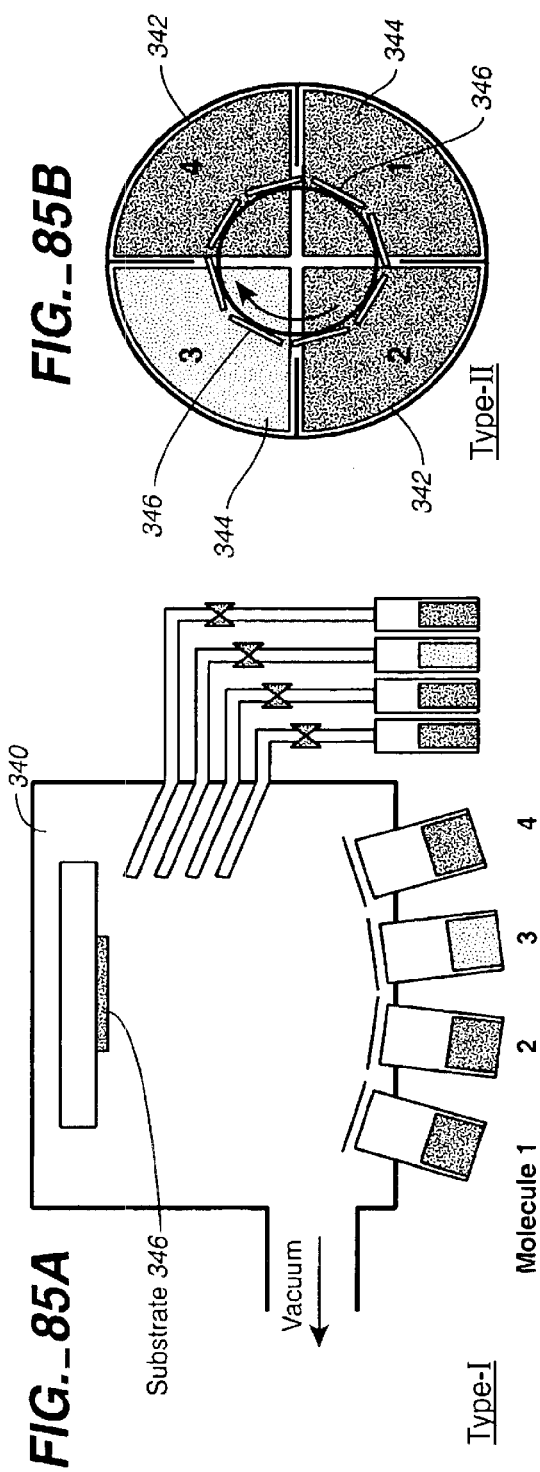
FIG._85B
FIG._85C
FIG._85D
FIG._85E
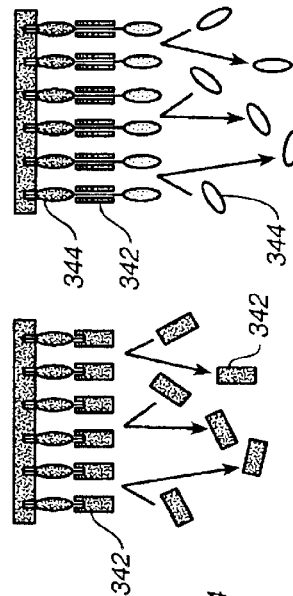
FIG._85F
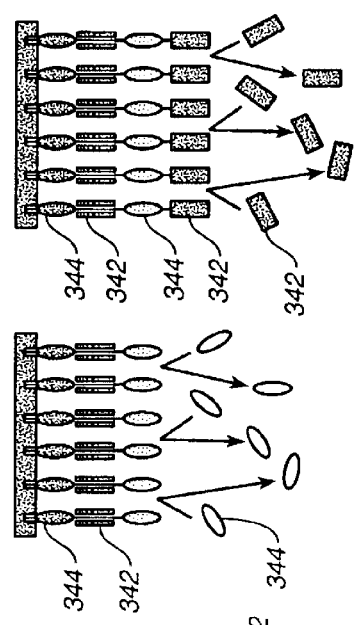
FIG._85G FUJITSU Computer Packaging Technologies, Inc.  FCPT

Vapor Phase Deposition Vs. Spin Coating

|  | Spin Coating | Vapor Phase Deposition | |
|---|---|---|---|
|  |  | CVD | MLD |
| -Coverage Controllability | Low | High | High |
| -Thickness Accuracy / Uniformity | Low | Medium | High |
| -Deposition Rate | High | Medium | Low |
| -Molecular-level Controllability | Low | Medium | High |
| -Selective / Deposition | No | Yes | Yes |
| -Selective Molecular Alignment | No | Yes | Yes |

(High & Yes are preferable)

-Conformable coverage and Thickness accuracy / uniformity
    -CVD / MLD are superior to Spin Coating -Low $\varepsilon$ insulator with strong adhesion
    -MLD may provide high adhesion with the Molecular-Level Controllability -Options
    -CVD / MLD can do  #Selective Deposition (hydrophilic / hydrophobic surface)
                                     #Selective Molecular Alignment (surface treatment)
    may provide further $\varepsilon$ reduction, process simplification, and low Cu-diffusion

*FIG._85H*

FIG._86A — Examples of MLD & CVD Application to MCM Processes. Coverage, Thickness Accuracy FIG._86B — Examples of MLD & CVD Application to MCM Processes. Coverage, Thickness Accuracy. CVD or MLD FIG._86C — Examples of MLD & CVD Application to MCM Processes. Coverage, Thickness Accuracy Process Symp. CMP FIG._86D — Examples of MLD & CVD Application to MCM Processes. Coverage, Thickness Accuracy. CVD, MLD or SC FIG._86E — Examples of MLD & CVD Application to MCM Processes. Coverage, Thickness Accuracy FIG._86F — Examples of MLD & CVD Application to MCM Processes. Coverage, Thickness Accuracy Process Symp.

FIG._86G — Examples of MLD & CVD Application to MCM Processes. Coverage, Thickness Accuracy Process Symp. Surface Modulation FIG._86H — Examples of MLD & CVD Application to MCM Processes. Coverage, Thickness Accuracy Process Symp. CVD or MLD (Selective Depo)

FIG._86I — Examples of MLD & CVD Application to MCM Processes. Coverage, Thickness Accuracy Process Symp.

FIG._86J — Examples of MLD & CVD Application to MCM Processes. Coverage, Thickness Accuracy Process Symp. CVD, MLD or SC FIG._86K — Examples of MLD & CVD Application to MCM Processes. Coverage, Thickness Accuracy Process Symp.

FIG._86L — Examples of MLD & CVD Application to MCM Processes. Low ε Thin Film Strong Adhesion

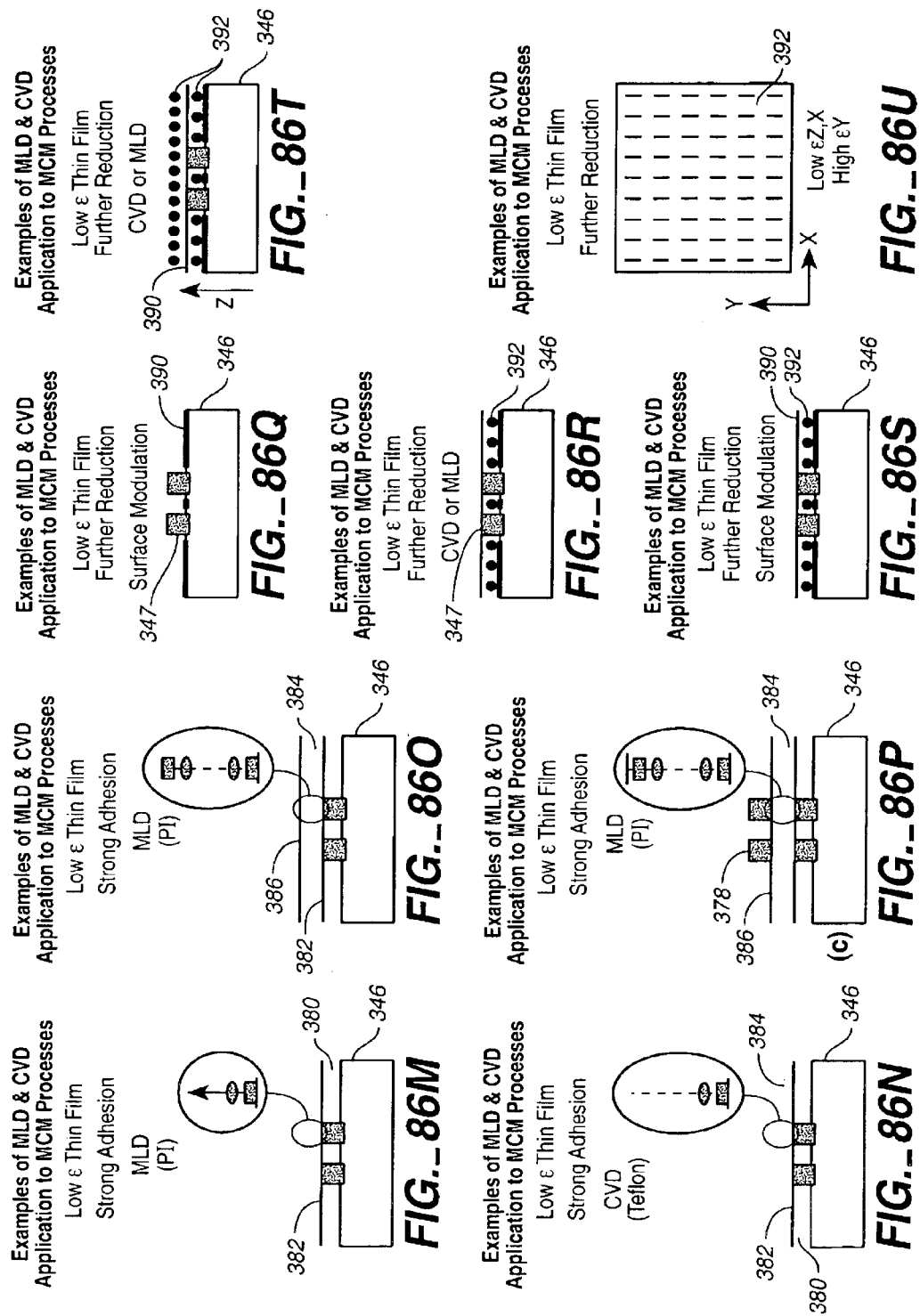

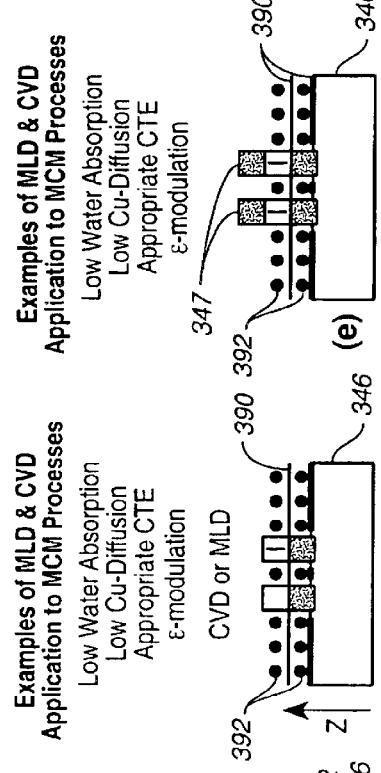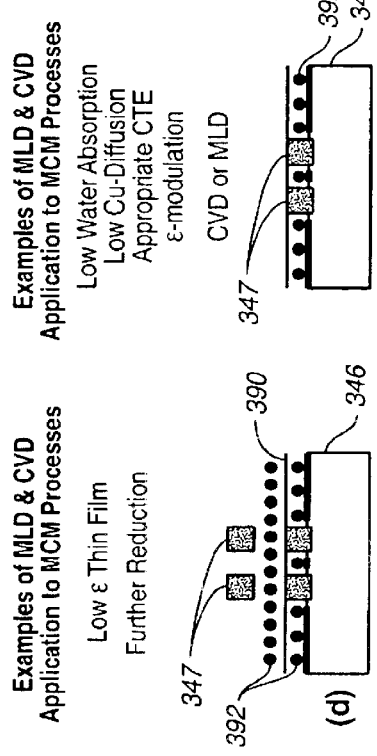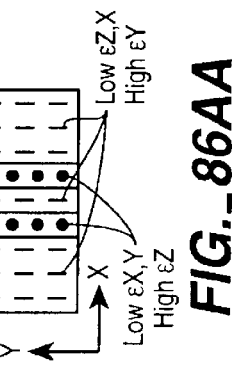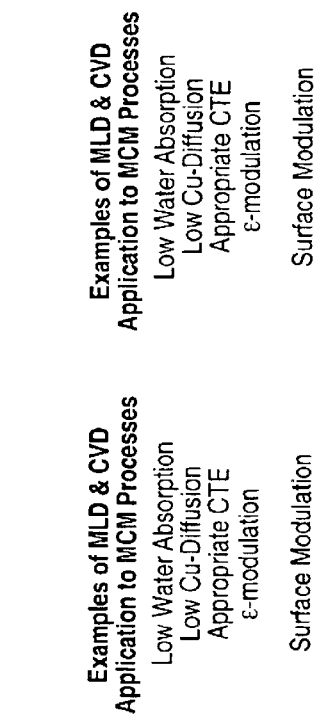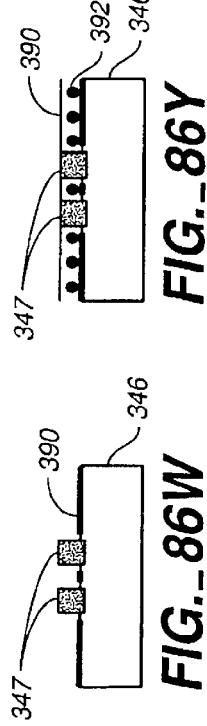

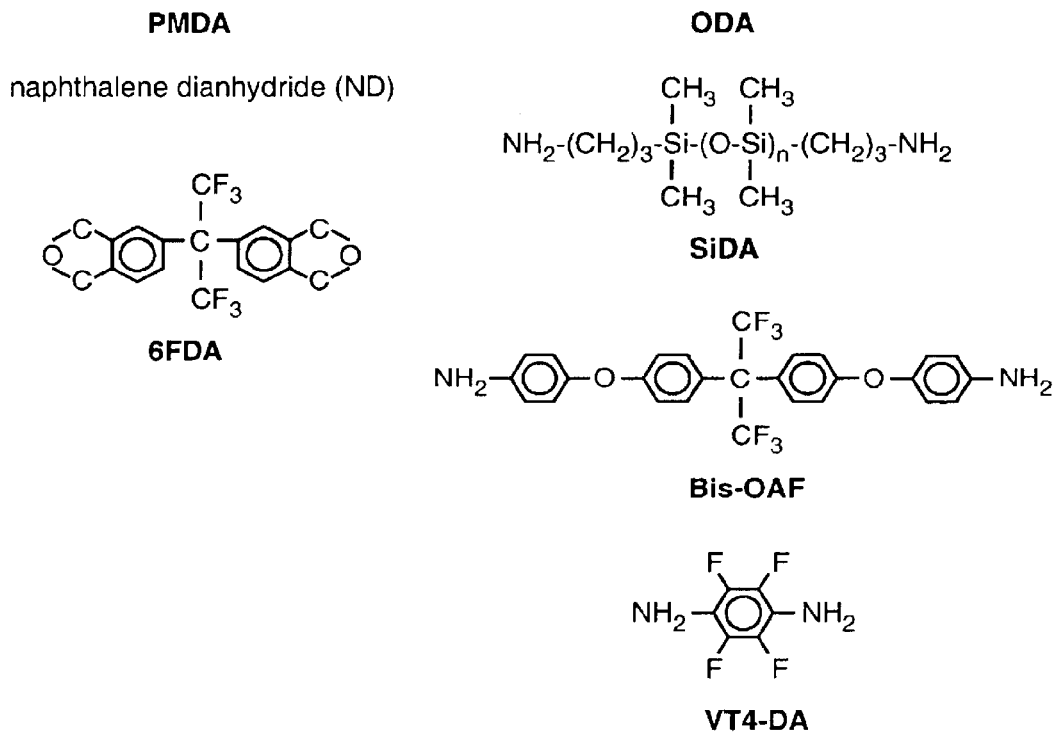
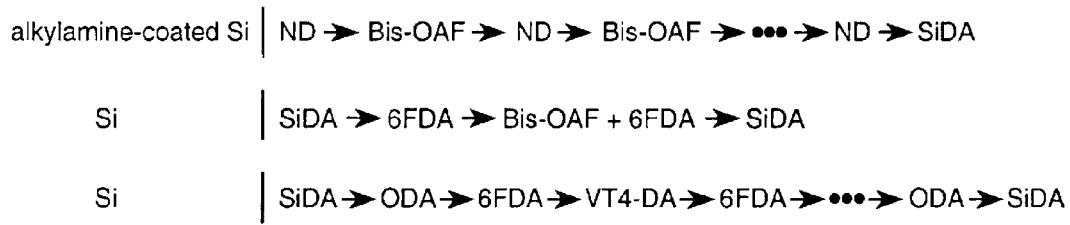
FIG._86CC

Process Flow of the Resist-free Electroplated Solder Reflow Process
1. Masking
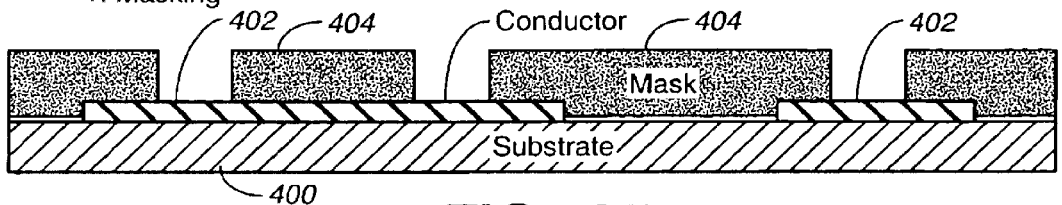
FIG._87
Process Flow of the Resist-free Electroplated Solder Reflow Process
2. Electroplating Solder
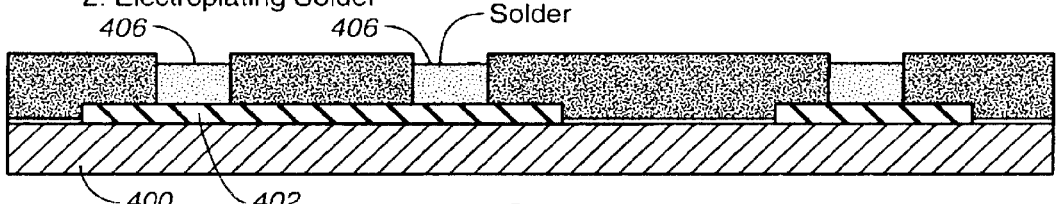
FIG._88
Process Flow of the Resist-free Electroplated Solder Reflow Process
3. Mask Strip
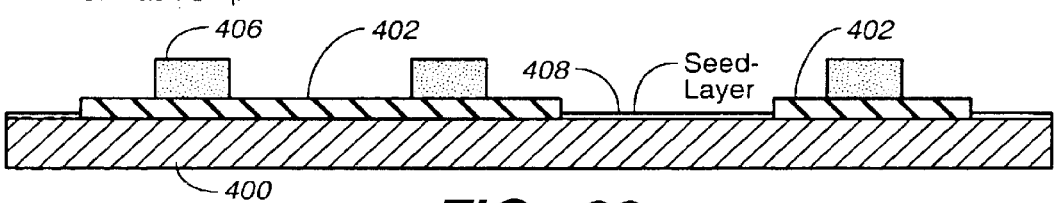
FIG._89
Process Flow of the Resist-free Electroplated Solder Reflow Process
4. Seed Etch
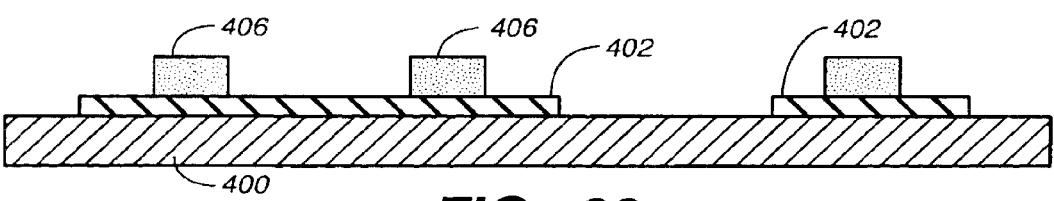
FIG._90

Process Flow of the Resist-free Electroplated Solder Reflow Process
5. Fluxing
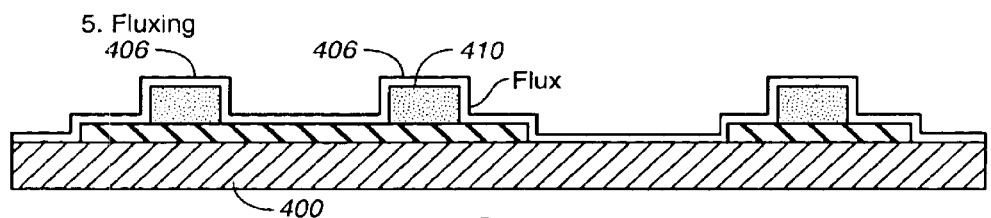
FIG._91
Process Flow of the Resist-free Electroplated Solder Reflow Process
6. Reflow
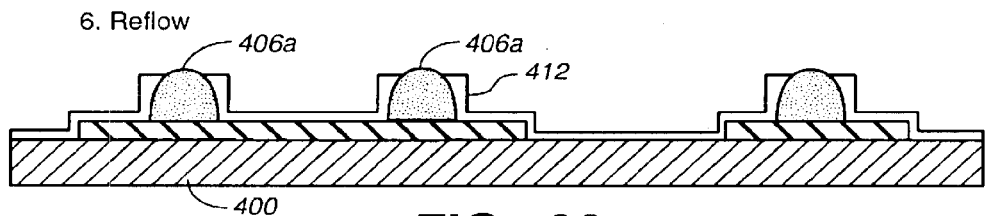
FIG._92
Process Flow of the Resist-free Electroplated Solder Reflow Process
7. Flux Cleaning
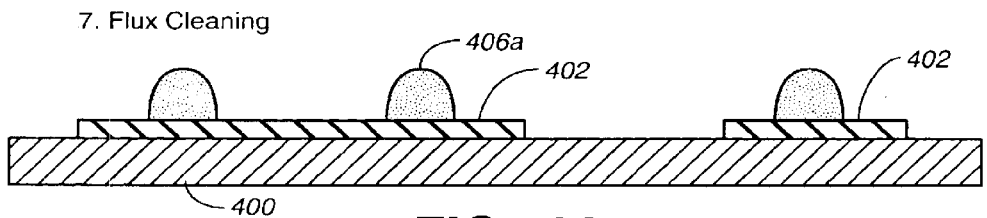
FIG._93

Geometric Dimensions of
the Electroplated Bumps
Top View

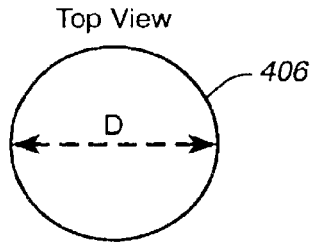

FIG._94

Geometric Dimensions of
the Electroplated Bumps
Top View

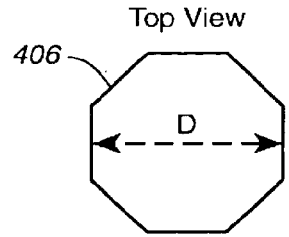

FIG._95

Geometric Dimensions of
the Electroplated Bumps
Side View

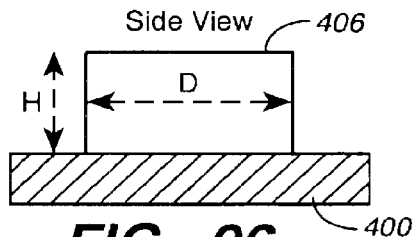

FIG._96

Geometric Dimensions of
the Electroplated Bumps
Side View

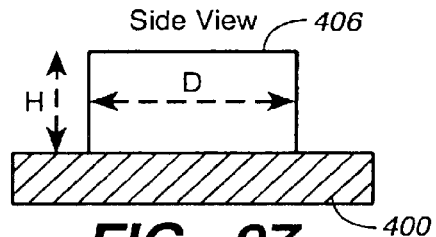

FIG._97

Geometric Shape Change of Electroplated
Solder Bumps by Reflow Process
Before Reflow

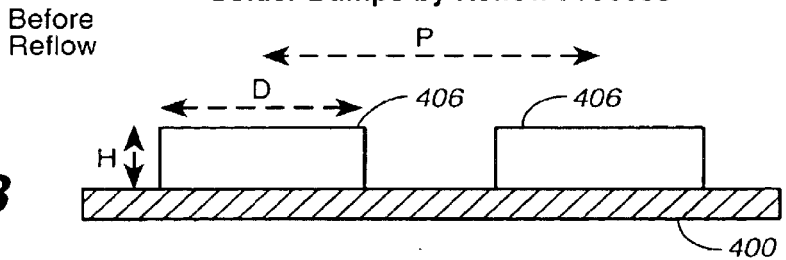

FIG._98

Geometric Shape Change of Electroplated
Solder Bumps by Reflow Process
After Reflow

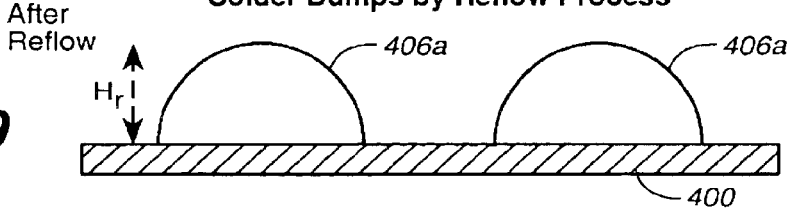

FIG._99

Schematic Drawing of Bridged Bumps
Bridged Bumps

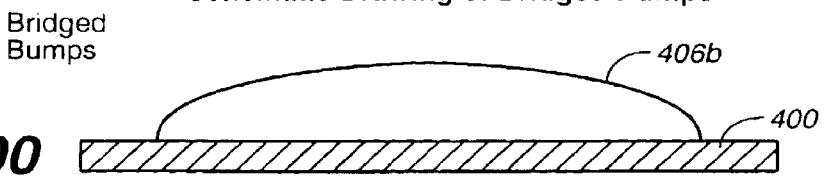

FIG._100

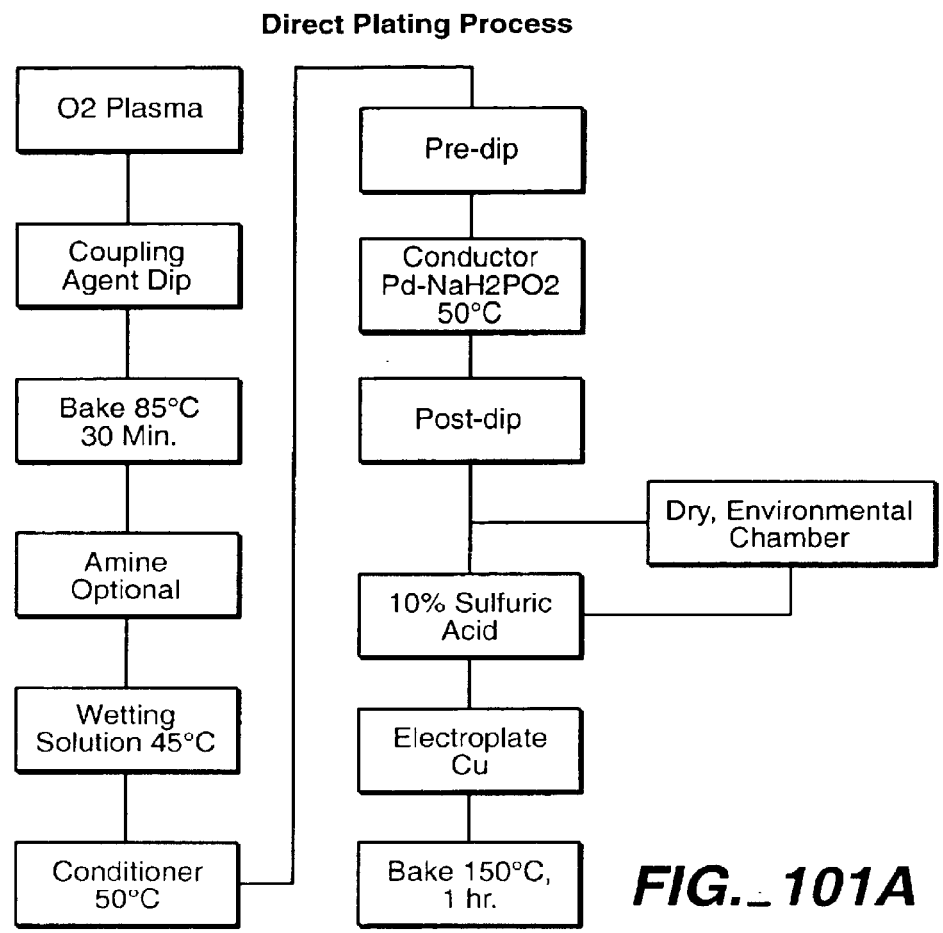
FIG._101A
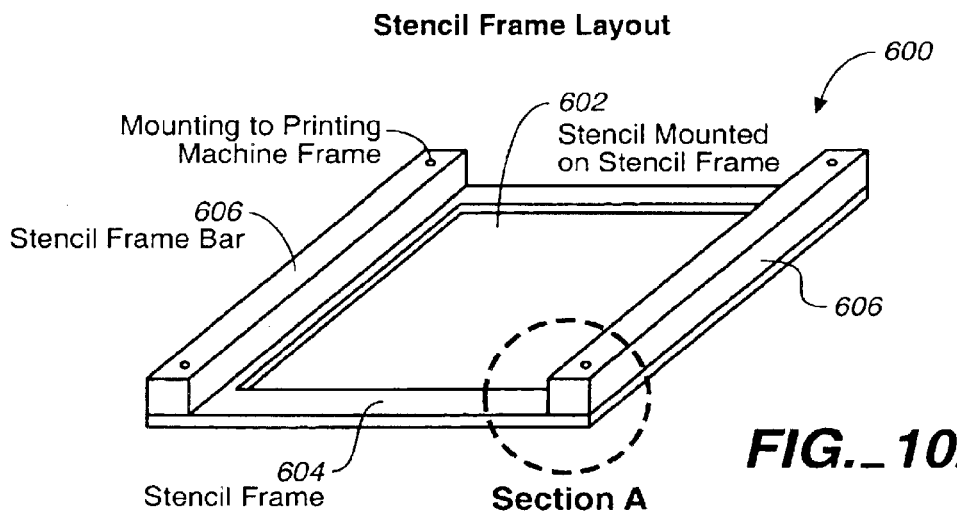
FIG._102

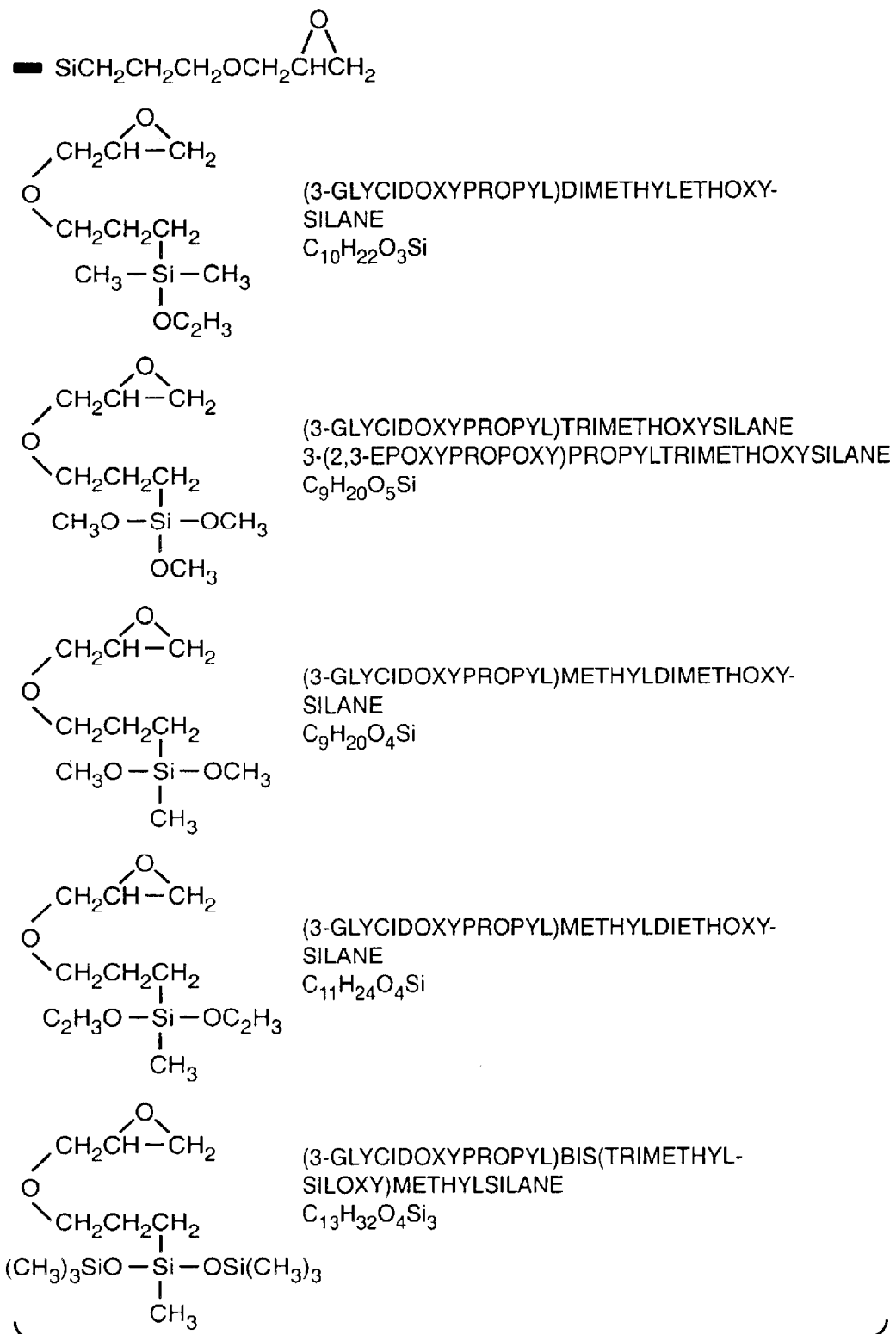
FIG._101B-1

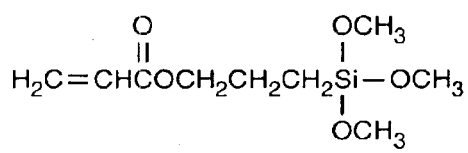 (3-ACRYLOXYPROPYL)TRIMETHOXY-SILANE, 95% $C_9H_{18}O_5Si$
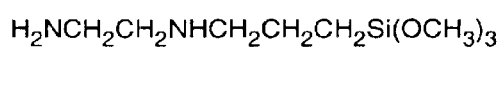 N-(2-AMINOETHYL)-3-AMINOPROPYLTRI-METHOXYSILANE $C_8H_{22}N_2O_3Si$
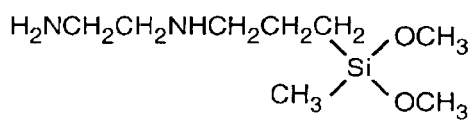 N-(2-AMINOETHYL)-3-AMINOPROPYLMETHYL-DIMETHOXYSILANE $C_8H_{22}N_2O_2Si$
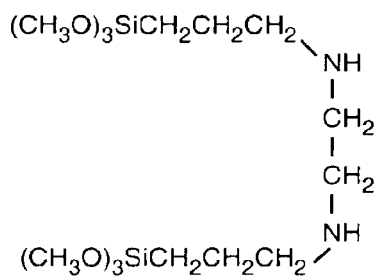 BIS(3-TRIMETHOXYSILYL)PROPYL]-ETHYLENEDIAMINE, $C_{14}H_{36}N_2O_6Si_2$
FIG._101B-2

Section View of Stencil Frame Components
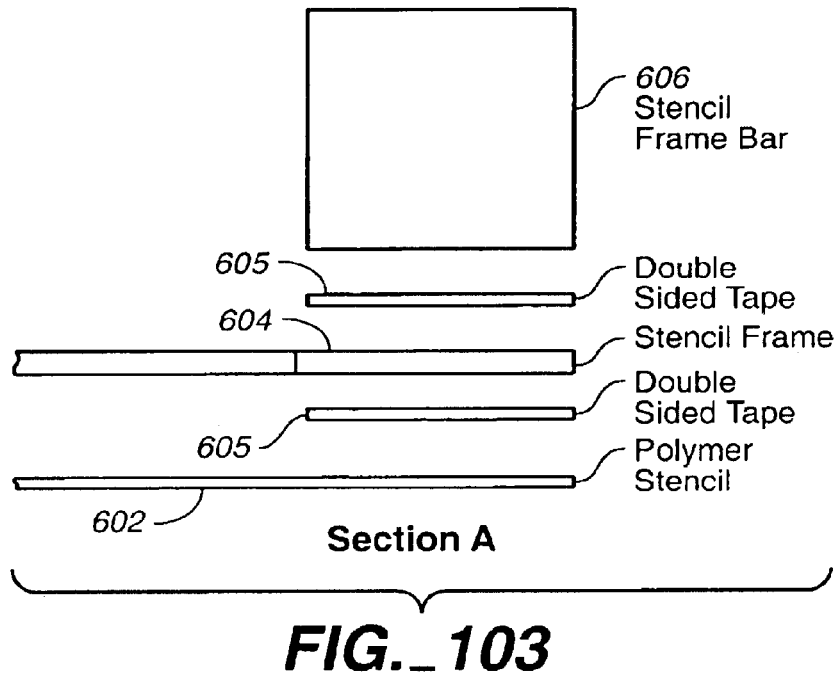
FIG._103
Tapped Hole in Stencil Frame Bar
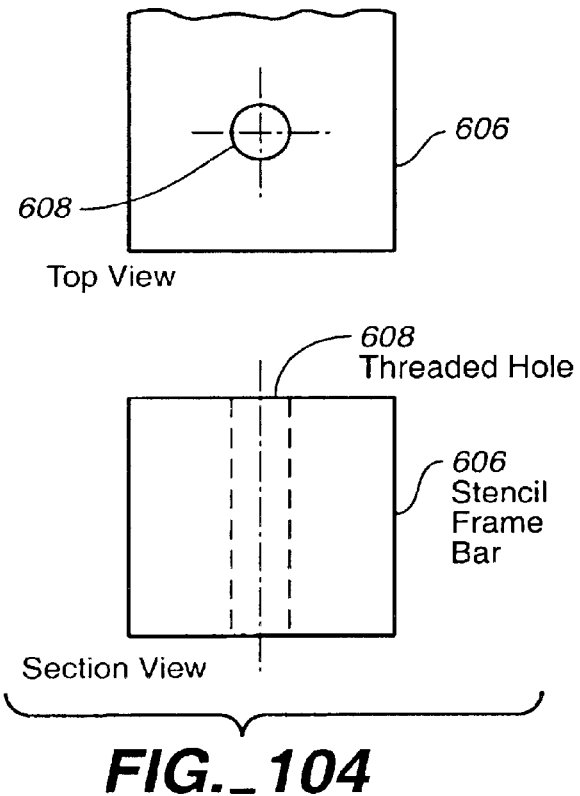
FIG._104

Traditional Joining
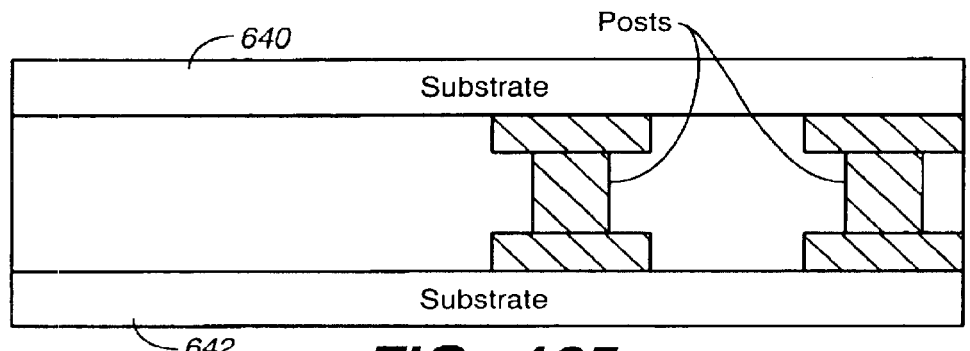
FIG._105
Alignment and Holding Using Long Pin
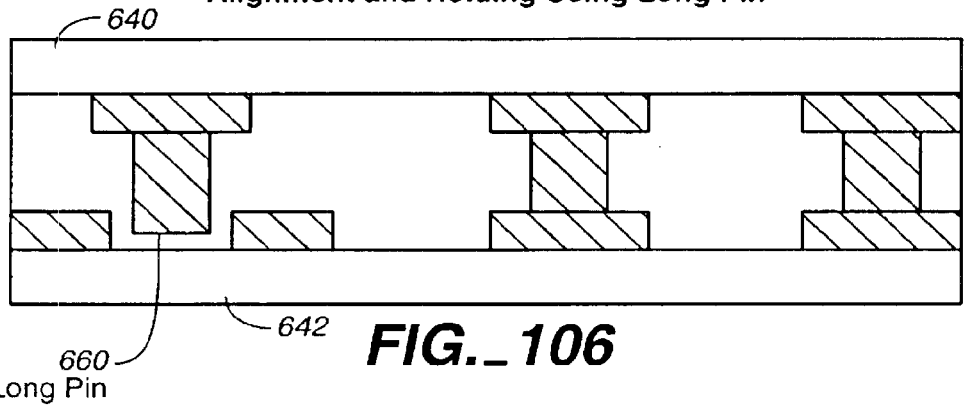
FIG._106
Alignment and Holding Using Thick Pads
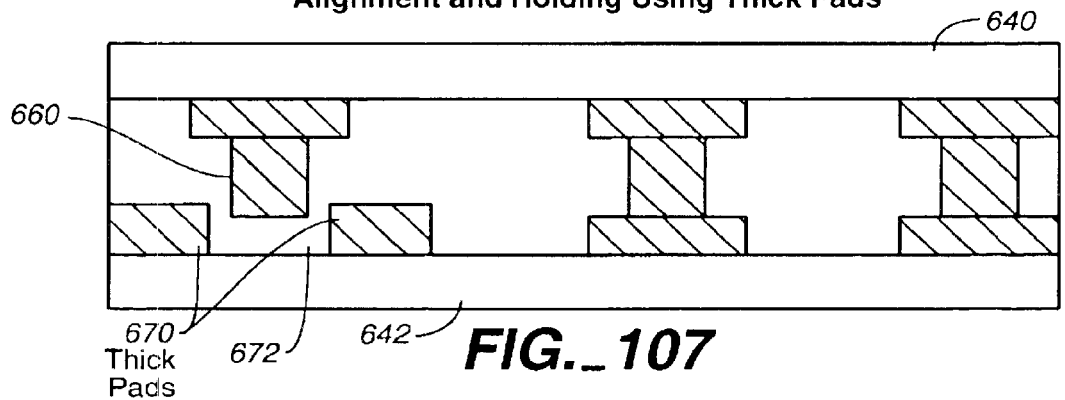
FIG._107

Build-up Process for Long Pin
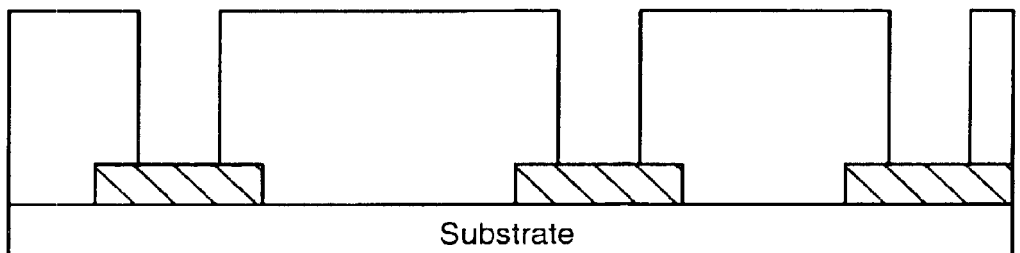
FIG._108
Build-up Process for Long Pin
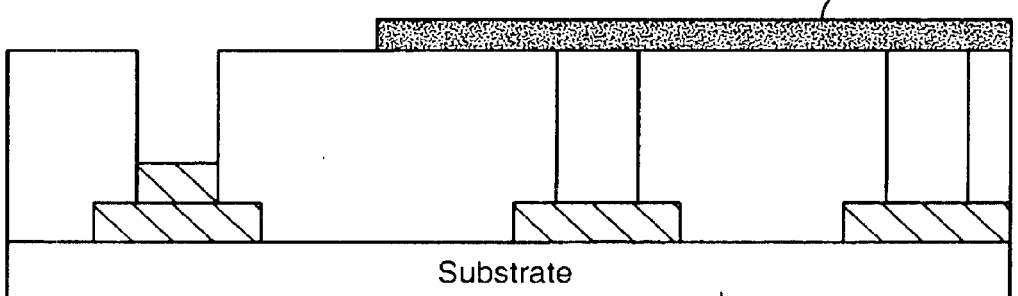
FIG._109
Build-up Process for Long Pin
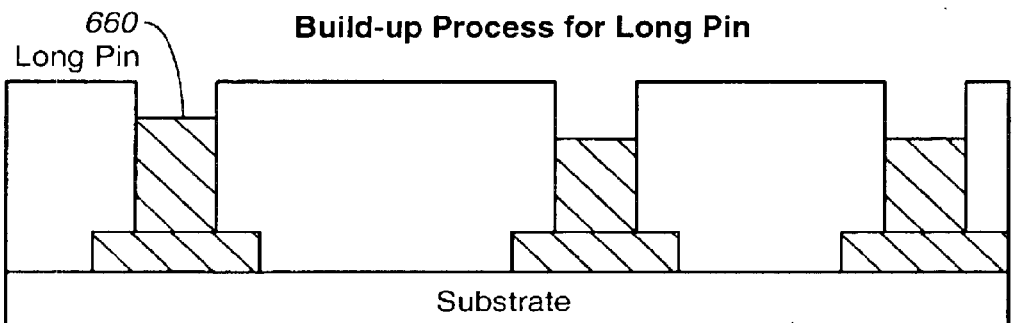
FIG._110
Another Build-up Process for Long Pin
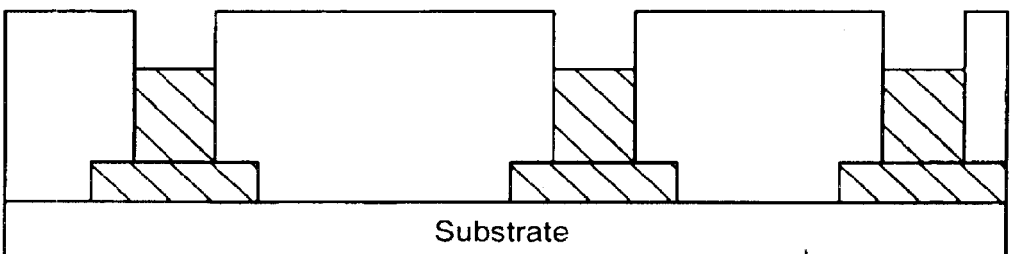
FIG._111

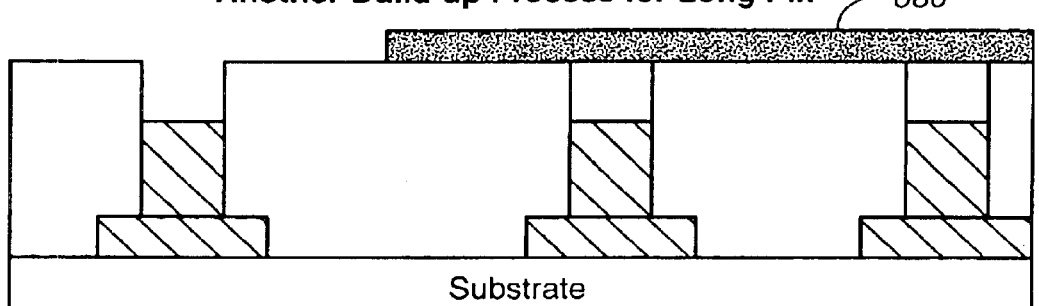
FIG._112
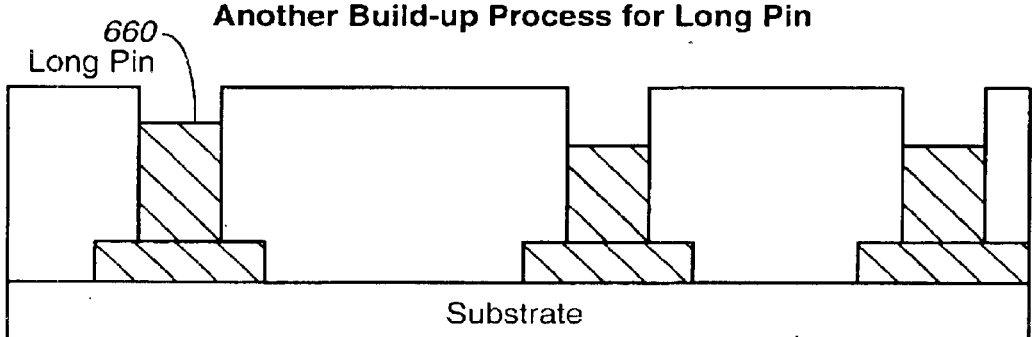
FIG._113
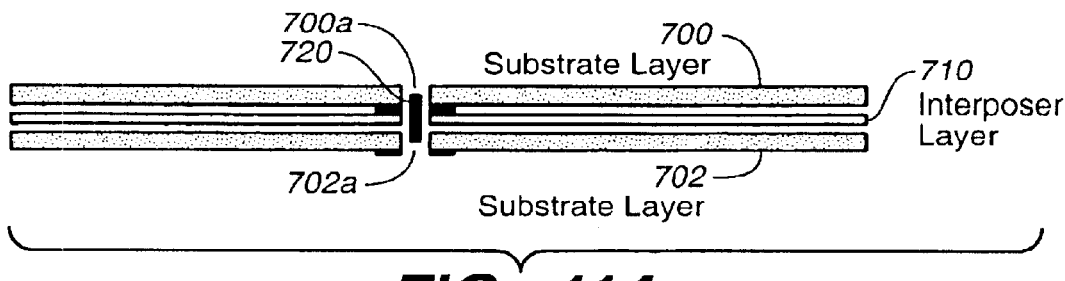
FIG._114
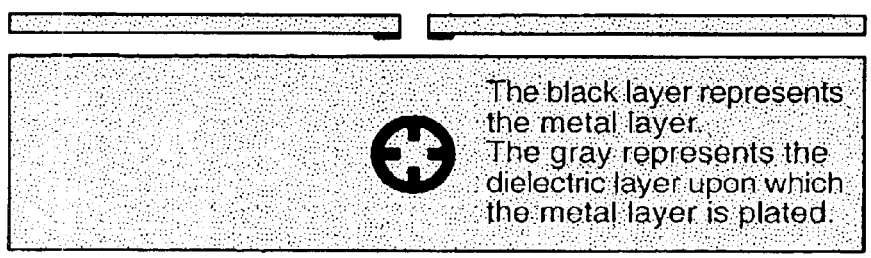
The black layer represents the metal layer.
The gray represents the dielectric layer upon which the metal layer is plated.
FIG._115

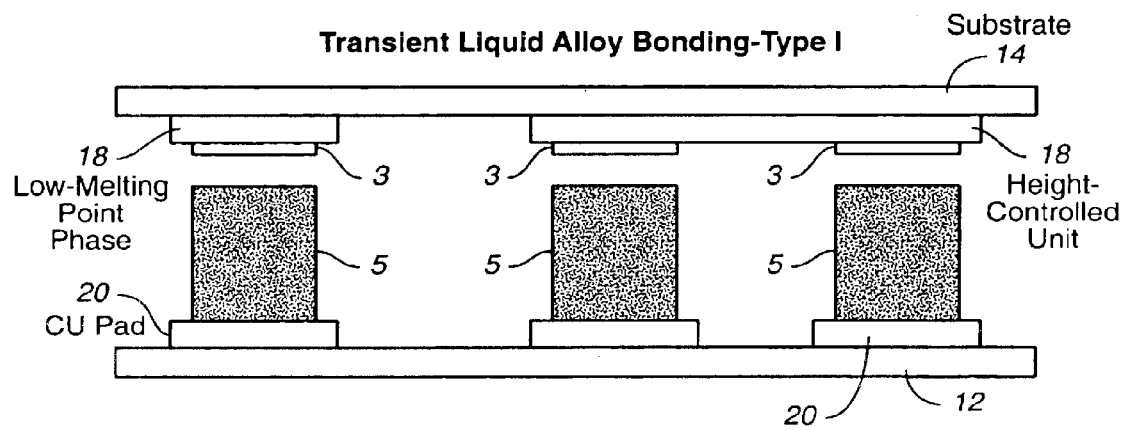
FIG._116
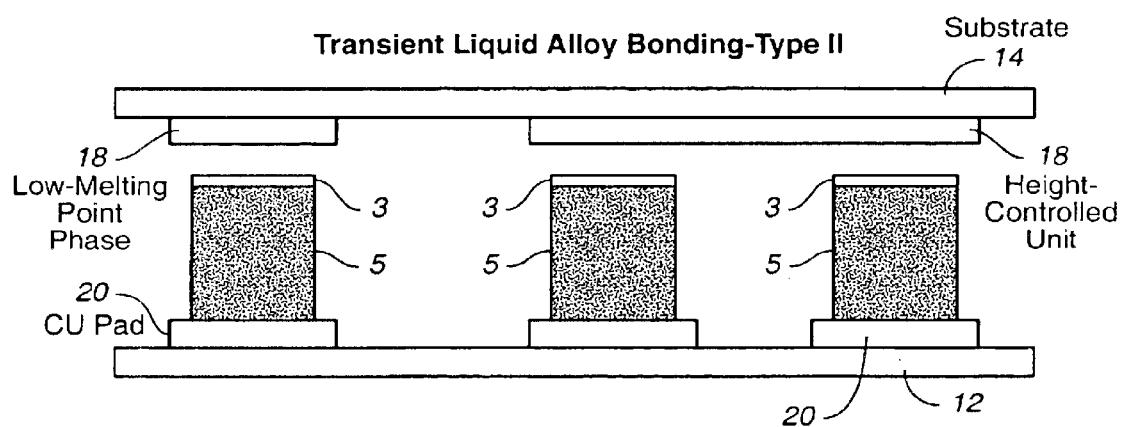
FIG._117

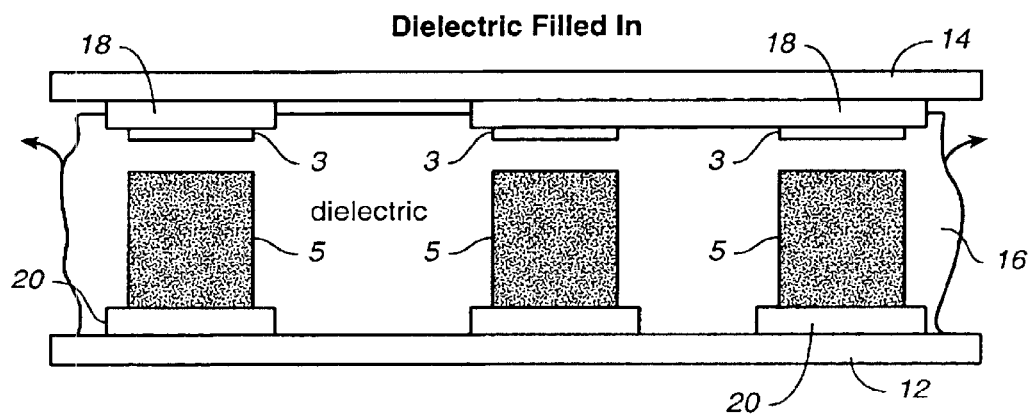
FIG._118
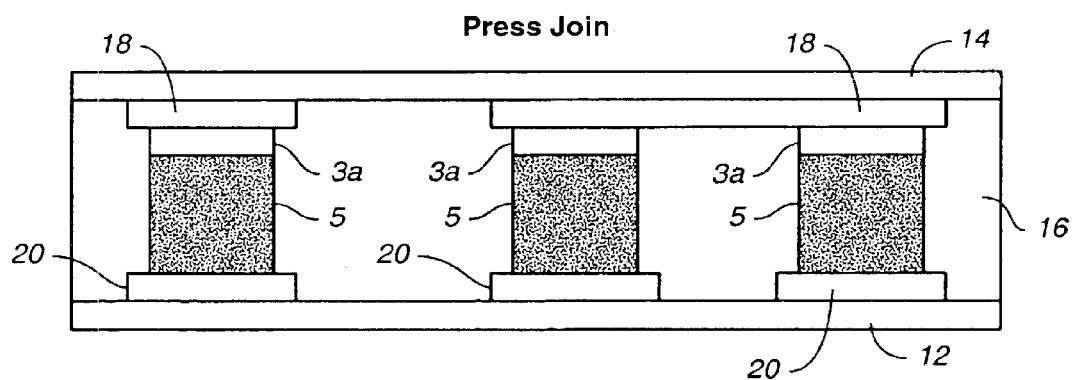
FIG._119

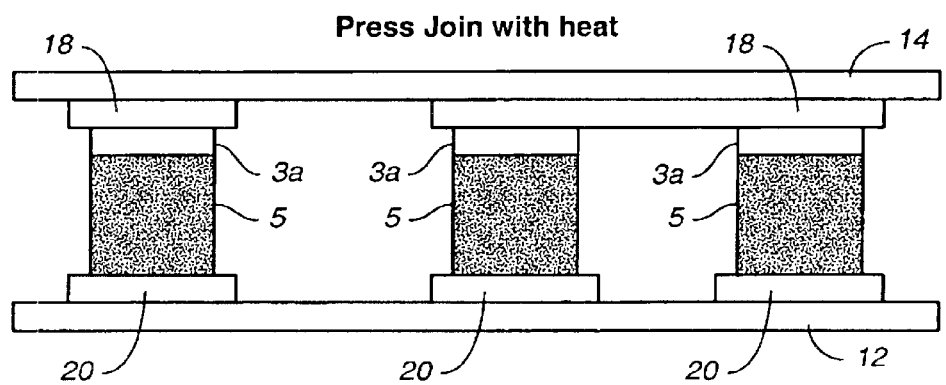
FIG._120
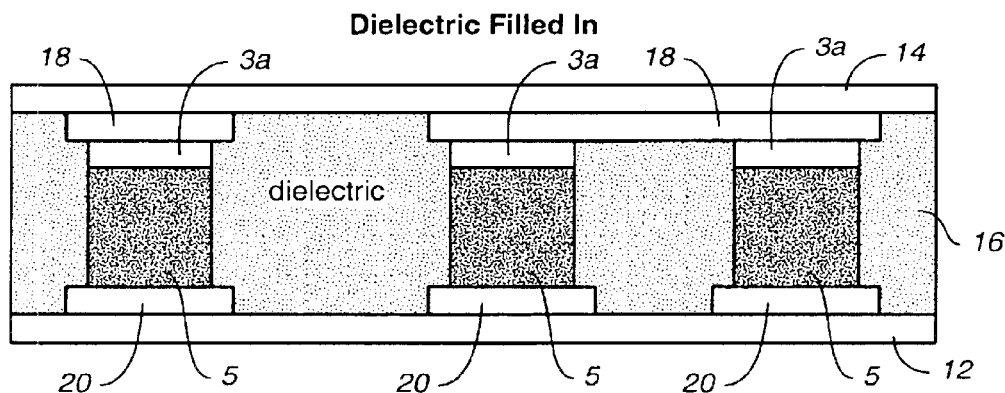
FIG._121

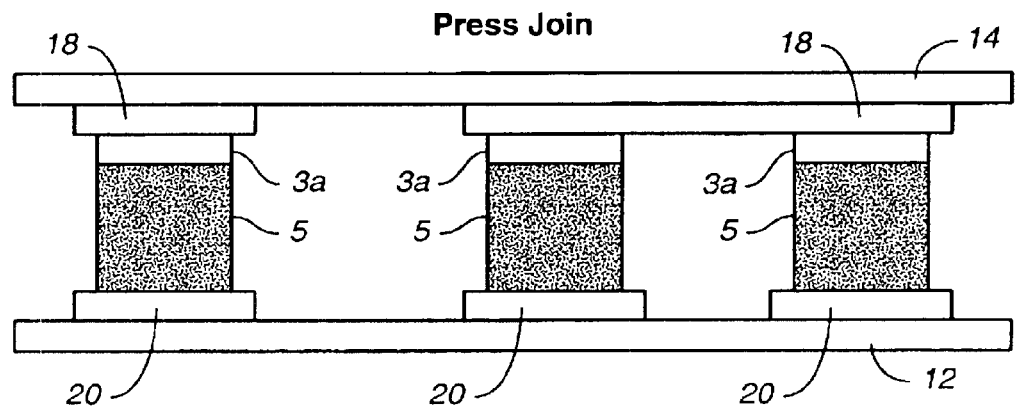
FIG._122
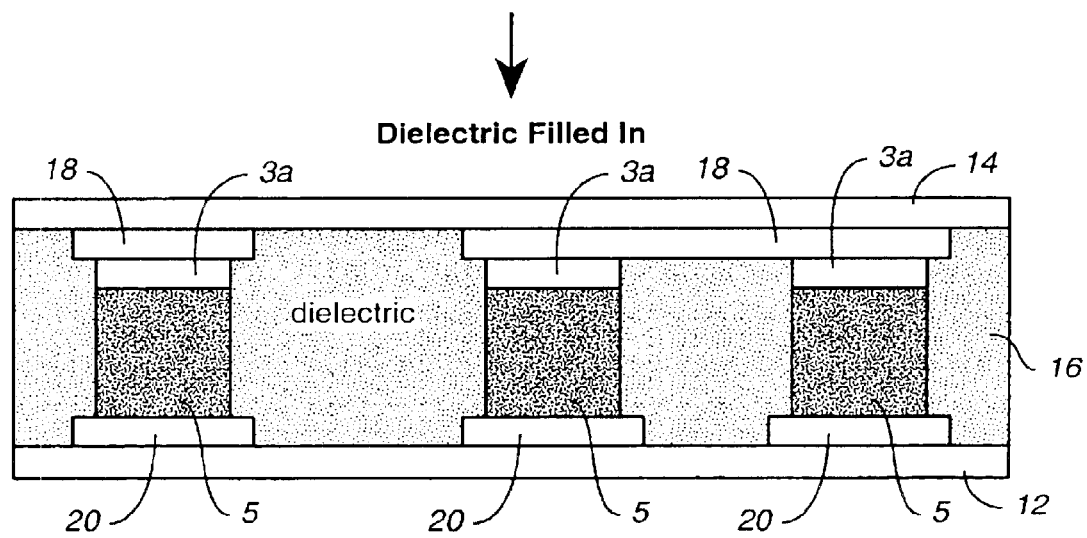
FIG._123

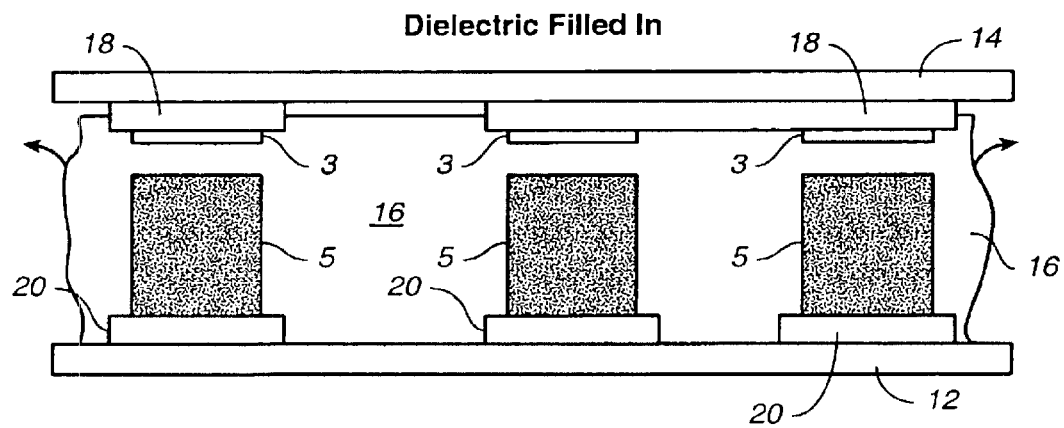
FIG._124
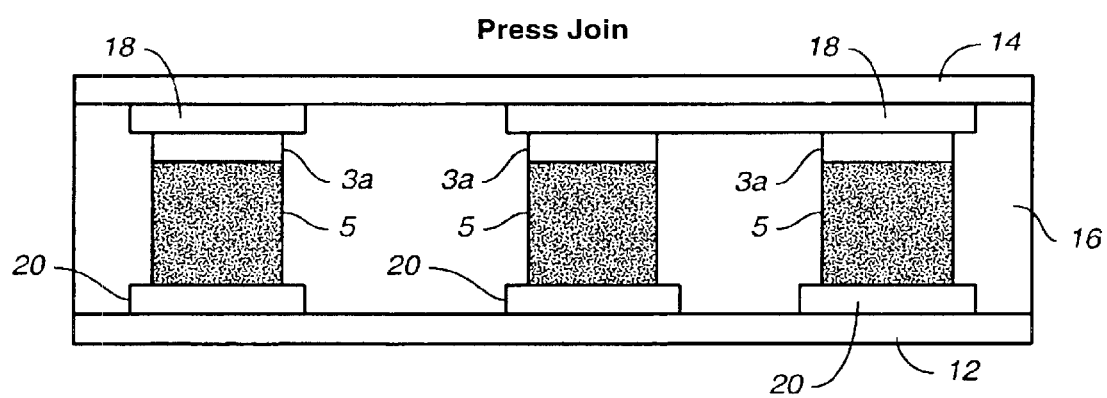
FIG._125

METHOD FOR JOINING CONDUCTIVE STRUCTURES AND AN ELECTRICAL CONDUCTIVE ARTICLE

This application is a continuation-in-part application of copending applications having Ser. No. 09/757,364, filed Jan. 8, 2001, and Ser. No. 09/962,783, filed Sep. 24, 2001. Benefit of all earlier filing dates is claimed for all common subject matter.

BACKGROUND OF THE INVENTION

1. Field of the Invention

This invention is related to joining of semiconductor substrates. More specifically, the present invention provides an interconnect structure and method for joining or coupling together substrates employing transient liquid alloy bonding.

2. Description of the Prior Art

A patentability investigation was conducted and the following U.S. Patents were discovered: U.S. Pat. No. 5,334,804 to Love et al.; U.S. Pat. No. 5,374,344 to Gall et al.; U.S. Pat. No. 5,374,469 to Hino et al.; U.S. Pat. No. 5,384,690 to Davis et al.; U.S. Pat. No. 5,421,507 to David et al.; U.S. Pat. No. 5,432,998 to Galasco et al.; U.S. Pat. No. 5,509,196 to Davis et al.; U.S. Pat. No. 5,620,782 to Davis et al.; U.S. Pat. No. 5,736,679 to Kresge et al.; U.S. Pat. No. 5,376,403 to Capote et al.; U.S. Pat. No. 5,128,746 to Pennisi et al.; U.S. Pat. No. 5,232,532 to Hori; U.S. Pat. No. 5,157,828 to Coques et al.; U.S. Pat. No. 5,187,123 to Yoshida et al.; U.S. Pat. No. 5,839,188 to Pommer; and U.S. Pat. No. 5,842,273 to Schor.

U.S. Pat. No. 5,334,804 to Love et al. discloses an interconnect structure for connecting an integrated circuit (IC) chip to a supporting substrate. The supporting substrate serves to communicate signals between the IC chip and the "outside world," such as other IC chips. In one embodiment, the interconnect structure is disclosed as comprising an interconnect substrate having a first post disposed on one of its surfaces and a second post disposed on another of its surfaces. One post is for contacting the IC chip and the other is for contacting the major substrate. Each post includes an elongated body having top and bottom ends, with the bottom end being mounted to one of the substrate surfaces and the top end having a substantially flat surface which is substantially co-planer with the substrate surface. The interconnect substrate of U.S. Pat. No. 5,334,804 to Love et al. further includes a device for de-concentrating the mechanical stain present at one or both of the top and bottom ends of each post. The first and second posts are electrically coupled to one another so that an electrical signal may pass from IC chip to the supporting substrate, and vice-versa.

U.S. Pat. No. 5,374,344 to Gall et al. discloses parallel processors, and more particularly, parallel processors having a plurality of printed circuit cards and/or boards, e.g., dedicated printed circuit cards and/or boards, for carrying processors, memory, and processor/memory elements. The printed circuit cards and/or boards are mounted on a plurality of circuitized flexible substrates, i.e., flex strips. The circuitized flexible substrates connect the separate printed circuit boards and cards through a relatively rigid central laminate portion. This central laminate portion provides means, e.g., Z-axis means, for inter-processor, inter-memory, inter-processor/memory element, and processor to memory bussing interconnection and communication. U.S. Pat. No. 5,374,344 to Gall et al. also discloses parallel processor systems having a plurality of individual processors, e.g., microprocessors, and a plurality of memory modules. The processors and the memory can be arrayed in one of several interconnection topologies, e.g., an SIMD (single instruction/multiple data) or an MIMD (multiple instruction/multiple data).

U.S. Pat. No. 5,374,469 to Hino et al. discloses a flexible printed substrate imparted with an adhesive property for loading on an external substrate, a double printed substrate having formed on both surfaces thereof a metal layer or a wiring circuit. The flexible printed substrate comprises an insulating resin layer including a low-linear expansion polyimide resin layer and a thermoplastic polyimide resin layer, and a metal layer or a wiring circuit formed on the low-linear expansion polyimide resin layer of the insulating resin layer, wherein a mixed region of the polyimide resin components is formed in the interface between the low-linear expansion polyimide resin layer and the thermoplastic polyimide resin layer.

U.S. Pat. No. 5,421,507 to Davis et al. discloses a method of simultaneously laminating circuitized dielectric layers to form a multilayer high performance circuit board and making interlevel electrical connections. The method selects two elements which will form an eutectic at one low temperature and will solidify to form an alloy which will only remelt at a second temperature higher than any required by any subsequent lamination. The joint is made using a transient liquid bonding technique and sufficient Au and Sn to result in a Au-Sn 20 wt % eutectic at the low temperature. Once solidified, the alloy formed remains solid throughout subsequent laminations. As a result, a composite, multilayer, high performance circuit board is produced, electrically joined as selected lands by the solid alloy.

U.S. Pat. No. 5,432,998 to Galasco et al. discloses a method of laminating circuitized polymeric dielectric panels with pad to pad electrical connection between the panels. This pad to pad electrical connection is provided by a transient liquid phase formed bond of a joining metallurgy characterized by a non-eutectic stoichiometry composition of a eutectic forming system. The eutectic temperature of the system is below the first thermal transition of the polymeric dielectric, and the melting temperature of the joining metallurgy composition is above the first thermal transition temperature of the polymeric dielectric.

U.S. Pat. Nos. 5,384,690, 5,509,196 and 5,620,782, all to Davis et al. disclose a parallel processor packaging structure and a method for manufacturing the structure. The individual logic and memory elements are on printed circuit cards. These printed circuit boards and cards are mounted on or connected to circuitized flexible substrates extending outwardly from a laminate of the circuitized, flexible substrates. Intercommunication is taught as being provided through a switch structure that is implemented in the laminate. The circuitized flexible substrates connect the separate printed circuit boards and cards through the central laminate portion. This laminate portion provides XY plane and Z-axis interconnection for inter-processor, inter-memory, inter-processor/memory element, and processor to memory bussing interconnection and communication. Lamination of the individual subassemblies is accomplished with a low melting adhesive that is chemically compatible with and bondable to the perfluorocarbon polymer between the subassemblies in the regions intended to be laminated, and, optionally, a high melting mask that is chemically incompatible with and not bondable to the perfluorocarbon polymer between the subassemblies in the regions not intended to be laminated. The subassembly stack is heated to selectively effect adhesion and lamination in areas thereof intended to be laminated while avoiding lamination in areas not intended to be laminated.

U.S. Pat. No. 5,736,679 to Kresge et al. discloses a through-hole interconnect for connecting a power plane conductor to a through-hole which includes a central pad connected to the through-hole and a deformable hinge that connects the central pad with the power plane conductor in a multilayer circuit board. The central pad and hinge are defined by a non-continuious area removed from the plane conductor. During a compression process to join the core assemblies, deformation of the hinge advantageously absorbs the shear forces and allows the power plane beyond the hinge to remain substantially planar. The resulting multilayer laminated circuit board includes a plurality of cores laminated together in a stacked configuration and a plurality of plated through-holes defined in the multilayer laminated circuit board, each of which is connected to a plane conductor by a hinge deformed so that the interconnect area is aligned outside of a plane defined by the plane conductor. U.S. Pat. No. 5,736,679 to Kresge et al. also discloses and teaches that the hinged interconnect avoids shearing problems and thereby improves the reliability of the connection between the through-hole and the power plane, increasing the manufacturing yield and reducing costs.

U.S. Pat. No. 5,376,403 to Capote et al. discloses electrically conductive compositions which contain metal and solder in addition to polymer forming constituents. A technique is described for eliminating voids in bonding a chip to a flexible substrate. A flexible pad or paper is connected to the underside of the flexible substrate, which will deform during bonding and allow air to flow out of the liquid adhesive before it cures and hardens. The adhesive used to bond the chip to the flexible substrate is liquid or paste (not bonding film or sheet) and the objective is air bubble elimination during bonding.

U.S. Pat. No. 5,128,746 to Pennisi et al. teaches a flux containing polymer forming composition. The flux forming constituent is disclosed as an acid selected from the group consisting of abietic acid, adipic acid, ascorbic acid acrylic and, citric acid, and malic acid.

U.S. Pat. No. 5,232,532 to Hori describes a technique for eliminating voids in bonding of a chip to a flexible substrate. The goal is to use flexible pad or paper underneath the flexible substrate, which will deform during bonding and allow air to flow out of the liquid adhesive before it cures and hardens.

U.S. Pat. No. 5,127,828 to Coques et al. describes use of an adhesive loop between a substrate and a support so that a partial vacuum may be applied to the space between the substrate and the support. The objective is to have uniform squeezing of adhesive and therefore uniform spacing between the substrate and the support after the adhesive is cured.

U.S. Pat. No. 5,187,123 to Yoshida et al. describes a void free adhesive layer in bonding of a semiconductor device to a lead frame. The main area of adhesive application is the back side of the die. There is no metal connection between the semiconductor device and the lead frame. The adhesive is applied in liquid or paste form in several pre-arranged spots, so as to prevent formation of voids during semiconductor device attachment onto a lead frame.

U.S. Pat. No. 5,839,188 to Pommer discloses the use of non-conductive particles (i.e., "gauge" particles) to provide a uniform gap or separation between two or more substrates, and the use of conductive pastes of copper post/tin to form an electrical interconnection.

U.S. Pat. No. 5,842,273 to Schor discloses the use of a conductive adhesive to from an electrical connection between substrates. The adhesive is an elastomeric thermoset with conductive particles, flakes, etc. No solder is used. Electrical connection is primarily through metal contact.

Conventional underfill process, such as that disclosed in the foregoing prior art, for flip chip to substrate joining is limited to very small joining areas (typically 1-inch by 1-inch area or less). Substrate buildup is expensive. As the requirements of high density substrates increase, a simple and reliable interconnection process is needed to fulfill this demand. For typical solder printing methods, there is a limitation on the size of solder bumps, and the yield will be low for fine-pitch small bumps. Furthermore, joints will be less reliable on micro-bumps. It is desirable to have an interconnect reliable process that may be easily down-sized to the dimension of HDI substrates. Therefore, what is needed and what has been invented is an economical method that can provide the foregoing requirements by employing an insertion structure and a transient liquid alloy bonding. What is also needed and what has been invented is a method for bonding or coupling together conductive structures through transient liquid alloy bonding.

SUMMARY OF THE INVENTION

The present invention provides a method for bonding conductive structures comprising compressing a thin layer of metal between one end of a conductive post and a conducting structure; transforming the thin layer of metal into a bonding layer having a melting temperature higher than the melting temperature of the thin layer of metal; and bonding the conductive post and the conducting structure together via the bonding layer. A dielectric material may be deposited around the conductive post. The thin layer of metal may comprise a material selected from the group consisting of In, Sn/Pb eutectic solder, Sn, Bi, and mixtures thereof. An electrically conductive article is formed. The electrically conductive article comprises the conductive post, the conductive structure, and the bonding layer disposed between the conductive structure and the conductive post. The bonding layer has a melting temperature substantially higher than a melting temperature of a bonding layer precursor which was disposed on an end of the conductive post and/or on the conductive structure and provided the genesis for the bonding layer.

Further aspects of embodiments of the present invention provide a method for producing an assembly of substrates comprising disposing a thin layer of metal on a conducting structure coupled to a first substantially planar substrate, and dispensing a liquid polymeric material between the conducting structure and a second substantially planar substrate which supports a conductive post. The liquid polymeric material is disposed inwardly from the edges of the first and the second substrate such that by pressing the liquid polymeric material between the first and the second substrates, the liquid polymeric material flows towards the edges of the first substrate and the second substrate. The method also includes compressing the thin layer of metal between an end of the conductive post and the conducting structure, transforming the thin layer of metal into a bonding layer having a melting temperature higher than the melting temperature of the thin layer of metal, and bonding the conductive post and the conducting structure together via the bonding layer. The method further also includes curing the liquid polymeric material. The liquid polymeric material comprises a polymer fluxing agent which may comprise a beta phenylacid and/or a beta phenylhydroxyacid. The beta phenylacid is selected from the group consisting of beta phenyacetic acid, beta phenylacetic acid, beta phenylacrylic acid, beta phenylcrotonic acid, and mixtures thereof. The liquid polymeric material preferably comprise from about 15% by weight to about 70% by weight of a polymeric resin, from about 15% by weight to about 70% by weight of a curing agent, and from about 0.10% by weight to about 20% by weight of a fluxing agent.

Embodiments of the present invention provide a method for producing an assembly of substrates comprising disposing a thin layer of metal on an end of a conductive post attached to a first substantially planar substrate, and dispensing a liquid polymeric material between a conducting structure on a second substantially planar substrate and the first substantially planar substrate. The liquid polymeric material is disposed inwardly from the edges of the first and the second substrates such that when the liquid polymeric material is compressed between the first and the second substrates, the liquid polymeric material flows towards the edges of the first and the second substrates. The method also comprises compressing the thin layer of metal between the end of the conductive post and the conducting structure, transforming the thin layer of metal into a bonding layer having a melting temperature higher than the melting temperature of the thin layer of metal, and bonding the conductive post and the conducting structure together via the bonding layer.

The present invention further provides a method for producing an assembly of substrates comprising dispensing a liquid polymeric material between a conducting surface, on a first substantially planar substrate and a conducting surface on a second substantially planar substrate. The liquid polymeric material is preferably disposed inwardly from the edges of the first substrate and the second substrate; The method further includes pressing the liquid polymeric material between the first substrate and the second substrate so that the liquid polymeric flows towards the edges of the first substrate and the second substrate; and curing the liquid polymeric material. The conducting surface on the first substrate is placed in contact with the conducting surface on the second substrate after pressing the liquid polymeric material between the first substrate and the second substrate. In another embodiment of the invention the liquid polymeric material is dispensed on dies present on the first or second substrate. Preferably at least one of the substrates has a planar surface area of at least 36 sq. inches, such as a dimension of from about 6 inches to about 6 inches.

The conducting surface of one of the planar substrates includes a solder bump which may or may not have a solder material fluxing agent. The liquid polymeric material comprises from about 15% by weight to about 70% by weight of a polymeric resin, from about 15% by weight to about 70% by weight of a curing agent, and from about 0.10% by weight to about 20% by weight of a polymer fluxing agent. The polymer fluxing agent comprises a beta phenylacid and/or a beta phenylhydroxyacid. The beta phenylacid is selected from the group consisting of beta phenylacetic acid, beta phenylacrylic acid, beta phenylcrotonic acid, and mixtures thereof.

The present invention also further provides a polymeric composition comprising from about 15% by weight to about 70% by weight of a polymeric resin, from about 15% by weight to about 70% by weight of a curing agent, and from about 0.10% by weight to about 20% by weight of a fluxing agent. The present invention also further provides an assembly of substrates comprising a lower substrate; a polymeric composition disposed on the lower substrate; and an upper substrate disposed on the polymeric composition which comprises from about 15% by weight to about 70% by weight of a polymeric resin, from about 15% by weight to about 70% by weight of a curing agent, and from about 0.10% by weight to about 20% by weight of a fluxing agent.

The present invention also further provides a method for forming an intermetallic region comprising depositing a dielectric layer on a circuitized layer having a conductive region; forming an aperture (e.g., by laser drilling) in the dielectric layer over the conductive region; and inserting a conductive body into the aperture, which produces a gap between a wall of the aperture and the conductive body. The conductive body comprises a main region and a depletion region which contacts the conductive region. The method further comprises forming an intermetallic region from the depletion region. The intermetallic region surrounds the sides and an end of the main region. The depletion region comprises tin and the main region comprises copper. The intermetallic region includes $Cu_3Sn$. In a preferred embodiment of the invention, the circuitized layer is a first circuitized layer and the conductive body is disposed on a second circuitized layer. The method also further comprises laminating the first circuitized layer and the second circuitized layer together. The gap between the wall of the aperture and the conductive body is preferably filled with a dielectric material. The gap may be filled by laminating the dielectric layer.

The present invention yet al.so further provides a conductive article comprising a first circuitized layer having a dielectric layer and a first conductive region; and a second circuitized layer having a dielectric layer and a second conductive region. A via structure is disposed between the first and second conductive regions. The via structure preferably comprises a main region and an intermetallic region disposed around the sides and around one end of the main region.

These provisions together with the various ancillary provisions and features which will become apparent to those skilled in the art as the following description proceeds, are attained by the methods for joining and the high density interconnect structures of the present invention, preferred embodiments thereof being shown with reference to the accompanying drawings, by way of example only, wherein:

BRIEF DESCRIPTION OF THE DRAWINGS

FIG. 1 is a vertical sectional view of a pair of spaced large substrates having the liquid polymer of the present invention supported by the lower substrate and in contact with the upper substrate prior to compressing the pair of spaced large substrates and causing the liquid polymer to flow (i.e. to squeeze flow) towards the perimetric edges of the lower and upper substrates;

FIG. 2 is the vertical sectional view of the pair of substrates of FIG. 1 after the substrates are joined together;

FIG. 3 is a top plan view of a lower substrate supporting a plurality of dies, with dispensed liquid polymer in the center of the lower substrate;

FIG. 4 is a top plan view of a lower substrate supporting a plurality of dies and dispensed liquid polymer disposed on each die;

FIGS. 5–10 illustrates a high density interconnect fabrication procedure employing an insertion joining process using transient liquid alloy bonding;

FIG. 11 is a side elevational view before lamination;

FIG. 12 is a side elevational view after lamination;

FIG. 13 is a SEM cross section micrograph HDI substrate fabricated from insertions of a joining process with transient liquid alloy bonding;

FIG. 14 is a detailed view of a single interconnect from FIG. 13;

FIG. 15 is a schematic drawing of the structure of the interconnect of FIG. 14;

FIG. 16 is a schematic of the intermetallic layer between Cu post at top substrate and Cu pad at bottom substrate;

FIGS. 17–21 illustrate a process for laminating together two substrates employing a depletion phrase deposited on each metal post;

FIG. 22 is a schematic of a device for the prevention of condensation on samples in a non-saturated temperature/humidity test chamber during a facility power outage;

FIGS. 23–25 illustrates a process for fabricating a low cost conformable heat sink;

FIGS. 26 is a side elevational view of prior art shorts between G and V layers due to pin holes and particles in a thin polyimide layer;

FIGS. 27–35 illustrate a process for fabricating Game V layers while preventing shorts therebetween;

FIGS. 36–42 illustrate a process for producing a super interposer structure;

FIGS. 43–46 illustrate the use of an external material (e.g., paper or cloth) to reduce burn when laser drilling through-holes in flexible substrates;

FIGS. 47–51 illustrate a procedure for isolating defects in dielectric layers;

FIGS. 52A–75 illustrate a plurality of procedures for coupling logic MCMs and memory stacks to a substrate;

FIGS. 76–83 illustrate a low-resistance anisotropic conductive film connections process;

FIGS. 84A–86CC illustrate a plurality of methods for fabricating insulator films;

FIGS. 87–100 illustrate process steps for conducting mask-free electroplated solder reflow;

FIGS. 101A and 101B illustrate procedures for Cu-direct staring of polymers;

FIGS. 102–104 illustrate a reusable stencil frame assembly;

FIGS. 105–113 illustrate a precision alignment and holding substrates to prevent slipping during lamination joining;

FIGS. 114 and 115 illustrate a multi-layer solderless interconnect;

FIG. 116 is a side elevational view of one embodiment of the transient liquid alloy bonding assembly;

FIG. 117 is a side elevational view of another embodiment of the transient liquid alloy bonding assembly;

FIG. 118 is a side elevational view of the assembly of FIG. 116 after filling with a dielectric;

FIG. 119 is a side elevational view of the assembly of FIG. 118 after the substrates have been coupled together through pressing;

FIG. 120 is a side elevational view of the assembly of FIG. 116 after the substrates were coupled together through press-joining with heat;

FIG. 121 is a side elevational view of the assembly of FIG. 120 after filling with a dielectric;

FIG. 122 is a side elevational view of the assembly of FIG. 117 after the substrates were coupled together through press-joining with heat;

FIG. 123 is a side elevational view of the assembly of FIG. 122 after filling with a dielectric;

FIG. 124 is a side elevational view of the assembly of FIG. 117 after filling with a dielectric; and FIG. 125 is a side elevational view of the assembly of FIG. 124 after the substrates have been coupled together through pressing.

DETAILED DESCRIPTION OF PREFERRED EMBODIMENTS OF THE INVENTION

Referring in detail now to the drawings, there is seen a substrate assembly, generally illustrated as 10, including a lower substrate 12, an upper substrate 14, and a polymer 16 (e.g., a liquid thermosetting polymer) disposed between lower and upper substrates 12 and 14. The lower substrate 12 and upper substrate 14 have conductor pads 20 and 18 respectively connected thereto. Solder bumps 19 are bound to conductor pads 18 for assisting in coupling together conductor pads 18 and 20. Substrates 12 and 14 respectively have edges 12a and 14a, and may be any suitable substrate (e.g., semiconductor or conductor substrates) selected from flexible substrates, rigid substrates, circuitized substrates, rigid wafers, circuit boards such as PCB or laminated circuit boards, or the like. The substrates 12 and/or 14 are preferably large substrates having a planar surface area equal to or larger than about thirty-six (36) square inches, such as when substrates 12 and/or 14 are dimensioned from about six (6) inches (or greater) to about six (6) inches (or greater).

The liquid polymer 16 may be dispensed concentrically on the lower substrate 12 and over a center die 24a, which is surrounded by a plurality of dies 24, all supported by the lower substrate 12 as best shown in FIG. 3. When the upper substrate 14 is lowered downwardly, the liquid polymer 16 is compressed and squeezed flowed outwardly towards the respective perimetric edges 12a and 14a of the lower substrate 12 and the upper substrate 14. In another embodiment of the present invention, the liquid polymer 16 is superimposed over each of the plurality of dies 24, as best shown in FIG. 4. When the upper substrate 14 is lowered downwardly, the respective disposed polymers 16 are compressed and squeeze flowed outwardly again towards respective perimetric edges 12a and 14a of the lower and upper substrates 12 and 14, respectively.

Therefore, recapitulating as depicted in FIG. 1, a measured amount of liquid polymer 16 is dispensed at specified location or locations on the lower substrate 12. The upper substrate 14 is lowered onto the lower substrate 12, during which it comes in contact with the dispensed polymer 16 and forces the same to move outwards through squeeze flowing. At completion of substrate joining (i.e., when conductor pads 18 and 20 are in contact for reflowing solder bumps 19 as seen in FIG. 2), the joined assembly 10 goes through a heating cycle, well known to those skilled in the art, to form electrically conducting joints 31 (i.e., the joining together of conductor pads 18 and 20 with the assistance of solder bumps 19) and to cure the polymer 16. As shown in FIG. 2, the polymer 16 after curing is an integral part of the joined assembly 10.

The polymer 16 of the present invention provides a semi-hermetic seal for electrically conducting joints and circuitry on substrate surfaces. The polymer 16 also provides stress relief during service. Temperature fluctuations can lead to stresses from coefficient of thermal expansion mismatch among components in the substrate assembly. The polymer 16 also defines a dielectric layer for isolating electrical signals between substrate circuitry. As previously indicated, the polymer 16 can be dispensed at the center region of the lower substrate 12, as shown in FIG. 3, or it can be dispensed individually at each die center, as shown in FIG. 4. When dispensed at the substrate center, the polymer 16 flows outward with a single flow front. For multiple point dispensing, a flow front exists for each dispensing location, which may eventually merge and form fewer flow fronts. Air bubbles may be entrapped when flow fronts merge and joining is done at ambient conditions. Joining under a vacuum environment can eliminate entrapped air bubbles. Single point dispensing is useful for smaller substrates, while multiple point dispensing offers better flow control over each die region in joining of very large area substrates.

Suitable material for solder bumps 19 may be metals, or single or multi-phase alloys. The alloys can be binary, ternary, or other higher order compositions. Examples include eutectic Pb/Sn and alloys comprised of In—Sn, Bi—Sn, In—Ag, Sn—Sb, Au—Sn, and Pb—Sn. More specific examples of solders include 52 In/48 Sn, 58 Bi/42 Sn, 97 In/3 Ag, In, 37 Pb/63 Sn, 96.5 Sn/3.5 Ag, 95 Sn/5 Sb, 80 Au/20 Sn, and 90 Pb/10 Sn (described in terms of weight percentages). The solder material may also include any material (e.g., a solder-material fluxing agent) suitable for removing oxides from the solder material for solder bumps 19. The solder-material fluxing agent may comprise an organic acid, and may be used in combination with a fluxing agent contained in the polymer 16 to remove oxides in and on the soldering material. Organic acids are preferred because they can have relatively high boiling points. Exemplary fluxing agents can include cinnamic acid, succinic acid, gluteric acid, adipic acid, pimelic acid, suberic acid, azelaic acid, adipic acid, sebacic acid, precursors and combinations thereof. The solder-material fluxing agent preferably comprises at least one of cinnamic acid, adipic acid or another acid which functions in a chemically similar manner or has a chemically similar structure. Furthermore, the solder-material fluxing agent can be in the solder material for solder bumps 19 in any suitable percentage, but can preferably constitute from about 0.1 to about 25 weight percent of the solder material.

The solder-material fluxing agent may be substantially non-volatile (e.g., does not boil or volatize in a substantial manner when the conductive composition is cured). In some embodiments, the solder-material fluxing agent may have a melting point of about 100° C., or more. The boiling or decomposition point of the solder-material fluxing agent, whichever is lower, may be greater than the lowest melting point (e.g., greater than about 10° C.) present among conductive particles within solder material for solder bumps 19. The selection of the particular fluxing agent may depend on the particular conductive material used in the solder material for solder bumps 19. For example, the solder-material fluxing agent may be cinnamic acid which has a melting point of about 133° C. and a boiling point of about 300° C. Suitable conductive particles which can be used with cinnamic acid include particles made of 37 Pb/63 Sn solder, which has a melting temperature of about 183° C.

The polymer 16 of the present invention preferably contains no metals, no conductive materials, and no solder materials (i.e., any of the materials that are contained in solder bumps 19). The polymer 16 of the present invention preferably also contains no non-conductive particulates, and preferably possesses fluxing capabilities; thus, the polymer 16 includes a fluxing agent. The polymer 16 functions for joining lower and upper substrates 12 and 14, as well as for providing a polymeric dielectric layer. The polymer 16 further preferably includes very low levels of ionic contaminants and low viscosity (e.g., a viscosity which allows the polymer 16 to flow under the polymeric temperatures of the present invention) so that the polymer 16 may flow around features on both lower and upper substrates 12 and 14. The polymer 16 preferably will not gel before electrically conductive joints 31 (i.e., solder bumps 19 coupling together conductor pads 18 and 20) are formed, and after postcure, the polymer 16 exhibits low dielectric constant, high temperature performance, good adhesion to substrate surfaces and components, and low moisture absorption.

The polymer 16 preferably fluxes oxides at metal surfaces, removes water generated from fluxing of oxides, immobilizes ionic species from fluxing of oxides, and allows for modification of coefficient of thermal expansion as needed. The polymer 16 may be disposed on lower substrate 12 by any suitable method, such as by screen printing as described in the book entitled *Microelectronics Packaging Handbook*, copyrighted 1997 by publisher Chapman & Hall. New York, N.Y., fully incorporated herein by reference thereto. The polymer 16 comprises a polymeric resin, a curing agent or hardener, and a fluxing agent. More specifically, the polymer 16 comprises, or consists essentially of, or consists of from about 15% by weight to about 70% by weight of a polymeric resin, from about 15% by weight to about 70% by weight of a curing agent, and from about 0.10% by weight to about 20% by weight of a fluxing agent; more preferably from about 25% by weight to about 60% by weight of a polymeric resin, from about 25% by weight to about 60% by weight of a curing agent, and from about 1% by weight to about 15% by weight of a fluxing agent; most preferably from about 40% by weight to about 55% by weight of a polymeric resin, from about 40% by weight to about 55% by weight of a curing agent, and from about 4% by weight to about 12% by weight of a fluxing agent. The polymeric resin may be any suitable polymeric resin that preferably has a temperature (e.g., from about 50° C. to about 100° C.) that is lower than its curing or setting temperature, which preferably ranges from about 100° C. to about 150° C. Preferably, the polymeric resin has a curing temperature (e.g., from about 20° C. to about 50° C.) higher than the reflow temperature of the soldering material of solder bumps 19. Also, the polymeric resin may expand when heated, and remain at least partially expanded after cooling. Suitable polymeric resin include epoxy resin made from bisphenol-A and epichlorohydrin, as taught in U.S. Pat. No. 5,128,746, incorporated herein by reference thereto.

Additional suitable polymeric resin include, as illustrated in U.S. Pat. No. 5,579,573, incorporated herein by reference thereto, thermosetting materials, such as high glass transition anhydride-cured epoxy compositions. More particular suitable thermoset materials include, but are not limited to, one or more compounds selected from group consisting of epoxies and modified epoxies, melamine-formaldehydes, urea formaldehydes, phelonic resins, poly(bis-maleimides), acetylene-terminated BPA resins. IPN polymers, triazine resins, and mixtures thereof. Additional suitable polymeric resin may include high temperature thermoplastic materials such as liquid crystal polyesters (e.g., Xydar™ or Vectra™), poly-(ether ether ketones), or the poly(aryl ether ketones). Further additional suitable thermoplastic materials include, by way of example only, ABS containing resinous materials (ABS/PC, ABS/polysulfone, ABS/PVE), acetals acrylics, alkyds, allylic ethers, cellulosic esters, chlorinated polyalkylene ethers, cyanate, cyanamides, furans, polyalkylene ethers, polyamides (Nylons), polyarylene ethers, polybutadienes, polycarbonates, polyesters, polyfluorocarbons, polyimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, polyether ether imides, and the like, and mixtures of any of the foregoing.

The curing agent or hardener may be any suitable curing agent or hardener, such as an amine or an anhydride. The polymeric resin and the curing agent may be a two part resin system such as polyester resins with suitable hardener or curing agents. For example, a commercially available two part resin system is Furane 89303 epoxy, Part A and Part B. Furane 89303 epoxy, Part A, is a bisphenol A-epichlorohydrin type epoxy resin available from the Furane Products Company of Los Angeles, Calif. Furane 89303 epoxy, Part B, is an anhydride curing agent or hardener also available from the Furane Products Company. It is to be understood that the spirit and scope of the present inventions include other types of two part resin systems which are capable of achieving the desired results within the scope of the invention. The fluxing agent in the polymer 16 assists in the fluxing action for the soldering coupling operation especially if no, or very little, solder-material fluxing agent is admixed in the soldering material of solder bumps 19. Thus, the fluxing agent in the polymer 16 may be an alternative to using a solder-material fluxing agent in the soldering material, or may be used in combination with a solder-material fluxing agent.

The solder-material fluxing agent in the polymer 16 preferably comprises a phenylacid, more preferably beta phenylacid. It has been discovered that beta phenylacid, especially in combination with an epoxy resin, slows down or retards the curing or hardening of the polymer 16, leading to longer gel time and allowing the solder material (e.g. 63 Sn/37 Pb) to melt before the polymeric hardens from its initial liquid state. The acid for beta phenylacid is preferably selected from the acid group consisting of acetic, acrylic, crotonic, caproric, valeric, enanthic acid, octylic acid, pelargonic acid, and capric acid. More preferably, the acid for beta phenylacid is selected from the acid group consisting of acetic, acrylic, crotonic, caproic, valeric and enanthic; most preferably from the acid group consisting of acetic, acrylic and crotonic. Particular improved retardation of polymer curing time, leading to longer gel time, is obtained when the fluxing agent is beta-phenylacrylic acid and/or beta-phenylhydroxyacrylic acid.

The polymer 16 is disposed on the lower substrate 12 in a liquid state, and the upper substrate 14 is moved towards the lower substrate 12, while conductor pads 18-solder bumps 19 on the upper substrate 14 remain aligned with conductor pads 20 on lower substrate 12. The liquid polymer 16 is compressed and squeeze flowed outwardly towards the perimetric edges 12a and 14a of the lower and upper substrates 12 and 14 by continually moving the upper substrate 14 towards the lower substrate 12 until the solder bumps 19 come in contact with conductor pads 20 to produce the assembly of FIG. 2. The liquid polymer 16 preferably completely encapsulates each of the conductor pads 18-solder bumps 19/pads 20. The fluxing agent in the liquid polymer 16 is in a contacting relationship with solder bumps 19. The assembly in FIG. 2 is heated, reflowed in a conventional manner, (e.g. to a temperature ranging from about 200° C. to about 240° C.), causing the fluxing agent in the liquid polymer 16 to be activated and reduce oxides on and in the solder bumps 19, and allowing alloy coupling of solder bumps 19 to conductor pads 20 and form joints 31 (see FIG. 2). As previously indicated, the fluxing agent in the liquid polymer 16 may be used alone as the sole fluxing agent (no fluxing agent is in the solder material), or the fluxing agent in the liquid polymer 16 may be used in combination with a solder-material fluxing agent in the solder material. During the reflow procedure, the fluxing agent in the liquid polymer 16 also retards or slows down the liquid polymer 16 from curing or hardening, especially when beta-phenylacrylic acid and/or beta-phenylhydroxyacrylic acid is employed as the fluxing agent. Thus, joints 31 are formulated before the liquid polymer 16 has been completely cured or hardened. After joints 31 are formulated, a post curing procedure (e.g., at a temperature ranging from about 100° C. to about 180° C.) may be required to completely cure the liquid polymer 16.

Referring now to FIGS. 5–12 for another embodiment of the invention, there is broadly illustrated a high density interconnect method by using a deformable bonding sheet 50 (i.e., a dielectric layer) and transient liquid alloy bonding material 70. The deformable bonding sheet 50 is tack-laminated over and onto a conventional laminated substrate 54 which supports build-up deposited layers 56. The deformable bonding sheet 50 has opened via holes 60 to accommodate metal posts 62 which hold the transient liquid alloy bonding material 70. As best shown in FIG. 8, conductive pads 64 are connected to the posts 62 and to a substrate 68. By controlling the diameter of the opened holes 60 and diameter of metal posts 62, a high density interconnect structure 55 with a voidless bonding sheet 50a can be obtained, as shown in FIG. 10. When heated, the material of which the bonding sheet 50 is composed will flow to fill any gap 61 between the opened via holes 60 and the posts 62. Because a deformable bonding sheet 50 is used in the embodiments of the interconnect process of the present invention, the interconnect process is preferably used on a layer without fine lines.

Suitable material for the transient liquid alloy bonding material 70 may be metals, or single or multi-phase alloys. The alloys can be binary, ternary, or other higher order compositions. Examples include eutectic Pb/Sn and alloys comprised of In—Sn, Bi—Sn, In—Ag, Sn—Sb, Au—Sn, and Pb—Sn. More specific examples of solders include 52 In/48 Sn, 58 Bi/42 Sn, 97 In/3 Ag, In, 37 Pb/63 Sn, 96.5 Sn/3.5 Ag, 95 Sn/5 Sb, 80 Au/20 Sn, and 90 Pb/10 Sn (described in terms of weight percentages). The suitable material may also include any material (e.g., a fluxing agent) suitable for removing oxides from the material. The fluxing agent may comprise an organic acid, and may be used in combination with any fluxing agent contained in the polymeric material of bonding sheet 50 to remove oxides in and on the material for the transient liquid alloy bonding material 70. Organic acids are preferred because they can have relatively high boiling points. Exemplary fluxing agents can include cinnamic acid, succinic acid, gluteric acid, adipic acid, pimelic acid, suberic acid, azelaic acid, adipic acid, sebacic acid, precursors and combinations thereof. The fluxing agent preferably comprises at least one of cinnamic acid, adipic acid or another acid which functions in a chemically similar manner or has a chemically similar structure. Furthermore, the fluxing agent can be in the material for the transient liquid alloy bonding material 70 in any suitable percentage, but can preferably constitute from about 0.1 to about 25 weight percent of the material.

The fluxing agent may be substantially non-volatile (e.g., does not boil or volatize in a substantial manner when the conductive composition is cured). In some embodiments, the fluxing agent may have a melting point of about 100° C., or more. The boiling or decomposition point of the fluxing agent, whichever is lower, may be greater than the lowest melting point (e.g., greater than about 10° C.) present among conductive elements within the material for the transient liquid alloy bonding material 70. The selection of the particular fluxing agent may depend on the particular conductive material used in the material for the transient liquid alloy bonding material 70. For example, the fluxing agent may be cinnamic acid which has a melting point of about 133° C. and a boiling point of about 300° C. Suitable conductive transient liquid alloy bonding material 70 which can be used with cinnamic acid include material comprising 37 Pb/63 Sn, which has a melting temperature of about 183° C.

Referring more specifically now to FIG. 5, there is seen the substrate 54, which may be any conventional substrate including a laminated core. Substrate 54 supports build-up deposited layers 56 which may be deposited by any conventional layer-deposit build-up process, e.g., such as one employing a photoresist and etching a metal layer. As shown in FIG. 6, the bonding sheet 50 is tacked onto and over the layer 56 and the substrate 54 in order to snugly adhere bonding sheet 50 to substrate 54 and its associated layers 56. The tack-lamination condition usually is mild at low temperature and low lamination force. The bonding sheet 50 for embodiments of the present invention may comprise any suitable deformable material which is capable of flowing and/or deforming with increased temperature and pressure. The deformable material for the bonding sheet 50 may comprise one or more conventional fillers. Preferably, the deformable material for the bonding sheet 50 is one or more of the previously mentioned polymeric resins, including one or more polymeric resins listed in U.S. Pat. Nos. 5,128,746 and 5,579,573, fully incorporated herein by reference thereto as if repeated verbatim immediately hereinafter. Preferably, the deformable material for the bonding sheet 50 is one or more of the polymeric resins having a softening temperature ranging from about 40° C. to about 60° C. and a gel-like and/or semi-fluidizing temperature ranging from about 50° C. to about 75° C. More preferably, the deformable material for the bonding sheet 50 is one or more of the polymeric resins having a softening temperature ranging from about 45° C. to about 55° C. and a gel-like and/or semi-fluidizing temperature ranging from about 55° C. to about 70° C. Suitable materials for bonding sheets 50 include those materials or polymeric sheets sold under the trade name BT F-346 from MGC, and under the trade name ABF from Ajinomoto. BT F-346 and ABF commence softening around 50°–60° C. and 40°–50° C., respectively, and commence semi-fluidizing and/or gel-like formation around 65°–75° C. and 50°–60° C., respectively.

After the bonding sheet 50 has been tack-laminated onto and over the substrate 54 and its associated layers 56, via holes 60 are formed in the bonding sheet 50 to provide openings for the posts 62 (e.g., copper posts 62) to slidably pass into. The formation of holes 60 may be accomplished in any suitable manner, such as by laser or lithography, or any other ways, such as by plasma etching, that can open the holes 60 on the bonding sheets 50, depending on the specific type of material of which the bonding sheet 50 is made. Subsequently, the substrate 68 (including associated pads 64 and posts 62) is disposed over substrate 54 such that posts 62 are aligned with holes 60 in the bonding sheet 50, as shown in FIG. 8. The aligned assemblies of FIG. 8 are then interengaged by compressing or forcing the substrates 54 and 68 towards each other until the post-supported transient liquid alloy bonding material 70 comes in contact with layers 56, as best shown in FIG. 9. The substrates 54 and 68 may be aligned by a suitable aligner, e.g., a flip-chip bonder by Karl Suess. The aligned substrates 54 and 68 are subsequently pressed as previously indicated until the posts 62 pass substantially into via holes 60 and the transient liquid alloy bonding material 70 lodges against pad or layers 56. The interengaged substrate assemblies are then heated by a flip-chip bonder in air or nitrogen environment. In one embodiment of the invention, the temperature may be higher than the melting or semi-fluidizing point of the bonding material 70 and held for a certain period of time. For example, the melting temperature is around 232° C. for Sn, 157° C. for In and between 120° C. to 232° C. for Sn—In temperature alloy (depending on the alloy composition). The time should be long enough to convert the molten phase of transient liquid alloy bonding material 70 completely into an alloy or metallic compound(s) 70a (see FIG. 12). More desirably, the transient liquid alloy bonding material 70 is to be converted completely into a strong and reliable metal phase which depends on the metallurgical system used.

After the posts 62 have been coupled to the pads or layers 56 through the metallic compounds 70a, the coupled substrate assemblies are then transferred to a conventional lamination press machine to produce heat-pressure treated bonding sheet 50a. During lamination with a conventional press machine, a vacuum takes away any air in the gap(s) 61. The combination of heat and lamination forces move or push in the walls of the via holes 60 in direction of the arrows A in FIG. 12. Due to the deformability or fluidity of the material of the bonding sheet 50, the bonding material fills in gap(s) 61 and creates a void-free structure in deformed bonding sheet 50a. As previously indicated, because the material for the bonding sheet 50 is deformable when heated and compressed, the lamination press machine preferably heats the interengaged substrate assemblies of FIG. 9 to a temperature ranging from about 50° C. to about 400° C., more preferably from about 120° C. to about 350° C., and compresses the intercoupled substrate assemblies including substrates 54 and 68 (see FIG. 12) towards each other such that substrates 54 and 68 each have a pressure ranging from about 50 psi to about 1000 psi, more preferably from about 150 psi to about 400 psi.

It has been discovered that the success of the foregoing method depends on the values of the following variables from FIG. 11: $H_{tp}$ (height of top pad or pads 64), $H_{bp}$ (height of bottom pad or deposited patterned layers 56), $H_{bs}$ (height of bonding sheet 50), $H_p$ (height of post 62), $H_{dp}$ (height of depletion phase or transient liquid bonding material 70), $D_p$ (diameter of post 62), $D_{vb}$ (diameter of bottom of via hole 60) and $D_{vt}$ (diameter of top of via hole 60).

The following Table I lists one preferred value for the variables based on F-346 and ABF materials for bonding sheet 50:

TABLE I

| No. | Bonding Sheet | $H_{tp}$ | $H_{bp}$ | $H_{bs}$ | $H_p$ | $H_{dp}$ | $D_p$ | $D_{vb}$ | $D_{vt}$ |
|---|---|---|---|---|---|---|---|---|---|
| 1 | F-346 | 5 μm | 18 μm | 55 μm | 28 μm | 3 μm | 50 μm | 70 μm | 100 μm |
| 2 | F-346 | 5 μm | 18 μm | 55 μm | 28 μm | 3 μm | 50 μm | 80 μm | 120 μm |
| 3 | F-346 | 5 μm | 18 μm | 55 μm | 28 μm | 3 μm | 50 μm | 80 μm | 100 μm |

TABLE I-continued

| No. | Bonding Sheet | $H_{tp}$ | $H_{bp}$ | $H_{bs}$ | $H_p$ | $H_{dp}$ | $D_p$ | $D_{vb}$ | $D_{vt}$ |
|---|---|---|---|---|---|---|---|---|---|
| 4 | ABF | 5 μm | 18 μm | 45 μm | 28 μm | 3 μm | 50 μm | 65 μm | 100 μm |
| 5 | ABF | 5 μm | 18 μm | 60 μm | 28 μm | 3 μm | 50 μm | 80 μm | 100 μm |
| 6 | ABF | 5 μm | 18 μm | 70 μm | 28 μm | 3 μm | 50 μm | 80 μm | 120 μm |

One of the keys to success of a void-free package from this process is the combination of the dimensions for $H_{tp}$, $H_{bp}$, $H_{bs}$, $H_p$, $H_{dp}$, $D_p$, $D_{vb}$ and $D_{vt}$.

More generally, the values for the variables $H_{tp}$, $H_{bp}$, $H_{bs}$, $H_p$, $H_{dp}$, $D_p$, $D_{vb}$ and $D_{vt}$ fall he ranges listed in Table II below:

TABLE II

| Variable | Broad (μm) | Preferred (μm) | Optimum (μm) |
|---|---|---|---|
| $H_{tp}$ | 2–8 | 3–7 | 4–6 |
| $H_{bp}$ | 12–24 | 14–22 | 16–20 |
| $H_{bs}$ | 40–70 | 45–65 | 50–60 |
| $H_p$ | 19–37 | 22–34 | 25–31 |
| $H_{dp}$ | 0.5–6.0 | 1–5 | 2–4 |
| $D_p$ | 35–65 | 40–60 | 45–55 |
| $D_{vb}$ | 55–85 | 60–80 | 65–75 |
| $D_{vt}$ | 85–115 | 90–110 | 95–105 |

Appropriate ratios between any two of the variables for any respective range of values may be discovered by dividing the lower range of one variable by the lower range of another variable and by dividing the upper range of the one variable by the upper range of the other variable. For example, the ratio of $D_{vt}$ to $D_{vb}$ in the broad range preferably ranges from about 1.5 (i.e., about 85 μm/55 μm) to about 1.3 (i.e., about 115 μm/85 μm). Similarly, and by way of example only, the ratio of $D_{vb}$ to $H_{dp}$ in the optimum range preferably ranges from about 32.5 (i.e., about 65 μm/2 μm) to about 18.8 (i.e., about 75 μm/4 μm).

As previously indicated, the bonding sheet 50 may contain fillers or no fillers. The bonding sheet 50 may be photosensitive for lithography, or it may be a liquid or solid at room temperature. If the bonding sheet 50 is disposed on substrate 54 as a liquid (e.g., liquid polymer 16), it is apparent that no via holes 60 would have to be formed and no lamination of the bonding sheet 50 would have to be conducted. If the bonding sheet 50 is liquid, the embodiment of the invention of FIGS. 1A–4 is applicable, with conductive posts 60 (including associated depletion layers, the transient liquid alloy bonding material 70) replacing conductor pads 18 and the depletion layers or bonding material 70 replacing solder bumps 19.

Referring now to FIG. 13, there is seen an SEM cross section micrograph of HDI substrate fabricated from insertion joining process with transient liquid alloy bonding. The bottom substrate 54 is a 40 mil alumina substrate (99.6%) with 5 μm Cu pads 56 at 216 μm pitch (120 μm in diameter). The top substrate 68 is a 50 μm polyimide (5 layers of 10 μm DuPont 2611) film with 5 μm Cu pad 64, 15 μm Cu post 62, and 12 μm Sn (i.e., transient liquid alloy bonding material 70). The interlayer dielectric or bonding sheet 50 is a 1 mil thick DuPont KJ thermoplastic polyimide bonding sheet. The via opening 60 was done by laser drilling at a size of 75 μm. The Cu post 62 diameter is 60 μm. FIG. 13 shows all the interconnects joined. There is no void between dielectric or bonding sheet 50 and Cu post 62.

FIG. 14 is a detailed view of a single interconnect from FIG. 13. FIG. 14 illustrates the structure of the joint. The intermetallic phase 70a is $Cu_3Sn$, which is a stable and a high melting point phase (676° C.). This implies that no further intermetallic phase change will occur in this system. FIG. 15 is a schematic drawing of the structure of an interconnect as shown in FIG. 14. FIG. 15 demonstrates that the intermetallic phase 70a did not attack the interface between Cu and polyimide bonding sheet 50. In contrast to an ordinary conventional solder joint, in which the intermetallic will grow continuously to degrade a Cu/polyimide interface, this intermetallic phase 70a will not grow further. FIG. 16 is a thickness measurement of the intermetallic layer between Cu post 62 at top substrate 68 and Cu pad 56 at bottom substrate 54. Although the original Sn (i.e., the depletion phase or transient liquid bonding material 70) thickness was around 12 μm, the final joint will only have 3 to 5 μm of the intermetallic phase 70a present at the interface. This is due to the process conditions and the nature of the transient liquid alloy bonding process.

In another embodiment of the present invention a high density interconnect process employs a pre-drilled bonding sheet and transient liquid alloy bonding. By controlling the diameter of the drilled hole, metal post diameter and thickness of deposited depletion phase, a filled, essentially voidless, interconnect structure may be obtained. Because a no-flow bonding sheet is used in this process, this embodiment of the interconnect process may be used on signal layers with fine lines and pads.

Referring now to FIGS. 17–21, there is seen a bottom substrate 80 (flexible or rigid substrate) was first deposited with necessary conductive pads 82. A non-flowable dielectric bonding sheet 84 was applied on top of the circuitry and pressed in a lamination press with vacuum. The lamination condition is enough to bond the bonding sheet 84 onto the substrate 80 but not strong enough to obtain a fully cured bonding. Then, the bonding sheet 84 is drilled by laser to produce openings 86 at the positions where there is a need to have interconnect with pads 82.

As best shown in FIG. 19, substrate (flexible substrate) 88 was deposited with metal pads 90 representing metallization circuitry. On pads 90 metal posts 92 were connected, followed by the deposition of depletion phase metal 94 (e.g., material 70) on the ends of posts 92. The dimension of the laser drilled holes, post diameters, and thickness of depletion phase, etc., may be guided by the dimensions in Table II.

After the substrate assemblies of FIGS. 18 and 19 were produced, they are subsequently brought together with an alignment procedure to fabricate the joint. Through a scaling procedure employing the dimensions of Table II, the metal posts 92 pass into drilled holes 86 of substrate 80. Then, substrates 88 and 80 are held in position by a clamping mechanism, which will keep the alignment. Due to the nature of this process (insertion process), the posts 92 are anchored inside the holes 86 after the alignment procedure.

For this embodiment of the invention, bonding sheet 84 has a bonding temperature higher than the melting point of depletion phase(s) 94. Thus, a reflow process can be added to the aligned substrate. By using this reflow process, the depletion phase 94 will melt into intermetallic phase 94a (see FIG. 21a) and form a metal contact on the bottom substrate. Then, a testing process may be added to verify the yield before a final lamination process. If the yield is not satisfactory, the coupled substrates 80 and 88 may be reworked, with the removal of substrate 88. Thus, this process is a reworkable process.

In another embodiment of the invention, the bonding sheet 84 is manufactured from one or more of the previously mentioned thermoset polymeric materials or resins, or any other suitable material(s), such that the deformable, gel-like and/or semi-fluidizing temperature is greater than or higher than the temperature (e.g., 150° to 250°) intermetallicly coupling metal posts 92 to deposited layers or pads 82. Thus, intermetallicly coupling would first take place, followed by liquidizing or semi-fluidizing the material of the bonding sheet 84, and then (if need be) followed by lowering the temperature of the materials of the bonding sheet 84 to an appropriate curing temperature (e.g., 100–140° C.).

In a further embodiment of the invention, conditions of final lamination process will depend on the lamination condition of the bonding sheet 84 and the melting point of the depletion phases 94. If the bonding sheet 84 is a thermoplastic polyimide, e.g., a thermoplastic polyimide KJ fabricated by DuPont, it has a bonding temperature between 270° to 350° C. at 200 psi. Since this temperature is higher than the melting temperature of the depletion phase 94 (e.g., about 232° C. for a Sn depletion phase), the joint can be produced following the bonding condition of the bonding sheet 84. Because the transient liquid alloy bonding or depletion phase 94 is not sensitive to high lamination temperature, the high bonding temperature of bonding sheet 84 (e.g., DuPont KJ) will not deteriorate the metal phase. Because of this high temperature, the intermetallic phase 94a can be completely transformed from $Cu_6Sn_5$ into $Cu_3Sn$, which is a benefit for this metal/depletion combination.

In a further embodiment of the invention, the intermetallic joint may be fabricated at low temperatures that will melt the depletion phase 94 but not the bonding sheet 84. By controlling the process condition, only a small portion of the depletion phase 94 will be reacted with base metal of pads 82 and form a thin layer of intermetallic phase 94a. Most of the depletion phase 94 would still be present. In this case, a substrate (e.g., substrate 88) can be tested for the yield and can be reworked by reheating the substrate. After testing the yield, substrates 80 and 88 may be sent to a lamination press for laminating the bonding sheet 84 as a final process procedure. Due to the anchoring nature of this insertion process (i.e., metal posts 92 sitting inside the holes 86), the alignment of the interconnect will not be as sensitive to the lamination shifting as other non-anchoring processes. The dimension of the foregoing metal deposition method may be controlled by a conventional lithography process. Thus, the size of the intermetallic joint may be small and the quality of the metal deposition may be good. The intermetallic phase 94a has a melting point much higher than the substrate working temperature. It will provide a better and more stable joint than conventional low-melting point solder joints. The intermetallic phase 94a surrounding the Cu post 92 will prevent or slow down the diffusion rate of Cu, and will less likely have bridging between fine pitch joints caused by Cu migration.

Referring now to FIG. 22, there is seen a device 100 to prevent the condensation of water on the surface of a sample 102 in a controlled high humidity/high temperature environmental test chamber in the event of a power failure. A conventional and universal method of establishing the operational life reliability of electronic components with respect to corrosion or ion transport induced shorts is to subject a representative test sample(s) of the component to a higher than operational temperature and humidity environment. In most instances the sample is simultaneously subjected to either electrical bias or steady state operation. Sample degradation may be determined by physical investigation and/or electrical measurement. Algorithms may be established which will determine the degradation acceleration factor between the test increased temperature/humidity and the operating life conditions. This allows one to predict in less than 1000 hr. of test conditions, what the failure mode will be in 7+ years of actual product operating conditions.

In 1000 hours of test it is not unusual to have a power interruption. The tests are so established that in a controlled test stoppage, the humidity is always turned off before the temperature to prevent condensation either directly on the samples (e.g., sample 102) or indirectly by dripping from chamber ceiling onto the sample. However, during a power outage an uncontrolled turn off of temperature and humidity usually causes condensation of water on the sample 102. This condensation usually changes the conditions such that the algorithms for acceleration factors are no longer accurate.

The device of FIG. 22 incorporates a two fold approach to solve the foregoing problems, which may be used independently or in a more desirous mode, simultaneously.

The first approach consists of having a heat exchanger 104 including condenser 104a in an obscure corner inside a chamber 106. This exchanger 104 consists of a closed loop which is attached to either cooling water or gaseous source. The inlet of the loop contains a normally opened valve 108. When power is turned off the valve 108 will open and de-humidify the chamber 106 by preferentially condensing moisture on the chilled looped condenser 104a. Water is then collected in a collection vessel 110 in an obscure area of the chamber 106.

The second approach utilizes a heating plate 112 placed under the samples 102 and powered by an un-interruptable power supply (UPS). The heating plate 112 is electrically connected to the UPS by a normally closed switch 116. When the facilities power is disrupted the heater plate 112 is powered up by the UPS. Only 50–100 watts are needed to keep the sample(s) 102 a few degrees hotter than the rest of the chamber 106. This will discourage condensation on the samples 102.

The advantage of the device of FIG. 22 is that it will prevent the costly consequences that can occur if condensation occurs on the samples 102. This can be loss of up to 1000 hours of test time plus setup time. In addition the loss of possible expensive and/or rare prototype sample is possible.

Referring now to FIGS. 23–25, there is illustrated a schematic flow diagram for producing a low-cost heat sink that uses a soft solder to make a conforming heat sink that is cast to exactly the correct dimensions. Back side cooling of MCMs is a costly problem due to a lack of planarity on flip chip components. This lack of planarity causes large, unacceptable thermal resistances between the lowest chips and the heat sink. Solutions previously patented include spring mechanisms, plungers or complex assemblies of lids and slugs that overcome the lack of planarity.

A heat sink 120 is made from a copper block 122, with fins 122a on one side and pedestals 122b on the other. The pedestals 122b exactly match the chip sites on a specific multi-chip module (MCM) 134 in a mirror-image, such that if the heat sink 120 is placed upon the MCM 134, the pedestals 122*b* will match the chips' locations in X and Y dimensions. The pedestals 122*b* shall be slightly smaller than chips 130 (250 microns in X and Y direction/dimensions).

The heat sink pedestals 122*b* are selectively plated or pasted with a soft solder 126. The thickness of the solder 126 is preferably about 250 microns. The soldered area should be only the top surfaces of the pedestals 122*b*, with a 250 micron unsoldered border. The method used to selectively plate only the top surface of each pedestal 122*b* could be wax, resist or tape. Alternatively (and preferably) the solder 126 would be dispensed as a solder/flux paste for ease of subsequent reflow. The solder alloy should have a melting point approximately 120° C. This melting point (MP) was chosen because it is well below the MP of any 60/40 solder that may be on the MCM 134, but not so low that this solder would melt when the chip reaches its maximum junction temperature. Examples of solder alloys that have the correct characteristics include: In/Pb, Bi/Sn, Ga/Pb or other combinations of these metals.

The heat sink 120 is brought into intimate contact with an assembled MCM 134 and heated to 40° C. above the melting point of the solder 126. The heat sink 120 is allowed to rest on the surface of the MCM 134 while it cools back to room temperature. At this point, each layer of solder 126 has conformed to the Z-height (and any pitch angle) of the chip 130 it touches, so that the heat sink 120 is now a perfect match for the MCM 134. The solder 126 does not, however, flow around the chip 130 to cause stress in temperature cycling. Any excess solder 126 in contact with "tall" chips 130 will flow out to and around the pedestals 122*b*.

Once cooled, the heat sink 120 is removed from the MCM 134. A thin layer of thermal grease is applied to each pedestal 122*b*, in order to ensure good thermal contact. The heat sink 120 is then clamped back in place on the MCM 134. The advantage of this technique over others is its low cost and ease of manufacture. It can also overcome up to 10 mils in height or pitch angle variation on the back side of an MCM 134. This can be increased to 20 or more mils by the correct application of solder thickness and pedestal geometry.

Referring now to FIGS. 26–30, in fabricating electronic packaging such as multi-chip modules there are power (V) layers 140 and ground (G) metal layers 142 separated by a dielectric 144 (typically polyimide). To minimize the impedance of the power distribution for high frequency packaging applications, it is necessary to reduce the thickness of the dielectric 144 between the V and G metal layers 140 and 142. However, this results in manufacturing and yield problems because of electrical shorting at pinholes 146 and particles 148 in the thin polyimide dielectric layer 144. The problem may be solved by sputtering a layer of alumina 150 on top of the G metal layer 142, and then partially etching prior to via plating. The alumina 150 prevents electrical shorting at any pinholes 146 or particles 148 in the polyimide dielectric layer 144.

Thin dielectric (typically polyimide, PI) layers 144 are necessary to lower the impedance of the power distribution in high frequency packaging applications. The yield of these structures is limited by electrical shorts at pinholes 146 or particles 148 in the thin PI layer 144 between ground and voltage layers 142 and 148. As indicated, the problem may be solved by sputtering the layer of alumina 150 on top of the G metal layer 142 and then partially etching prior to via plating. The alumina 150 prevents electrical shorting at any pinholes 146 or particles 148 in the polyimide dielectric layer 144.

As best shown in FIG. 27, the layer of alumina 150 is disposed (using CVD, sputtering or sol-gel process) on top of the G metal layer 142. Then a photoresist 152 is patterned and the alumina 150 is etched using EDTA or other wet etchants. The structure is shown in FIG. 27 with photoresist 152 still in place. Opening 156 is plated for interconnecting vias 158. Then the photoresist 152 is stripped, as shown in FIG. 28. The polyimide dielectric layer 144 is coated, and planarized to expose the vias 158 using CMP. The structure is shown in FIG. 29. Subsequently, the V metal layer 140 is built, as shown in FIG. 30. Even though there may be defects, such as pinholes 146 or particles 148, no shorting occurs.

Referring now to FIGS. 31–35, an alternative process is proposed. The photoresist 152 is patterned for interconnection vias 158, as shown in FIG. 31. Then, after vias 158 are formed through plating, the photoresist 152 is stripped (as shown in FIG. 32). Alumina 150, or other type of dielectric materials, is deposited as shown in FIG. 33. Deposition processes include CVD, PVD, or sol-gel process. PI dielectric layers 144 may be coated onto alumina 150, and then planarized to expose the vias 158, as shown in FIG. 34. CMP may be needed for planarization and via exposure. Voltage metal layer 140 is then built, as shown in FIG. 35. Even if there are pinholes 146 and particles 148 in the PI dielectric layer 144, no shorts occur between G and V metal layers 142 and 140.

Referring in detail now to FIGS. 37–42 for manufacturing a high density super interposer, a dielectric layer 160 of polyimide is coated on top of a rigid substrate 162. The substrate 162 may be pretreated for subsequent film/substrate separation. The polyimide dielectric layer 160 thickness ranges from 3 to 20 $\mu$m. A thin metal seed 164 (such as Cr/Cu) is then deposited on top of the polyimide dielectric layer 160. Multilayer circuits 168 are built on top of the metal seed layer 164, as shown in FIG. 36. It should be noted that the seed layer 164 is not etched during the buildup process, and is used as the stop layer for later backside polyimide etching.

The film circuit (SIP) is then detached from the substrate 162, as shown in FIG. 37. The backside polyimide dielectric layer 160 is etched away using oxygen plasma, as shown in FIG. 38. The metal seed layer 164 is used as the stop-layer for the plasma etching, such that the final film structure as shown in FIG. 39 is produced after wet etching the seed layer 164.

Referring now to FIGS. 40–42 for an improved interposer (SIP) structure and its fabrication methods, there is seen a process flow diagram. With the new structure, signal lines (and other functional features) may be added in the bottom metal layer, which otherwise consists of metal pads only. Therefore for the same number of layers, more functional circuits may be fabricated and higher density may be achieved. Also, no solder mask is necessary for interconnection. In addition, the improved approach has simpler processes after film/substrate separation.

The polyimide dielectric layer 160 is coated on top of the rigid substrate 162. The substrate 162 may be pretreated for later film/substrate separation. The polyimide dielectric layer 160 thickness ranges from 3 to 20 $\mu$m. The thin metal seed layer 164 (such as Cr/Cu) is then deposited on top of the polyimide dielectric layer 160. First metal pattern layer is then built on top of the seed layer 164. In this approach, the seed layer 164 is etched away immediately after completing the first metal structure. More circuit layers may then be built, as shown in FIG. 40.

The film circuit 168 is then separated from the substrate, as shown in FIG. 41. Laser is then used to cut the polyimide dielectric layer 160 to produce dielectric layers 160a and open interconnection pads 168a and 168b. This approach has simpler post-peeling process, with a different final structure.

Three approaches may be used for film/substrate separation. A first approach is etching (substrate), e.g., metal (such as aluminum) can be etched away for film/substrate separation. A second approach is peeling, e.g., by treating substrates prior or after buildup, the films can be peeled from the substrates. The pretreatment of substrates includes deposition of thin gold or other metal films which have low adhesion to substrates. The films can be peeled after circuit fabrication. The post-fabrication treatment includes pressures cooking to reduce the adhesion between any glass/PI dielectric interface. A third approach is lift-off, e.g., depositing a thin metal layer on the substrate, then etching this thin metal, and subsequently lifting up the film.

Signal lines (and other functional features) may be added in the bottom metal layer, which otherwise consists of metal pads only. Therefore for the same number of layers, more functional circuits may be fabricated, or for the same functions, less metal layers are needed. Therefore, the new structure has potentially higher density. The first (bottom) polyimide layer may also serve as solder mask, if soldering is used for connection. Various kinds of substrates can be used.

Referring now to FIGS. 43–46, there is seen an embodiment of the invention for limiting a bottom burn 180 that occurs during laser ablation of thin 25–50 μm flexible substrates 182. It is also used to give uniform vacuum flatness on flexible substrates to limit the amount of hills and valleys due to vacuum holes in the chuck. This technique also helps absorb some of the residue from laser drilling so that it won't redeposit on the bottom or into a laser drilled hole.

When drilling flexible substrates 182, a vacuum 183 is used to hold down the substrate 182. This can cause distortion due to peeks and valleys in a flexible film 184 (preferably a polymer film) from the vacuum 183 and the vacuum holes in the chuck. Metal vacuum chucks may also absorb the energy from the laser drilling and transfer it back to the bottom of the substrate 182. This will cause burning around the bottom of the laser drilled hole. Material from drilling can also redeposit into and around the hole from the melting and splatter that occurs. By using paper or cotton cloth 186 under the flexible film 184, the film 184 is held down more uniformly and the energy is transferred to the exit material rather than the flexible film 184.

Either paper or cotton cloth 186 may be placed under the flex material 184 during laser ablation. Vacuum is achieved through the paper or cloth 186 but is limited by these materials. The paper or cloth also absorbs the energy of the laser beam without refracting and the exit hole is clean without any burning (see FIGS. 45 and 46). A Yag laser is used at 3–12 Khz with varying pulse rates. Holes range in size from 25–50 μm. The Yag laser is also used for larger diameter holes 100 μm to 200 μm using similar frequencies with trepan or spiral drilling processes. These exit materials should be changed per each individual sample.

It is common procedure to drill materials on a rigid chuck of aluminum or stainless steel. Vacuum holes of these chucks can range in size as small as a millimeter in diameter. These varying hole diameters can cause dimples 184a in the thin flexible polymer film materials 184 (see FIG. 43). When drilling into the flex substrate 182, the focal distance is important for controlling the finished drill hole diameter. Out of focus distances of 10, 15 and 25 μm may change the drill diameter and also the shape of the drilled hole. If the flex substrate 182 is not planar, then an array of drilled holes may vary throughout the substrate 182. The paper or cloth 186 material is used to pull vacuum uniformly with no distortion and to reduce the burn effect 180a from laser drilling (see FIGS. 45–46). This technique also helps absorb some of the residue from laser drilling so that it won't redeposit on the bottom or into the laser drilled hole.

Referring now to FIGS. 47–51, a structure and process are proposed that allow the use of thin dielectric layers to lower the impedance of the power distribution in electronic packaging. The structure does this by eliminating electrical shorts 193 that are inevitable in thin dielectric layers 192 as a result of pinholes 192a (and particles). This ability to lower the impedance of the power distribution is important in high frequency packaging applications.

Thin dielectric (typically PI) layers 192 are necessary to lower the impedance of the power distribution in high frequency packaging applications. The yield of these structures is limited by electrical shorts 193 at pinholes 192a in the thin PI layer 192. Embodiments of this invention solves that problem by using an anodizable metal 196 for the metallization layer beneath the thin PI layer 192. The PI layer 192 is exposed to an appropriate electrolyte in an anodization cell to anodize the Al which is exposed to the solution at any pinholes 192a in the dielectric layer 192. The top metallization is then deposited over the PI layer 192 to complete the V-G structure. The anodic oxide metal 196 prevents electrical shorting at any pinholes in the PI.

In fabricating electronic packaging such as multi-chip modules there are power (V) and ground (G) metal layers 194 and 190 separated by the dielectric (typically polyimide) layer 192. To minimize the impedance of the power distribution for high frequency packaging applications, it is necessary to reduce the thickness of the dielectric layer 192 between the V and G metal layers 194 and 190 (see FIG. 47). However, this results in manufacturing and yield problems because of electrical shorting 193 at pinholes 192a (and particles) in the thin polyimide (PI) film 192 (see FIG. 48).

Embodiments of this invention propose to eliminate this yield problem for thin dielectric films 192 by using anodization of the bottom metal 190 at the pinholes 192a in the polyimide dielectric layer 192 to eliminate electrical shorts 193. To do this, a metal that can be anodized to form a dielectric material, is used as the bottom metallization layer for the ground metal 190. The preferred material for this bottom metal is Al because it is a metal with high electrical conductivity that is anodizable.

The thin dielectric layer 192 is then deposited over the bottom ground metal 190. Because it is thin, it is anticipated that there may be pinholes 192a as indicated in FIG. 49. This PI dielectric film 192 is then exposed to an appropriate electrolyte in an anodization cell to anodize the Al exposed to the solution at any pinholes 192a in the PI dielectric film 192 (see FIG. 50) and produce anodic oxide metal 196. The top power metallization 194 is then deposited over the PI dielectric film 192 to complete the V-G structure (see FIG. 51). The anodic oxide 186 prevents electrical shorting 193 at any PI pinholes 192a.

Additional anodizable metals include Ta, Hf, Ti, and Zr and may be used for the lower metallization layer 190; however, their high electrical resistivities may result in unacceptably high resistances. Potentially, any of these anodizable metals could be deposited (typically by sputtering) over another high conductivity material, such as Cu. This has the advantage in that the Cu may be plated inexpensively to whatever thickness is needed to provide the necessary electrical conductivity for the particular application. The thin anodizable material above the Cu could then be anodized to prevent electrical shorting 193 as discussed above. However, this double metal structure for the bottom metal layer 190 may also have problems with pinholes 192a through the anodizable metal, exposing the Cu which is not anodizable during the anodization process. This would short out the anodization process. Therefore, the preferred structure would be to use only the one anodizable metal (preferably Al) in the bottom metal layer 190.

The structure of FIGS. 47–51 makes it possible to lower the impedance of the power distribution in high frequency packaging applications without changing the polyimide dielectric material. This is an advantage in that potential problems with interfacial adhesion, thermal stability, etc. are avoided.

Referring now to FIGS. 52A–75, there is seen: (1) a structure of the CPU (central process unit) of a high end computer; (2) a unique way to connect the MCM (multi-chip module) to the daughter board or the mother board; (3) a novel MCM structure; and (4) a process to fabricate the MCM.

It is well known that a computer consists of microprocessor chips. For a high speed computer (super computer and global server), there are usually numbers of logic chips in the CPU. The chips need to be connected to one another and to the power and ground voltage. Usually, decoupling capacitors are needed to improve the performance of the computer. The location of the decoupling capacitor should be as close to the logic chips as possible. As the integration level of the chip increases, the demand on the module (single chip and multi-chip) which the chips are mounted on also increases.

Referring more specifically now to FIGS. 52A–63, in a high end computer system, there are two major groups: logic and memory. Memory is usually stacked on one part; while logic chips are mounted on MCMs. In FIGS. 52A–53B, there is seen a mother board 200; a memory board 202; a MCM 204 for logic chips; and a daughter board 206 for MCMs. Basically, the memory unit (e.g., memory board 202) and the logic unit (e.g., MCM 204) are mounted on the mother board 200. The way to mount the memory unit is standard. For logic chips, the following four cases may be employed to arrange the MCMs' connection to the mother board 200: Case I of FIGS. 52A–52B, Case II of FIGS. 53A–53B, Case III of FIGS. 54A–54B, and Case IV of FIGS. 55A–55B. The MCMs may be placed vertically or horizontally. The MCMs may be connected to the mother board 200 directly or through the daughter board 206.

In Case I of FIGS. 52A–52B, the MCMs 204 are directly connected to the mother board 200 and the signal connections are through TF3DC (thin film 3 dimensional connectors 210, as described in U.S. Pat. No. 5,419,038 incorporated herein by reference thereto, see FIGS. 56–57). The power/ground connections are directly through the MCM 204 substrates itself (see FIGS. 58–63).

In Case II of FIGS. 53A–53B, the MCMs 204 are connected to two (2) daughter boards 206—206. The signal connections are through TF3DC 210 (see FIG. 57). The power/ground connections are directly through the MCM 204 substrates itself (see FIGS. 58–63). The daughter boards 206—206 are connected to the mother board 200 using the same arrangement as in Case I. The daughter boards 206—206 may arrange for the signal connections among the MCMs 204. With the daughter board 206, the structure of the mother board 200 can be simpler and the cost, cheaper.

In Case III of FIGS. 54A–54B, only one horizontal daughter board 206 is employed. The daughter board 206 may be connected to the mother board 200 through an area array connection 207 (for example, solder joints). The area array connection 207 is more preferable than Case II arrangement as the connection technology is simpler. The signal connections among the MCMs 204 may only go through one side of the MCM 204. The signal trace density in the daughter board 206 is higher than that in the Case II structure.

In Case IV of FIGS. 55A–55B, which is a combination of Case II and Case III, three (3) daughter boards 206—206—206 are employed. The structure of each of the daughter board 206 will be simpler. Also, the number of signal interconnect among the MCMs 204 can be higher if required.

Referring now to FIGS. 56–57 and as previously indicated, there is seen the connections between the MCMs 204 and the daughter board 206 (or the mother board 200). The signal connections are through the TF3DC 210. The power/ground connections are directly through the MCM 204 substrates itself, as shown in FIGS. 58–63.

FIGS. 58–60 represent two MCMs 204a–204b. There are two logic chips 210 and two decoupling capacitors 212 on each MCM part 204a and 204b. In a typical case, there can be more chips and other passive components on each of the MCMs 204.

The substrate of the MCM 204 is separated into MCM parts 204a and 204b which are electrically isolated to each other. The substrate is used as the power and ground connection. The substrate (or frame after the removal of the center part) can be inserted into the board for the power and ground connections. The center of the substrate is removed (this can be done by mechanical milling followed by Al etch) after the formation of the thin film interconnect layers; therefore, chips and capacitors can be mounted on both sides of the thin film layer. The decoupling capacitors 212 can be placed directly "under" the chips 210 to ensure that the distance between respective capacitors 212 to the chips 210 is minimum. There are areas on the thin film module reserved for each TF3DC 210 for the signal connection from the MCM 204 to the daughter board 206. The signal connections are controlled impedance microstrip or strip lines. The cooling of the chips 210 may be achieved through the attachment of heat pipes 216 or cooling fins on the back of the chips 210. The chips 210 are connected to the thin film substrate using normal C4 flip chip assembly techniques.

Referring now to FIGS. 61–63, two (2) SIP (super interposers) 220 between the chips 210 and the thin film module 204. The SIP 220 can provide a dense signal trace for fan out. If three signal layers are needed on the thin film module 204, the yield of the module 204 could be low; thus, two SIPs 220 (each with one signal layer) and one thin film module 204 (with one signal layer) may be needed. The structure and fabrication process for each SIP 220 can be similar to that of the thin film module 204. The "frame" of the SIP 220 can be removed after the assembly process.

There may be more than one chip 210 on each SIP 220. The SIP 220 will be connected to the thin film module 204 first (with C4 technology) and then the chips 210 can be connected to the SIP 220 (with C4 technology). Alternatively, the chips 210 may be connected to the SIP 220 first for testing and then the SIP 220 and the chips 210 may be connected to the thin film module 204. The C4s may have different Pb\Sn compositions to satisfy the assembly temperature hierarchy requirements.

FIGS. 64–77 describe the process to build the thin film MCM 204. Additive or subtractive processes may be used for each metal layer. Referring more specifically now to FIGS. 64–72, there is seen substrate 240 comprising aluminum metal 242 (i.e., the power section), the ground Al metal 244 (i.e., the ground section), and the oxide section 246 (i.e., the coupling section). A PI dielectric layer 250 is deposited, etched, and openings are filled with via 252 (i.e., power conductive vias 252). Patterned conductive layers 254 are deposited, followed by the deposition of PI dielectric layers 259, patterned PI dielectric layers 260, and conductive vias 256. Patterned signal layers 262 are formed, followed by selective deposition of PI dielectric layers 263. Subsequently, PI dielectric layers 264 are deposited, and the patterned conductive signal layers 266 and power layer 268 are deposited. Part of substrate 240 may be selectively removed to produce Al metal 244, oxide section 246 and aluminum metal 242, all spaced from each other as shown in FIG. 72.

FIGS. 73–75 illustrate a manner to make the MCM 204 substrate. A starting substrate 280 may be an Al substrate with anodized areas 282, or can be an Al substrate with no anodized areas. Opening 284 is formed in substrate 280 to produce frame 280a. After fabrication, the anodization may be performed, or the frame 280a may be cut to separate power and ground parts.

Thus, by the practice of embodiments of the invention in FIGS. 52A–75, the size of the CPU may be made smaller. The TF3DC 210 connect the MCM 204 to the board (both mother and daughter) with 90 degree bending. The power/ground connection of the MCM 204 to the board is through the substrate itself. This allows a 90 degree arrangement between the MCM 204 and the mother board 200. The foregoing two arrangements enable a 3D structure. Small size may have lower signal transmission delay and lower power voltage drop. The signal transmission are through strip line with controlled impedance. The daughter board 206 arrangement may provide enough signal connections among the MCMs 204. The power/ground path is of low resistance due to the size and thickness of the substrate. The distance between the chips 210 and the decoupling capacitors 212 is minimal. The use of daughter board 206 or SIP 220 simplify the structures of the motherboard 200 and the thin film module. The yield is higher and the cost is lower. The substrate removal feature doubles the capacity of device mounting on the thin film module.

Referring now to FIGS. 76–83 there is illustrated a connection process that can reduce the high contact resistance that result from traditional anisotropic conductive film (ACF) processes. The joints produced by the process illustrated in FIGS. 76–83 have a higher mechanical strength than traditional ACF physical contact joints, which improves the reliability of the joints.

FIGS. 76–79 illustrate conventional processes for ACF joint. Initially, the ACF is placed between two substrates 300 and 302. The ACF is typically tacked on bottom substrate 302 first at low temperature, and is then placed on the top substrate 300. Due to the nature of ACF, no special alignment procedure is needed for aligning ACF to respective substrates. The only alignment procedure needed is to align top and bottom substrates 300 and 302, as shown in FIGS. 76 and 77. Further shown in FIGS. 76 and 77 are adhesive 304 (e.g., epoxy), conductive particles 306, conductive plates 308, and conductive posts 310. Subsequently, the sandwich structure assembly is placed into a press machine and laminated. The lamination conditions are determined by the specification of the ACF, specifically by the properties of epoxy. The lamination pressure, temperature, and duration are important factors that will affect the yield, electrical readings (resistance), and reliability (adhesion of the ACF to substrates) of this product. The final joints are illustrated in FIGS. 78 and 79, which shows how the electrical path is created, i.e., simply by physical contact of the conductive particles 306 to respective substrate's posts 310 during the lamination process.

For the embodiments of the invention in FIGS. 80–83, a thin layer of metal (depletion phase) 314 is first deposited on to the posts 310 or plate 308 where the joints will be fabricated. The deposition method may be by a vacuum process, e.g., evaporation, sputtering, CVD, etc., or a wet chemical process, e.g., electroplating. Materials for the depletion phase 314 are preferably chosen under the conditions that the phase 314 will undergo metallurgical reactions to both the conductive particles 306 in ACF and pads/posts 308/310 on substrates 300 and 302; and the phase 314 preferably has a melting point that is lower than the lamination temperature of the ACF. For example, in a typical case, both the Cu post 310 on the substrate and Ni particles 306 in ACF can be reacted with indium to form their intermetallic compounds respectively in a ACF lamination condition of 500 psi at 170° C. for 30 seconds. Indium can be used in this material system for creating a low resistance joint, because at 170° C. (the lamination temperature of the ACF) indium will melt (m.p. 156° C.) and form intermetallic compounds at Cu/In and Ni/In interfaces.

Referring now to FIGS. 80 and 81 the depletion phase 314 is deposited on posts 310 and/or plate 308 at the location where joints will be made. Then, the lamination process is performed under pressure and heat. During the lamination process, the depletion phases 314 melt and transform into intermetallic compounds the places where these metals (i.e., posts 310, plates 308, and particles 306) contact, as shown in FIGS. 82 and 83.

In a traditional ACF joint, conduction path is provided from physical contact of the conductive particles 306 inside the adhesive 304 and conduction pads/posts 308/310 on substrates 300 and 302. Due to its contact resistance, the resistance of this type of joint is high and cannot fulfill the requirement of the modern high speed electronic devices. One of the ways to reduce the contact resistance is to coat thin layers of metals to improve surface characteristics for reducing contact resistance, e.g., Ni/Au. In FIGS. 80–83, a metallurgical bonding is formed between particles 306 and pads/posts 308/310. At the interface, there is not only a physical touch but also a metallurgical reaction. This type of metallurgical bonding will provide a much lower resistance than the physical contact joint.

Because most of the low-melting-point materials are soft as compared to the conductive materials used in ACF, under lamination conditions, the hard particles tend to penetrate into the soft film before melting. This penetration mechanism enlarge the contact area of conductive particles and the pads on circuit boards as compared to the traditional process (a hard metal to hard metal contact). It is liable to obtain higher $T_0$ yield than the traditional process.

Due to the characteristics of embodiments of the invention in FIGS. 80–83, i.e., metallurgical bonding, a mechanical joint will be produced which is stronger than the contact joint. From a macroscopic viewpoint, the traditional type of ACF has a structure that is held by the polymer adhesive (primarily epoxy) layer. The metal parts solely provide a function of electrical conduction path. In the structures of FIGS. 80–83, the structures are held by both the adhesive layer 304 and metallurgical joints, which has an improved reliability result.

Referring now to FIGS. 84A–86CC there is illustrated a fabrication method for an insulator, which possesses the following properties; conformable coverage capability, high thickness control accuracy/thickness, uniformity characteristics, low dielectric constant, strong adhesion, low water absorption, low Cu diffusion, appropriate CTE, and a high quality dielectric for circuit substrates, LSI, and other electrical or optical components.

As clock rates of computer/communication systems increase in various electronic/optical components, demands for a fine pattern and low dielectric constant insulator becomes strong. In circuit substrates, polymer dielectric films typically have been formed by spin coating method. However, for fine patterning the method has many drawbacks. For example, it is difficult to obtain conformable coverage or uniform thickness with high accuracy. The vapor deposition polymerization (VDP) technique has been applied to polymer insulator films in circuit substrates by ULVAC. For conformable coverage, the method is considerably effective, but, not enough to realize precise thickness control, low dielectric constant film with strong adhesion. Furthermore, it does not have any remarkable effects on reducing water absorption and Cu diffusion, or for adjusting appropriate CTE. In LSI, the same situation still exists in spin coating and VDP. For an inorganic insulator by CVD, the amount of reduction of dielectric constant is limited.

Embodiments of the present invention illustrated in FIGS. 84A–86CC provide solutions for the problems described above by applying molecular layer deposition (MLD) as well as chemical vapor deposition (CVD), which enables molecular-level control of polymer film structures, and polymer insulator film in various components. Selective depositions and selective molecular alignment techniques are also used.

FIGS. 85A–84B illustrates a typical example of VDP by ULVAC. This method may be regarded as a species of CVD. Therefore, for purposes of these embodiments of the invention, "CVD" will be used instead of "VDP". In the CVD shown in FIGS. 84A and 84B, monomers 342 and 344 are used. These monomers are introduced into a vacuum chamber 340. On the surface of substrate 346 the two monomers 342 and 344 react with each other to produce a polymer film 348 on the substrate 346.

FIGS. 85A–85G illustrate an improved MLD process. In this MLD process monomers as gases are alternately switched. For example, as shown in FIG. 85D, molecules 344 are introduced into the chamber 340, causing a monomolecular layer to be adsorbed and/or reacted on the substrate surface. In FIG. 85E, after removing the unreacted molecules 344, molecules 342 are introduced resulting in a monomolecular layer of molecules 342 on molecules 344. In FIGS. 85F and 85G, a sequential growth of monomolecular layers of molecules 344 and 342 continues. FIGS. 85A and 85B illustrate examples of MLD equipment, a gas-exchanging type and a substrate-rotating type, respectively.

In FIG. 85H, a comparison of vapor phase depositions (MLD and CVD) vs. spin coating is shown. Except for the deposition rate, the vapor phase deposition is superior to the spin coating. In addition, the vapor phase techniques have unique characteristics of a selective deposition and a selective molecular alignment. With respect to film quality (i.e., stoichoimetry achievement or dangling bond reduction), MLD is the best process. Using the features of MLD and CVD, one can realize high quality dielectric films for circuit substrates, LSI, and other electrical or optical components.

Referring now to FIGS. 86A–86E, using conformable coverage characteristics, an insulator film 360 is deposited on Cu 347 patterns without voids. Planarization is performed by CMP. Then, an insulator film 364 is formed on film 360 by CVD, MLD or spin coating. For a precise thickness control, MLD or CVD is preferable. For an extreme thickness and film quality control, especially in LSI, MLD is preferable. In FIGS. 86F–86K, on the Cu 347 patterns surface modulation 370 is selectively applied by conventional photolithography technique, such as by a hydrophobic treatment. Other surfaces may be applied for modulation, such as by a hydrophilic treatment. Polymer film 371 (e.g., a polyimide) is deposited by CVD or MLD. In the area with hydrophobic treatment, film does not grow. This selective deposition enables planarization without CMP, simplifying the process.

In FIGS. 86L–86P, on a layer 376 containing metal 378 and insulator 380, a polymer film 382 is deposited by MLD, then a film 384 is deposited by CVD, and finally a film 386 is deposited by MLD. In the initial stage of MLD, at least one molecular layer of molecules with high polarization is used for strong adhesion at the interface. In the middle stage by CVD, a molecule with low polarization is used for dielectric constant reduction. CVD with varying compositions may provide the same film structure to some extent although the composition controllability is lower than the upper case. For the middle stage film formation spin coat may also be used. It is possible to use molecules with large polarization for the initial and final stages. If necessary, a surface treatment for promotion of molecular adhesion or molecular orientation may be applied, such as by way of example only, silane coupling treatment, obliquely-deposited thin film treatment, rubbing, or alkylamine coating. FIG. 86CC illustrates examples of molecules, and examples of a deposition sequence on substrate 346.

FIGS. 86Q–86V illustrate an example for applications of molecular alignment deposition. By surface treatments including surface modulation 390, a polymer chain 392 can be oriented to a particular direction. For example, in the case of polyazomethin application, the dielectric constant along the polymer chain 392 is higher than in the other two direction. Therefore, by aligning the chain perpendicular to the electrode gap direction, one can reduce the effective dielectric constant for the wiring lines. As previously indicated, an obliquely-deposited $SiO_2$ thin film or a rubbed polyimide film are examples of surface treatments.

In FIGS. 86W–86BB, other applications of selective alignment deposition are shown. Water absorption and Cu diffusion coefficient have anisotropic characteristics depending on the polymer chain direction. Therefore, by controlling the polymer chain direction, these properties may be optimized. CTE and dielectric constant adjustment may also be done by the same technique.

To realize gradual change of film composition, the following methods have been found effective in MLD: (a) for gas-switching MLD (see FIG. 85A), by overlapping the shutter open (or valve open) periods for two or more kinds of molecular gases, or by increasing remaining time of residue gases; and (b) for substrate rotating-type MLD (see FIG. 85B), by increasing the rotating speed or mixing of two or more kinds of gases. These methods are also effective in increasing the deposition rate. The surface may be cleaned by plasma, spattering, or chemical treatment, etc. A clean surface is helpful for promoting surface reactions, like Cu-molecule bonding formation, and improve adhesion strength.

Referring now to FIGS. 87–100, there is illustrated an economic process to reflow solder bumps when the solder resist cannot be applied or is difficult to be incorporated into the fabrication process. Under typical conditions, when solders need to be reflowed, there must be a solder resist film cover the non-bumped circuit to confine the flow of molten solder. This practice has been considered mandatory for soldering process. The typical solder resist material is epoxy-based polymers, which can be utilized in the case of low reflow temperature solders. The low reflow temperature represents a reflow temperature lower than 250° C. In some cases, where the solder material has a high melting temperature, the reflow temperature can be as high as 350° C., e.g., 97 Pb/3 Sn solder. The epoxy-based solder resist cannot be applied due to its temperature stability. For a high reflow temperature, an alternative solder resist materials is necessary. In a common practice, polyimide films may serve the purpose. However, different types of solder resist material mean extra sets of equipments for processing and additional efforts for conditioning. Also, under certain circumstances, e.g., electroplated solder bumps, solder resist material cannot be applied before seed-layer etching, which limit the application of electroplating process, or extra steps are needed for applying seed-layer onto solder resist. All of these disadvantages lead to a need that the solder reflowed without using any solder resist. By this way, the process steps of soldering can be reduced enormously.

The process illustrated in FIGS. 87–93 include masking (see FIG. 87), electroplating (see FIG. 88), mask stripping (see FIG. 89), seed-layer etching (see FIG. 90), fluxing (see FIG. 91), reflowing (see FIG. 92), and flux cleaning (see FIG. 93). The following elements may be seen in FIGS. 87–93: substrate 400, conductors 402, mask 404, solder 406, seed-layer 408, flux 410, reflowed solder 406a, and flux residue 412.

Typically, the electroplated solder bumps 406 are formed into shapes as shown in FIG. 94. The critical dimensions in the electroplated bumps are described as follows. The first one is the size of the bumps, D, which is the diameter if it is a round bump. The size D may be other typical dimensions that can describe the size of the bumps 406 if the shape is not a circle, e.g., octagon, as shown in FIG. 95. The second one is the bump height, H, which is controlled by the electroplating conditions, e.g., plating current density and plating time. The third one is the pitch, P, which represents the distance between two bumps 406–406 and is determined by design. In the resist-free reflow process, one needs to control these dimensions so that two or more adjacent bumps 406–402 will not bridge after solder reflow. FIGS. 98–99 illustrate the geometric shape change of the solder bumps 406—406 after reflow. The reflowed bumps height, $H_r$, is larger than the bump height before reflow, H. FIG. 100 illustrates the shape of a bridged bump 406b, which may result from two adjacent solder bumps or multiple solder bumps.

When the ratio of D to H, i.e., D:H or D/H, is greater than 7, the pitch, P, may be as small as 200 μm without creating any bridged bumps. This condition applies to hi-lead Sn/Pb solders, where the composition varies from Pb content of 85% to 97% or Sn content from 15% to 3%, accordingly. When the D/H ratio is smaller than 7, the solder bumps bridge. In the case of eutectic Sn/Pb solder, due to its better wettibility, this condition (D/H ratio greater than 7) applies to the pitch, P, of 400 μm or above.

Referring now to FIGS. 101A–101B, there is illustrated a Cu-direct plating metallization process on polymeric surfaces to achieve good adhesion between Cu and polymer required for industrial applications. High adhesion values of Cu/polymer interface is critical for proper metallization process selection in order to satisfy industry specifications. Direct Cu-plating is used in electronic industry for dielectric/conductor multilayer structure fabrication processes.

Conventional metallization processes currently applied for plastic surface metallization include: sputtering, evaporation, chemical vapor deposition(CVD), metallic film lamination, electrolytic plating, e-Less plating and direct plating. Application of the particular metallization process depends on the specific polymeric surface, design structure and product requirements. The vacuum deposition processes require expensive capital equipment and are more expensive than wet metallization processes. Wet metallization processelectrolytic plating require a seed layer, which is a thin metal layer deposited on plastic by sputtering, evaporation, chemical vapor deposition(CVD), e-Less plating or direct plating.

Direct Plating is one of the low cost Cu-deposition processes which requires chemically active surfaces to provide good adhesion of the deposited metal to polymeric surface. Direct Plating produces two components in the adhesion strength: physical and chemical. Physical component of adhesion is related to the surface topography, roughness and possibilities to interlock the metal components on the interface. The chemical component is based on direct chemical interaction of the reactive group on the polymer surface with the metal.

It is known in the art that direct plated Cu has a good adhesion strength to an epoxy compound and/or to PWB (which is epoxy reinforced by glass fibers). The common method in the art to activate the surface is to provide plasma treatment. The process of roughening a polymeric surface generates chemically reactive sites or groups on the surface. Unfortunately, this approach which is applicable for polymer surfaces with polar groups (epoxy, epoxy/glass compositions, etc.) is not feasible for low dielectric constant polymers (polyethylene, etc.) which have no polar groups on the surface.

The process and materials illustrated in FIGS. 101A and 101B overcome the foregoing problem. A specially designed two sided chemically active link is proposed, which can convert the relatively inert polymeric surface to a much more chemically active surface and connect deposited metal with this more chemically active surface. This in-situ surface modification reaction is a very efficient route to enhance significantly a surface to a higher order of magnitude than the adhesion of direct plated Cu to a polyimide surface.

The process flow is schematically illustrated in FIG. 101A. The polymer surface is treated with reactive gases ($O_2$ etc.). Subsequently, the plasma activated surface is reacted with one of the organic groups of the coupling agent selected from the class of organosilane coupling agents illustrated in FIG. 101B.

Referring now to FIGS. 102–104, there is seen a reusable frame assembly for mounting stencils. Stencils are used in paste printing applications. A stencil is usually glued onto a metal frame, which in turn is mounted to the printing machine frame. The stencil and frame mounted in this manner cannot be reused. Therefore, what is needed is a reusable stencil frame, generally illustrated as 600 in FIG. 102, together with a simple stencil mounting procedure in order to greatly facilitate rapid prototyping work involving paste printing.

The reusable stencil frame 600 is shown schematically in FIG. 102. A stencil 602 is mounted to one side of a stencil frame 604 using high tack double sided tape 605 around the stencil frame periphery. Two stencil frame bars 606–606 are mounted on opposing edges of the stencil frame 604 as shown in FIG. 102. FIG. 103 shows an exploded cross section view of the mounting sequence. The stencil frame bars 606—606 are designed to be symmetrical with respect to the horizontal and vertical planes. One face of the stencil frame bar 606 is taped to the stencil frame 604, while the opposing face is mounted to the printing machine frame. FIG. 104 shows a threaded hole 608, which is tapped so that either face may be mounted to the printing machine frame.

The reusable stencil frame 600 simplifies the task of mounting stencils, specially at the design stage when different stencil types and features are being evaluated for use in paste printing. Storage space needed for stencil inventory is greatly reduced since the stencil frame bars 606—606 may be removed and the mounted stencils 602 (i.e., on stencil frames 604) require very little storage space. Also, defective stencils are easily removed from the stencil frame 604 and discarded. The cleaned stencil frame 604 can then be used to mount other stencils. This approach offers flexibility in mounting, use and storage of stencils with different materials, sizes and features.

Referring now to FIGS. 105–113, there is schematically seen a process for facilitating joining two substrates 640 and 642 by using a build-in pin alignment assembly to lock in the two substrates 640 and 642 and prevent them from shifting during joining. Traditionally, substrates are aligned and put together for joining by lamination, but the substrates may shift during lamination process (see FIG. 105). It is proposed to use a pin alignment assembly 650 to lock the two substrates 640 and 642 and prevent them from shifting by using build-in long pins 660 (see FIG. 106) or thick pads 670 with a recess 672 (see FIG. 107), which can be fabricated by a traditional build-up process (e.g., see FIGS. 108–110 and FIGS. 111–113). In FIG. 109, as well as FIG. 112, the feature area is blocked out (by, e.g., tape or photoresist 680) to allow the alignment pin (or pad) to plate thicker than the features. Similarly, the thick pads 670—670 in FIG. 107 can be fabricated using build-up process. Thus, reduction/prevention of shifting between two substrates can be achieved by using traditional build-up process.

Referring now to FIGS. 114–115, there is illustrated a method for joining two or more layers of substrates 700 and 702 together without using solder. An interposer 710, a substrate or other dielectric material with an array of pins, would be used to join the two substrates 700 and 702 together. This would allow for rework and possibly even dimensional flexibility of the product under varying environmental conditions. The interposer 710 could be coated with a layer of adhesive on each side so that when the two substrates 700 and 702 to be joined are pressed together, the adhesive will securely hold them together and keep the pins tightly in the sockets. One of the salient features of this process is found in the design of the mounting holes 700a and 702a (pseudo sockets) in the substrates 700 and 702 (whether a wafer or flexible film). A socket(s) is constructed on and in the substrate, which will capture and/or apply pressure to the pin(s) on either 4, 6 or 8 sides, as required.

In FIGS. 114–115, holes 700a and 702a extend through the substrates 700 and 702, respectively. The holes 700a and 702a do not necessarily need to extend all the way through the substrates 700 and 702. The socket could just reside in the top substrate 700 or the bottom substrate 702. Preferably the holes 700a and 702a extend through the entire substrates 700 and 702, respectively, and the socket in both the top and bottom substrates 700 and 702 would make contact with an interposer pin 720. The material, which would be used to plate the finger projections of the socket, would be critical to insure that a good connection is made and that there is minimal or no chemical reaction between the substrates 700 and 702 and the interposer pin 720. Ni/Au on the pads and pins would provide a reliable connection with least chance for intermetallics or oxidation to form. As previously indicated, the interposer 710 could be coated with adhesive on each side so that when the substrates 700 and 702 are pressed together, the adhesive would insure that all interposer pins 720 are held securely in place with pressure.

The use of the interposer 710 to join multiple substrates could eliminate the use of solder and its associated processes, such as heat, rework and cleaning. With the interposer 710, one could also achieve a uniformity of height between substrates, further eliminating stress and surface height irregularities of the various substrates. Since the interposer pins 720 are preferably gold plated, there would be minimal chemical interactions between substrates due to environmental conditions, either real or simulated.

Also, the interposer 710 could contain traces between pins and even capacitors that could help to reduce noise on signal or power lines. The interposer 710 could become another substrate layer with traces, resistors, decoupling capacitors and possibly even a modified ground or power plane. This would allow the components to be in close proximity to the circuit and could even be used to contain "heat pipes" for thermal cooling. The "heat pipes" in the interposer could transmit the heat to the outside edge, where it is transferred to another heat sink.

As an alternate method to the above process, the interposer 710 could have an array of solder bumps, short pins instead of the longer pins or copper bumps that are Ni/Au plated that would recess into cavities that have been created in or on the surface of the substrates 700 and 702. Then under pressure/heat and using a conductive and/or non-conductive adhesive, the two surfaces could be joined. The interposer 710 could add structural integrity to the surfaces and could also have trace connections, passive components or an embedded ground or power plane which would enhance the electrical properties of the product. The interposer 710 could also allow for offset pads and a separate pattern on either the top or bottom. It is possible that a specially designed centrally split interposer with interconnecting traces between the top and bottom sides could allow flexible substrates to be twisted and still remain electrically stable.

Referring now to FIGS. 116–125 for another embodiment of the invention, which may be combined with one or more other embodiments of the present invention, there is illustrated a transient liquid alloy bonding process for z-connection in high density substrates fabrication. The formed joints have characteristics of uniform height, low manufacturing temperature, high operation temperature, low resistance, and high strength. Embodiments of transient liquid alloy bonding are illustrated respectively in FIGS. 116, 118–121 and FIGS. 117, 122–125.

Referring now to FIG. 116 and FIGS. 118–121, there is seen substrates 12 and 14 respectively supporting conductor pads 20 and 18. Conductive posts 5 (e.g., copper posts 5) are connected to conductor pads 20. Posts 5 may be any suitable posts such as posts 92 or posts 62. A thin metallic layer 3 (e.g. from about 3 to about 5 microns) is disposed on conductor pads 18. A dielectric, such as polymer 16, is disposed on substrate 20, and is subsequently cured.

The thin metallic layer 3 may comprise any of the suitable materials for solder bumps 19, such as eutectic Pb/Sn and alloys comprised of In—Sn, Bi—Sn, In—Ag, Sn—Sb, Au—Sn, and Pb—Sn. More specific examples of materials for the the thin metallic layer 3 includes 52 In/48 Sn, 58 Bi/42 Sn, 97 In/3 Ag, In, 37 Pb/63 Sn, 96.5 Sn/3.5 Ag, 95 Sn/5 Sb, 80 Au/20 Sn, and 90 Pb/10 Sn (described in terms of weight percentages). The material may also include any material (e.g., a solder-material fluxing agent) suitable for removing oxides from the material for metallic layer 3. The solder-material fluxing agent may comprise an organic acid, and may be used in combination with a fluxing agent contained in the polymer 16 to remove oxides in and on the material. Organic acids are preferred because they can have relatively high boiling points. Exemplary fluxing agents can include cinnamic acid, succinic acid, gluteric acid, adipic acid, pimelic acid, suberic acid, azelaic acid, adipic acid, sebacic acid, precursors and combinations thereof. The solder-material fluxing agent preferably comprises at least one of cinnamic acid, adipic acid or another acid which functions in a chemically similar manner or has a chemically similar structure.

After layer 3 is disposed on conductor pads, the layer 3 is compressed between an end of the posts 5 and the conductor pads 18 and heated and compressed (e.g. by conventional platens at 150° C. to 300° C. and 300 to 500 psi) to convert the layer 3 into layer 3a having a higher melting temperature (e.g. a melting temperature of 400° C. to 500° C.) than the melting temperature of layer 3 (e.g. a melting temperature of 200° C. to 250° C.). Since the melting temperatures of the material (e.g. copper) of posts 5 is higher than the melting temperatures of layer 3 (e.g. Sn or tin), upon heating and compressing some of the material of posts 5 migrates or diffuses into layer 3 to elevate the melting temperature of same and produce intermetallic layer 3a.

In FIGS. 117 and 122–125, the metallic layer 3 is disposed on ends of the posts 5 instead of on conductor pads 18. Layers 3a are formed in the same manner as they were formed (e.g. heating and comprising) for the embodiments of the invention illustrated in FIGS. 116, 118–121.

Intermetallic layer 3a refers to the actual bond formed in soldering from the interdiffusion of two or more metals (e.g. copper/tin). The intermetallic layer 3a increases in depth in logarithmic proportion to both time and temperature during the soldering or bonding process. Staying on the joint twice as long, or with an iron twice as hot, may cause the intermetallic layer 3a to become thicker. The ideal intermetallic layer 3a is continuous but thin.

Intermetallic compounds, such as those forming intermetallic layer 3a, are often called "bulk intermetallic" and differ in a number of important ways from conventional metal alloys. Conventional metal alloys consist basically of a disorderd solid solution of one or more metallic elements. They do not have any particular chemical formula, and are best described as consisting of a base material to which certain percentages of other elements have been added. In chemical terms, alloys are mixtures of phases. For example, type 304, a popular grade of stainless steel, has the composition Fe-18% Cr-81% Ni. An intermetallic compound on the other hand, such as those forming intermetallic layer 3a, is a particular chemical compound based on a definite atomic formula with a fixed or narrow range of chemical composition. An example is the nickel aluminide $Ni_3Al$. The atoms in conventional alloys are linked with relatively weak metallic bonds, with the atomic nucleii floating in a "gas" of electrons that are able to move relatively freely. In contrast, the bonds in intermetallics may be partly ionic or covalent, and therefore stronger. Alternatively, the bonding may be entirely metallic, but the atoms of the individual elements take up preferred positions within the crystal lattice. This condition, which is referred to as "ordering", leads to an abrupt change in the mechanical properties of the material. These phenomena give the bulk intermetallics their characteristic properties—high melting points and great strength (particularly at high temperatures). In these respects, they resemble the ceramics. Unlike ceramics, however, they have a metallic lustre, conduct heat and electricity well, and can generally be processed by conventional metals technology.

Thus, the joints or layers 3a are composed of two or more different types of materials. One thick phase material (e.g. copper) provides the height control function. Another thin layer material (e.g. tin) provides the function of bonding. During joining, the thin layer melts and forms a bonding to the thick phase. Due to phase transformation, the thin layer 3 is consumed and transformed into a high melting point phase or layer 3a. Thus, the process temperature can be as low as the melting point of the thin layer material. However, due to the phase transformation, the resulting joints or layer 3a can be sustained at least two times of their process temperature. The methods for forming these different type of materials may be by, but not limited to, electroplating, vacuum evaporation, or sputtering. The type of materials for the height control function (e.g. posts 5) may be copper, nickel, aluminum, and titanium, etc. The thin layer material for layer 3 can be indium, tin, Sn/Pb eutectic solder, bismuth, or any other low melting point solders. The substrate material for substrates 14 and 12 may be flexible film, e.g., polymer, or any other rigid type of substrates.

The process illustrated in FIGS. 116, 118–121 is a process where both substrates 12 and 14 are deposited with the two different kind of materials. Then, substrate 12 can be filled with dielectric layer (liquids or solid films such as polymer 16) and joined under heat and pressure. As illustrated in FIGS. 117, 122–125, both thick and thin phases can be deposited on one side and joined to another substrate. Again, the dielectric layer can either be filled before joining or after joining.

Several different types of material combinations for layer 3 and posts 5, include Cu/Sn, and Cu/eutectic tin-lead solder. The achievable dimensions may be: for the bump size: 100 to 150 µm; for pitch: 200 to 400 µm; and for bump height: 25 µm. Process condition for 100% yield on 2"×2" size of substrate has been developed.

Joint or layer 3a provides an economic route for z-connection. Its high operation temperature can allow the high density substrate to survive various types of heat treatment for chip and board process. Its controlled joint height provides a better electrical performance in terms of resistance and capacitance. Its short process steps can reduce the cost of the product.

The materials for the joints, thick and thin phase, and the substrates are not limited to those mentioned above. They can be extended to any types of material that can make metallurgical reactions. The process for depositing materials can be extended to any types of deposition process that can deposit the materials used for joining. The size of the joints can be extended to any dimensions that are used or will be used for electronic industry.

By the practice of embodiments of the present invention there is provided a simple approach to joining of substrates. Conventional underfill process for flip chip to substrate joining is limited to very small joining areas (typically 1-inch by 1-inch area or less). Substrate buildup is expensive compared to the simpler approach described in embodiments of this invention. Joining of similar or different substrate materials (i.e., flexible substrates, rigid wafers, and laminated circuit boards) can be performed without substantial process modification. The joining process can be automated for high speed, low cost joining of substrates.

By the practice of embodiments of the present invention there is also provided a method comprising disposing a thin metallic layer (3 to 5 microns) having a low melting temperature (e.g., Sn) between one end of a conductive post on a substrate and a conducting structure on another opposing substrate. Heated platens (300–500 psi and 230–160° C. of Sn) in contact with the substrates can apply pressure and heat to the thin layer and cause it to be entirely consumed and subsequently transformed into a bonding layer having a high melting temperature. For example, if the thin metallic layer 3 includes tin (m.p. ~230° C.) and the conducting post 5 and conductor structure 18 each include copper, the subsequently formed bonding layer of tin and copper can have a melting point of about 460° C. Prior to, during, or after the conductive post is bonded to the conducting structure, the region around the conductive post and between the substrates can be filled with a dielectric material such as polyimide. The inventive method is different from simply soldering a copper post to another conductor. In this conventional method, the solder is still present in the final product and can melt at low temperatures. In the invention, the solder layer (i.e. layer 3) is consumed and transformed. Other embodiments of the invention are directed to an electrical article made by the inventive method.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention not be limited to the particular embodiment disclosed as the best mode contemplated for carrying out this invention, but that the invention will include all embodiments and equivalents falling within the scope of the appended claims.

What is claimed is:

1. A method for bonding conductive structures comprising:
   disposing a thin layer of metal between one end of a conductive post and a conducting structure; and
   transforming substantially the entire thin layer of metal into an intermetallic bonding layer using heat and pressure, the transformed layer having a melting temperature higher than the initial melting temperature of the thin layer of metal;
   such that the conductive post and the conducting structure are bonded together via the intermetallic bonding layer.

2. The method of claim 1 further comprising:
   depositing a dielectric material around the conductive post.

3. The method of claim 1 wherein the thin layer of metal comprises a material selected from the group consisting of In, Sn/Pb eutectic solder, Sn, Bi and mixtures thereof.

4. A method for producing an assembly of substrates comprising:
   disposing a thin layer of metal on a conducting structure coupled to a first substantially planar substrate;
   dispensing a liquid polymeric material between the conducting structure and a second substantially planar substrate supporting a conductive post, the liquid polymeric material being disposed inwardly from the edges of the first and second substrate;
   pressing the liquid polymeric material between the first and the second substrates so that the liquid polymeric material flows towards the edges of the first substrate and the second substrate; and
   transforming substantially the entire thin layer of metal into an intermetallic bonding layer using heat and pressure, the transformed layer having a melting temperature higher than the initial melting temperature of the thin layer of metal;
   such that the conductive post and the conducting structure are bonded together via the intermetallic bonding layer.

5. The method of claim 4 additionally comprising curing the liquid polymeric material.

6. The method of claim 5 wherein said liquid polymeric material comprises a polymer fluxing agent.

7. The method of claim 4 wherein said liquid polymeric material comprises a polymer fluxing agent.

8. The method of claim 5 wherein said polymer fluxing agent comprises a beta phenylacid and/or a beta phenylhydroxyacid.

9. The method of claim 7 wherein said polymer fluxing agent comprises a beta phenylacid and/or a beta phenylhydroxyacid.

10. The method of claim 9 wherein said beta phenylacid is selected from the group consisting of beta phenylacetic acid, beta phenylacrylic acid, beta phenylcrotonic acid, and mixtures thereof.

11. The method of claim 9 wherein said beta phenylacid is selected from the group consisting of beta phenylacetic acid, beta phenylacrylic acid, beta phenylcrotonic acid, and mixtures thereof.

12. The method of claim 9 wherein said beta phenylacid comprises beta phenylacrylic acid and said beta phenylhydroxyacid comprises beta phenylhydroxyacrylic acid.

13. The method of claim 9 wherein said beta phenylacid comprises beta phenylacrylic acid and said beta phenylhydroxyacid comprises beta phenylhydroxyacrylic acid.

14. The method of claim 4 wherein said liquid polymeric material comprises from about 15% by weight to about 70% by weight of a polymeric resin, from about 15% by weight to about 70% by weight of a curing agent, and from about 0.10% by weight to about 20% by weight of a fluxing agent.

15. A method for producing an assembly of substrates comprising:
    disposing a thin layer of metal on an end of a conductive post attached to a first substantially planar substrate;
    dispensing a liquid polymeric material between a conducting structure on a second substantially planar substrate and the first substantially planar substrate, the liquid polymeric material being disposed inwardly from the edges of the first and the second substrates;
    pressing the liquid polymeric material between the first and the second substrates so that the liquid polymeric material flows towards the edges of the first substrate and the second substrate; and
    transforming substantially the entire thin layer of metal into an intermetallic bonding layer using heat and pressure, the transformed layer having a melting temperature higher than the initial melting temperature of the thin layer of metal;
    such that the conductive post and the conducting structure are bonded together via the intermetallic bonding layer.

16. The method of claim 15 additionally comprising curing the liquid polymeric material.

17. The method of claim 15 wherein said liquid polymeric material comprises a polymer fluxing agent.

18. A method for producing an assembly of substrates comprising:
    dispensing a liquid polymeric material on one of a first substantially planar substrate comprising a conducting structure and a second substantially planar substrate comprising a conductive post projecting from a surface thereof and having an end distal from said second substrate surface, disposing a thin metal layer on one of said conducting structure or said distal end of said conductive post;

positioning and aligning said first and second substrates such that said distal end contacts said conducting structure with the thin metal layer therebetween; and transforming substantially the entire thin layer of metal into an intermetallic bonding layer using heat and pressure, the bonding layer having a melting temperature higher than the initial melting temperature of the thin layer of metal, such that the conductive post and the conducting structure are bonded together.

* * * * *